(12) United States Patent
Liu

(10) Patent No.: US 11,011,942 B2
(45) Date of Patent: May 18, 2021

(54) FLAT ANTENNAS HAVING TWO OR MORE RESONANT FREQUENCIES FOR USE IN WIRELESS POWER TRANSMISSION SYSTEMS

(71) Applicant: Energous Corporation, San Jose, CA (US)

(72) Inventor: Yunhong Liu, San Jose, CA (US)

(73) Assignee: ENERGOUS CORPORATION, San Jose, CA (US)

( * ) Notice: Subject to any disclaimer, the term of this patent is extended or adjusted under 35 U.S.C. 154(b) by 482 days.

(21) Appl. No.: 15/942,093

(22) Filed: Mar. 30, 2018

(65) Prior Publication Data

US 2018/0287431 A1  Oct. 4, 2018

Related U.S. Application Data

(60) Provisional application No. 62/479,219, filed on Mar. 30, 2017.

(51) Int. Cl.
*H02J 50/40* (2016.01)
*H02J 7/02* (2016.01)
(Continued)

(52) U.S. Cl.
CPC ............... *H02J 50/40* (2016.02); *H01Q 5/20* (2015.01); *H01Q 5/328* (2015.01); *H01Q 5/378* (2015.01);
(Continued)

(58) Field of Classification Search
USPC ......................................................... 320/108
See application file for complete search history.

(56) References Cited

U.S. PATENT DOCUMENTS

| 787,412 A | 4/1905 | Tesla |
|---|---|---|
| 2,811,624 A | 10/1957 | Haagensen |

(Continued)

FOREIGN PATENT DOCUMENTS

| CN | 1829999 A | 9/2006 |
|---|---|---|
| CN | 101465471 A | 6/2009 |

(Continued)

OTHER PUBLICATIONS

Energous Corp., IPRP, PCT/US2017/065886, dated Jun. 18, 2019, 10 pgs.

(Continued)

*Primary Examiner* — Alexis B Pacheco
(74) *Attorney, Agent, or Firm* — Morgan, Lewis & Bockius LLP

(57) ABSTRACT

The various embodiments described herein include methods, devices, and systems for wireless power transmission. In one aspect, a wireless power transmission system includes an antenna component configured to transmit and/or receive electromagnetic waves, such as power waves, the antenna component having at least two conductive plates positioned on a same plane, where: (1) the at least two conductive plates form a monopole antenna configured to transmit and/or receive electromagnetic waves in a first frequency range, (2) the at least two conductive plates are positioned such that a gap exists between the at least two conductive plates, thereby forming a capacitor, and (3) the at least two conductive plates and the gap form a loop antenna configured to transmit and/or receive electromagnetic waves in a second frequency range.

21 Claims, 6 Drawing Sheets

(51) Int. Cl.

| | |
|---|---|
| *H02J 50/20* | (2016.01) |
| *H02J 50/80* | (2016.01) |
| *H05K 1/18* | (2006.01) |
| *H01Q 5/20* | (2015.01) |
| *H01Q 5/50* | (2015.01) |
| *H05K 1/02* | (2006.01) |
| *H01Q 7/00* | (2006.01) |
| *H01Q 5/378* | (2015.01) |
| *H01Q 13/10* | (2006.01) |
| *H01Q 21/28* | (2006.01) |
| *H01Q 5/328* | (2015.01) |
| *H01Q 9/40* | (2006.01) |
| *H01Q 9/42* | (2006.01) |
| *H01Q 5/385* | (2015.01) |
| *H02J 50/23* | (2016.01) |
| *H02J 50/90* | (2016.01) |

(52) U.S. Cl.
CPC ............ *H01Q 5/385* (2015.01); *H01Q 5/50* (2015.01); *H01Q 7/00* (2013.01); *H01Q 9/40* (2013.01); *H01Q 9/42* (2013.01); *H01Q 13/10* (2013.01); *H01Q 21/28* (2013.01); *H02J 7/025* (2013.01); *H02J 50/20* (2016.02); *H02J 50/23* (2016.02); *H02J 50/80* (2016.02); *H02J 50/90* (2016.02); *H05K 1/0243* (2013.01); *H05K 1/181* (2013.01); *H05K 2201/10098* (2013.01)

(56) References Cited

U.S. PATENT DOCUMENTS

| | | |
|---|---|---|
| 2,863,148 A | 12/1958 | Gammon et al. |
| 3,167,775 A | 1/1965 | Guertler |
| 3,434,678 A | 3/1969 | Brown et al. |
| 3,696,384 A | 10/1972 | Lester |
| 3,754,269 A | 8/1973 | Clavin |
| 4,101,895 A | 7/1978 | Jones, Jr. |
| 4,360,741 A | 11/1982 | Fitzsimmons et al. |
| 4,944,036 A | 7/1990 | Hyatt |
| 4,995,010 A | 2/1991 | Knight |
| 5,142,292 A | 8/1992 | Chang |
| 5,200,759 A | 4/1993 | McGinnis |
| 5,211,471 A | 5/1993 | Rohrs |
| 5,276,455 A | 1/1994 | Fitzsimmons et al. |
| 5,548,292 A | 8/1996 | Hirshfield et al. |
| 5,556,749 A | 9/1996 | Mitsuhashi et al. |
| 5,568,088 A | 10/1996 | Dent et al. |
| 5,631,572 A | 5/1997 | Sheen et al. |
| 5,646,633 A | 7/1997 | Dahlberg |
| 5,697,063 A | 12/1997 | Kishigami et al. |
| 5,712,642 A | 1/1998 | Hulderman |
| 5,936,527 A | 8/1999 | Isaacman et al. |
| 5,982,139 A | 11/1999 | Parise |
| 6,046,708 A | 4/2000 | MacDonald, Jr. et al. |
| 6,061,025 A | 5/2000 | Jackson et al. |
| 6,127,799 A | 10/2000 | Krishnan |
| 6,127,942 A | 10/2000 | Welle |
| 6,163,296 A | 12/2000 | Lier et al. |
| 6,176,433 B1 | 1/2001 | Uesaka et al. |
| 6,271,799 B1 | 8/2001 | Rief |
| 6,289,237 B1 | 9/2001 | Mickle et al. |
| 6,329,908 B1 | 12/2001 | Frecska |
| 6,400,586 B2 | 6/2002 | Raddi et al. |
| 6,421,235 B2 | 7/2002 | Ditzik |
| 6,437,685 B2 | 8/2002 | Hanaki |
| 6,456,253 B1 | 9/2002 | Rummeli et al. |
| 6,476,795 B1 | 11/2002 | Derocher et al. |
| 6,501,414 B2 | 12/2002 | Arndt et al. |
| 6,583,723 B2 | 6/2003 | Watanabe et al. |
| 6,597,897 B2 | 7/2003 | Tang |
| 6,615,074 B2 | 9/2003 | Mickle et al. |
| 6,650,376 B1 | 11/2003 | Obitsu |
| 6,664,920 B1 | 12/2003 | Mott et al. |
| 6,680,700 B2 | 1/2004 | Hilgers |
| 6,798,716 B1 | 9/2004 | Charych |
| 6,803,744 B1 | 10/2004 | Sabo |
| 6,853,197 B1 | 2/2005 | McFarland |
| 6,856,291 B2 | 2/2005 | Mickle et al. |
| 6,911,945 B2 | 6/2005 | Korva |
| 6,960,968 B2 | 11/2005 | Odendaal et al. |
| 6,967,462 B1 | 11/2005 | Landis |
| 6,988,026 B2 | 1/2006 | Breed et al. |
| 7,003,350 B2 | 2/2006 | Denker et al. |
| 7,012,572 B1 | 3/2006 | Schaffner et al. |
| 7,027,311 B2 | 4/2006 | Vanderelli et al. |
| 7,068,234 B2 | 6/2006 | Sievenpiper |
| 7,068,991 B2 | 6/2006 | Parise |
| 7,079,079 B2 | 7/2006 | Jo et al. |
| 7,183,748 B1 | 2/2007 | Unno et al. |
| 7,191,013 B1 | 3/2007 | Miranda et al. |
| 7,193,644 B2 | 3/2007 | Carter |
| 7,196,663 B2 | 3/2007 | Bolzer et al. |
| 7,205,749 B2 | 4/2007 | Hagen et al. |
| 7,215,296 B2 | 5/2007 | Abramov et al. |
| 7,222,356 B1 | 5/2007 | Yonezawa et al. |
| 7,274,334 B2 | 9/2007 | o'Riordan et al. |
| 7,274,336 B2 | 9/2007 | Carson |
| 7,351,975 B2 | 4/2008 | Brady et al. |
| 7,359,730 B2 | 4/2008 | Dennis et al. |
| 7,372,408 B2 | 5/2008 | Gaucher |
| 7,392,068 B2 | 6/2008 | Dayan |
| 7,403,803 B2 | 7/2008 | Mickle et al. |
| 7,443,057 B2 | 10/2008 | Nunally |
| 7,451,839 B2 | 11/2008 | Perlman |
| 7,463,201 B2 | 12/2008 | Chiang et al. |
| 7,471,247 B2 | 12/2008 | Saily |
| 7,535,195 B1 | 5/2009 | Horovitz et al. |
| 7,564,411 B2 | 7/2009 | Piisila et al. |
| 7,614,556 B2 | 11/2009 | Overhultz et al. |
| 7,639,994 B2 | 12/2009 | Greene et al. |
| 7,643,312 B2 | 1/2010 | Vanderelli et al. |
| 7,652,577 B1 | 1/2010 | Madhow et al. |
| 7,679,576 B2 | 3/2010 | Riedel et al. |
| 7,702,771 B2 | 4/2010 | Ewing et al. |
| 7,786,419 B2 | 8/2010 | Hyde et al. |
| 7,812,771 B2 | 10/2010 | Greene et al. |
| 7,830,312 B2 | 11/2010 | Choudhury et al. |
| 7,844,306 B2 | 11/2010 | Shearer et al. |
| 7,868,482 B2 | 1/2011 | Greene et al. |
| 7,898,105 B2 | 3/2011 | Greene et al. |
| 7,904,117 B2 | 3/2011 | Doan et al. |
| 7,911,386 B1 | 3/2011 | Ito et al. |
| 7,925,308 B2 | 4/2011 | Greene et al. |
| 7,948,208 B2 | 5/2011 | Partovi et al. |
| 8,049,676 B2 | 11/2011 | Yoon et al. |
| 8,055,003 B2 | 11/2011 | Mittleman et al. |
| 8,070,595 B2 | 12/2011 | Alderucci et al. |
| 8,072,380 B2 | 12/2011 | Crouch |
| 8,092,301 B2 | 1/2012 | Alderucci et al. |
| 8,099,140 B2 | 1/2012 | Arai |
| 8,115,448 B2 | 2/2012 | John |
| 8,159,090 B2 | 4/2012 | Greene et al. |
| 8,159,364 B2 | 4/2012 | Zeine |
| 8,180,286 B2 | 5/2012 | Yamasuge |
| 8,184,454 B2 | 5/2012 | Mao |
| 8,228,194 B2 | 7/2012 | Mickle |
| 8,234,509 B2 | 7/2012 | Gioscia et al. |
| 8,264,101 B2 | 9/2012 | Hyde et al. |
| 8,264,291 B2 | 9/2012 | Morita |
| 8,276,325 B2 | 10/2012 | Clifton et al. |
| 8,278,784 B2 | 10/2012 | Cook et al. |
| 8,284,101 B2 | 10/2012 | Fusco |
| 8,310,201 B1 | 11/2012 | Wright |
| 8,338,991 B2 | 12/2012 | Von Novak et al. |
| 8,362,745 B2 | 1/2013 | Tinaphong |
| 8,380,255 B2 | 2/2013 | Shearer et al. |
| 8,384,600 B2 | 2/2013 | Huang et al. |
| 8,410,953 B2 | 4/2013 | Zeine |
| 8,411,963 B2 | 4/2013 | Luff |
| 8,432,062 B2 | 4/2013 | Greene et al. |
| 8,432,071 B2 | 4/2013 | Huang et al. |

(56) References Cited

U.S. PATENT DOCUMENTS

| | | |
|---|---|---|
| 8,446,248 B2 | 5/2013 | Zeine |
| 8,447,234 B2 | 5/2013 | Cook et al. |
| 8,451,189 B1 | 5/2013 | Fluhler |
| 8,452,235 B2 | 5/2013 | Kirby et al. |
| 8,457,656 B2 | 6/2013 | Perkins et al. |
| 8,461,817 B2 | 6/2013 | Martin et al. |
| 8,467,733 B2 | 6/2013 | Leabman |
| 8,497,601 B2 | 7/2013 | Hall et al. |
| 8,497,658 B2 | 7/2013 | Von Novak et al. |
| 8,552,597 B2 | 8/2013 | Song et al. |
| 8,558,661 B2 | 10/2013 | Zeine |
| 8,560,026 B2 | 10/2013 | Chanterac |
| 8,564,485 B2 | 10/2013 | Milosavljevic et al. |
| 8,604,746 B2 | 12/2013 | Lee |
| 8,614,643 B2 | 12/2013 | Leabman |
| 8,621,245 B2 | 12/2013 | Shearer et al. |
| 8,626,249 B2 | 1/2014 | Kuusilinna et al. |
| 8,629,576 B2 | 1/2014 | Levine |
| 8,653,966 B2 | 2/2014 | Rao et al. |
| 8,655,272 B2 | 2/2014 | Saunamäki |
| 8,674,551 B2 | 3/2014 | Low et al. |
| 8,686,685 B2 | 4/2014 | Moshfeghi |
| 8,686,905 B2 | 4/2014 | Shtrom |
| 8,712,355 B2 | 4/2014 | Black et al. |
| 8,712,485 B2 | 4/2014 | Tam |
| 8,718,773 B2 | 5/2014 | Wills et al. |
| 8,729,737 B2 | 5/2014 | Schatz et al. |
| 8,736,228 B1 | 5/2014 | Freed et al. |
| 8,760,113 B2 | 6/2014 | Keating |
| 8,770,482 B2 | 7/2014 | Ackermann et al. |
| 8,772,960 B2 | 7/2014 | Yoshida |
| 8,823,319 B2 | 9/2014 | Von Novak, III et al. |
| 8,832,646 B1 | 9/2014 | Wendling |
| 8,854,176 B2 | 10/2014 | Zeine |
| 8,860,364 B2 | 10/2014 | Low et al. |
| 8,897,770 B1 | 11/2014 | Frolov et al. |
| 8,903,456 B2 | 12/2014 | Chu et al. |
| 8,917,057 B2 | 12/2014 | Hui |
| 8,923,189 B2 | 12/2014 | Leabman |
| 8,928,544 B2 | 1/2015 | Massie et al. |
| 8,937,408 B2 | 1/2015 | Ganem et al. |
| 8,946,940 B2 | 2/2015 | Kim et al. |
| 8,963,486 B2 | 2/2015 | Kirby et al. |
| 8,970,070 B2 | 3/2015 | Sada et al. |
| 8,989,053 B1 | 3/2015 | Skaaksrud et al. |
| 9,000,616 B2 | 4/2015 | Greene et al. |
| 9,001,622 B2 | 4/2015 | Perry |
| 9,006,934 B2 | 4/2015 | Kozakai et al. |
| 9,021,277 B2 | 4/2015 | Shearer et al. |
| 9,030,161 B2 | 5/2015 | Lu et al. |
| 9,059,598 B2 | 6/2015 | Kang et al. |
| 9,059,599 B2 | 6/2015 | Won et al. |
| 9,077,188 B2 | 7/2015 | Moshfeghi |
| 9,083,595 B2 | 7/2015 | Rakib et al. |
| 9,088,216 B2 | 7/2015 | Garrity et al. |
| 9,124,125 B2 | 9/2015 | Leabman et al. |
| 9,130,397 B2 | 9/2015 | Leabman et al. |
| 9,130,602 B2 | 9/2015 | Cook |
| 9,142,998 B2 | 9/2015 | Yu et al. |
| 9,143,000 B2 | 9/2015 | Leabman et al. |
| 9,143,010 B2 | 9/2015 | Urano |
| 9,153,074 B2 | 10/2015 | Zhou et al. |
| 9,178,389 B2 | 11/2015 | Hwang |
| 9,225,196 B2 | 12/2015 | Huang et al. |
| 9,240,469 B2 | 1/2016 | Sun et al. |
| 9,242,411 B2 | 1/2016 | Kritchman et al. |
| 9,244,500 B2 | 1/2016 | Cain et al. |
| 9,252,628 B2 | 2/2016 | Leabman et al. |
| 9,270,344 B2 | 2/2016 | Rosenberg |
| 9,276,329 B2 | 3/2016 | Jones et al. |
| 9,282,582 B1 | 3/2016 | Dunsbergen et al. |
| 9,294,840 B1 | 3/2016 | Anderson et al. |
| 9,297,896 B1 | 3/2016 | Andrews |
| 9,318,898 B2 | 4/2016 | John |
| 9,368,020 B1 | 6/2016 | Bell et al. |
| 9,401,977 B1 | 7/2016 | Gaw |
| 9,409,490 B2 | 8/2016 | Kawashima |
| 9,419,335 B2 | 8/2016 | Pintos |
| 9,419,443 B2 | 8/2016 | Leabman |
| 9,438,045 B1 | 9/2016 | Leabman |
| 9,438,046 B1 | 9/2016 | Leabman |
| 9,444,283 B2 | 9/2016 | Son et al. |
| 9,450,449 B1 | 9/2016 | Leabman et al. |
| 9,461,502 B2 | 10/2016 | Lee et al. |
| 9,520,725 B2 | 12/2016 | Masaoka et al. |
| 9,520,748 B2 | 12/2016 | Hyde et al. |
| 9,522,270 B2 | 12/2016 | Perryman et al. |
| 9,532,748 B2 | 1/2017 | Denison et al. |
| 9,537,354 B2 | 1/2017 | Bell et al. |
| 9,537,357 B2 | 1/2017 | Leabman |
| 9,537,358 B2 | 1/2017 | Leabman |
| 9,538,382 B2 | 1/2017 | Bell et al. |
| 9,544,640 B2 | 1/2017 | Lau |
| 9,559,553 B2 | 1/2017 | Bae |
| 9,564,773 B2 | 2/2017 | Pogorelik et al. |
| 9,571,974 B2 | 2/2017 | Choi et al. |
| 9,590,317 B2 | 3/2017 | Zimmerman et al. |
| 9,590,444 B2 | 3/2017 | Walley |
| 9,620,996 B2 | 4/2017 | Zeine |
| 9,647,328 B2 | 5/2017 | Dobric |
| 9,706,137 B2 | 7/2017 | Scanlon et al. |
| 9,711,999 B2 | 7/2017 | Hietala et al. |
| 9,723,635 B2 | 8/2017 | Nambord et al. |
| 9,793,758 B2 | 10/2017 | Leabman |
| 9,793,764 B2 | 10/2017 | Perry |
| 9,800,172 B1 | 10/2017 | Leabman |
| 9,806,564 B2 | 10/2017 | Leabman |
| 9,819,230 B2 | 11/2017 | Petras et al. |
| 9,825,674 B1 | 11/2017 | Leabman |
| 9,831,718 B2 | 11/2017 | Leabman et al. |
| 9,843,201 B1 | 12/2017 | Leabman et al. |
| 9,843,229 B2 | 12/2017 | Leabman |
| 9,843,763 B2 | 12/2017 | Leabman et al. |
| 9,847,669 B2 | 12/2017 | Leabman |
| 9,847,677 B1 | 12/2017 | Leabman |
| 9,853,361 B2 | 12/2017 | Chen et al. |
| 9,853,458 B1 | 12/2017 | Bell et al. |
| 9,853,485 B2 | 12/2017 | Contopanagos |
| 9,853,692 B1 | 12/2017 | Bell et al. |
| 9,859,756 B2 | 1/2018 | Leabman et al. |
| 9,859,757 B1 | 1/2018 | Leabman et al. |
| 9,859,758 B1 | 1/2018 | Leabman |
| 9,859,797 B1 | 1/2018 | Leabman |
| 9,866,279 B2 | 1/2018 | Bell et al. |
| 9,867,032 B2 | 1/2018 | Verma |
| 9,871,301 B2 | 1/2018 | Contopanagos |
| 9,871,398 B1 | 1/2018 | Leabman |
| 9,876,380 B1 | 1/2018 | Leabman et al. |
| 9,876,394 B1 | 1/2018 | Leabman |
| 9,876,536 B1 | 1/2018 | Bell et al. |
| 9,876,648 B2 | 1/2018 | Bell |
| 9,882,394 B1 | 1/2018 | Bell et al. |
| 9,887,584 B1 | 2/2018 | Bell et al. |
| 9,887,739 B2 | 2/2018 | Leabman et al. |
| 9,893,535 B2 | 2/2018 | Leabman |
| 9,893,554 B2 | 2/2018 | Bell et al. |
| 9,893,555 B1 | 2/2018 | Leabman et al. |
| 9,893,564 B2 | 2/2018 | de Rochemont |
| 9,899,744 B1 | 2/2018 | Contopanagos et al. |
| 9,899,844 B1 | 2/2018 | Bell et al. |
| 9,899,861 B1 | 2/2018 | Leabman et al. |
| 9,916,485 B1 | 3/2018 | Lilly et al. |
| 9,917,477 B1 | 3/2018 | Bell et al. |
| 9,923,386 B1 | 3/2018 | Leabman et al. |
| 9,939,864 B1 | 4/2018 | Bell et al. |
| 9,965,009 B1 | 5/2018 | Bell et al. |
| 9,966,765 B1 | 5/2018 | Leabman |
| 9,966,784 B2 | 5/2018 | Leabman |
| 9,967,743 B1 | 5/2018 | Bell et al. |
| 9,973,008 B1 | 5/2018 | Leabman |
| 10,003,211 B1 | 6/2018 | Leabman et al. |
| 10,008,777 B1 | 6/2018 | Broyde et al. |
| 10,014,728 B1 | 7/2018 | Leabman |
| 10,027,159 B2 | 7/2018 | Hosseini |

(56) References Cited

U.S. PATENT DOCUMENTS

| | | |
|---|---|---|
| 10,038,337 B1 | 7/2018 | Leabman et al. |
| 10,050,462 B1 | 8/2018 | Leabman et al. |
| 10,056,782 B1 | 8/2018 | Leabman |
| 10,063,064 B1 | 8/2018 | Bell et al. |
| 10,068,703 B1 | 9/2018 | Contopanagos |
| 10,075,008 B1 | 9/2018 | Bell et al. |
| 10,075,017 B2 | 9/2018 | Leabman et al. |
| 10,079,515 B2 | 9/2018 | Hosseini et al. |
| 10,090,699 B1 | 10/2018 | Leabman |
| 10,090,714 B2 | 10/2018 | Bohn et al. |
| 10,090,886 B1 | 10/2018 | Bell et al. |
| 10,103,552 B1 | 10/2018 | Leabman et al. |
| 10,103,582 B2 | 10/2018 | Leabman et al. |
| 10,110,046 B1 | 10/2018 | Esquibel et al. |
| 10,116,143 B1 | 10/2018 | Leabman et al. |
| 10,116,162 B2 | 10/2018 | Hosseini et al. |
| 10,122,219 B1 | 11/2018 | Hosseini et al. |
| 10,124,754 B1 | 11/2018 | Leabman |
| 10,128,686 B1 | 11/2018 | Leabman et al. |
| 10,128,695 B2 | 11/2018 | Leabman et al. |
| 10,134,260 B1 | 11/2018 | Bell et al. |
| 10,135,112 B1 | 11/2018 | Hosseini |
| 10,135,286 B2 | 11/2018 | Hosseini et al. |
| 10,135,294 B1 | 11/2018 | Leabman |
| 10,141,771 B1 | 11/2018 | Hosseini et al. |
| 10,148,097 B1 | 12/2018 | Leabman et al. |
| 10,153,645 B1 | 12/2018 | Bell et al. |
| 10,153,653 B1 | 12/2018 | Bell et al. |
| 10,153,660 B1 | 12/2018 | Leabman et al. |
| 10,158,257 B2 | 12/2018 | Leabman |
| 10,158,259 B1 | 12/2018 | Leabman |
| 10,164,478 B2 | 12/2018 | Leabman |
| 10,170,917 B1 | 1/2019 | Bell et al. |
| 10,177,594 B2 | 1/2019 | Contopanagos |
| 10,181,756 B2 | 1/2019 | Bae et al. |
| 10,186,892 B2 | 1/2019 | Hosseini et al. |
| 10,193,396 B1 | 1/2019 | Bell et al. |
| 10,199,835 B2 | 2/2019 | Bell |
| 10,199,849 B1 | 2/2019 | Bell |
| 10,205,239 B1 | 2/2019 | Contopanagos et al. |
| 10,211,674 B1 | 2/2019 | Leabman et al. |
| 10,211,680 B2 | 2/2019 | Leabman et al. |
| 10,218,207 B2 | 2/2019 | Hosseini et al. |
| 10,218,227 B2 | 2/2019 | Leabman et al. |
| 10,223,717 B1 | 3/2019 | Bell |
| 10,224,758 B2 | 3/2019 | Leabman et al. |
| 10,224,982 B1 | 3/2019 | Leabman |
| 10,230,266 B1 | 3/2019 | Leabman et al. |
| 10,243,414 B1 | 3/2019 | Leabman et al. |
| 10,256,657 B2 | 4/2019 | Hosseini et al. |
| 10,256,677 B2 | 4/2019 | Hosseini et al. |
| 10,263,432 B1 | 4/2019 | Leabman et al. |
| 10,263,476 B2 | 4/2019 | Leabman |
| 10,270,261 B2 | 4/2019 | Bell et al. |
| 10,277,054 B2 | 4/2019 | Hosseini |
| 10,291,055 B1 | 5/2019 | Bell et al. |
| 10,291,066 B1 | 5/2019 | Leabman |
| 10,291,294 B2 | 5/2019 | Leabman |
| 10,298,024 B2 | 5/2019 | Leabman |
| 10,298,133 B2 | 5/2019 | Leabman |
| 10,305,315 B2 | 5/2019 | Leabman et al. |
| 10,312,715 B2 | 6/2019 | Leabman |
| 10,333,332 B1 | 6/2019 | Hosseini |
| 10,381,880 B2 | 8/2019 | Leabman et al. |
| 10,396,588 B2 | 8/2019 | Leabman |
| 10,491,029 B2 | 11/2019 | Hosseini |
| 10,511,097 B2 | 12/2019 | Kornaros et al. |
| 10,516,301 B2 | 12/2019 | Leabman |
| 10,523,058 B2 | 12/2019 | Leabman |
| 10,554,052 B2 | 2/2020 | Bell et al. |
| 10,594,165 B2 | 3/2020 | Hosseini |
| 10,615,647 B2 | 4/2020 | Johnston et al. |
| 10,644,542 B2 | 5/2020 | Yankowitz |
| 10,714,984 B2 | 7/2020 | Hosseini et al. |
| 10,734,717 B2 | 8/2020 | Hosseini |
| 2001/0027876 A1 | 10/2001 | Tsukamoto et al. |
| 2002/0001307 A1 | 1/2002 | Nguyen et al. |
| 2002/0024471 A1 | 2/2002 | Ishitobi |
| 2002/0028655 A1 | 3/2002 | Rosener et al. |
| 2002/0034958 A1 | 3/2002 | Oberschmidt et al. |
| 2002/0054330 A1 | 5/2002 | Jinbo et al. |
| 2002/0065052 A1 | 5/2002 | Pande et al. |
| 2002/0072784 A1 | 6/2002 | Sheppard et al. |
| 2002/0095980 A1 | 7/2002 | Breed et al. |
| 2002/0103447 A1 | 8/2002 | Terry |
| 2002/0123776 A1 | 9/2002 | Von Arx |
| 2002/0133592 A1 | 9/2002 | Matsuda |
| 2002/0171594 A1 | 11/2002 | Fang |
| 2002/0172223 A1 | 11/2002 | Stilp |
| 2003/0005759 A1 | 1/2003 | Breed et al. |
| 2003/0038750 A1 | 2/2003 | Chen |
| 2003/0058187 A1 | 3/2003 | Billiet et al. |
| 2003/0076274 A1 | 4/2003 | Phelan et al. |
| 2003/0179152 A1 | 9/2003 | Watada et al. |
| 2003/0179573 A1 | 9/2003 | Chun |
| 2003/0192053 A1 | 10/2003 | Sheppard et al. |
| 2004/0019624 A1 | 1/2004 | Sukegawa |
| 2004/0020100 A1 | 2/2004 | O'Brian et al. |
| 2004/0036657 A1 | 2/2004 | Forster et al. |
| 2004/0066251 A1 | 4/2004 | Eleftheriades et al. |
| 2004/0107641 A1 | 6/2004 | Walton et al. |
| 2004/0113543 A1 | 6/2004 | Daniels |
| 2004/0119675 A1 | 6/2004 | Washio et al. |
| 2004/0130425 A1 | 7/2004 | Dayan et al. |
| 2004/0130442 A1 | 7/2004 | Breed |
| 2004/0142733 A1 | 7/2004 | Parise |
| 2004/0145342 A1 | 7/2004 | Lyon |
| 2004/0155832 A1 | 8/2004 | Yuanzhu |
| 2004/0196190 A1 | 10/2004 | Mendolia et al. |
| 2004/0203979 A1 | 10/2004 | Attar et al. |
| 2004/0207559 A1 | 10/2004 | Milosavljevic |
| 2004/0218759 A1 | 11/2004 | Yacobi |
| 2004/0241402 A1 | 12/2004 | Kawate |
| 2004/0259604 A1 | 12/2004 | Mickle et al. |
| 2004/0263124 A1 | 12/2004 | Wieck et al. |
| 2005/0007276 A1 | 1/2005 | Barrick et al. |
| 2005/0030118 A1 | 2/2005 | Wang |
| 2005/0046584 A1 | 3/2005 | Breed |
| 2005/0055316 A1 | 3/2005 | Williams |
| 2005/0077872 A1 | 4/2005 | Single |
| 2005/0093766 A1 | 5/2005 | Turner |
| 2005/0116683 A1 | 6/2005 | Cheng |
| 2005/0117660 A1 | 6/2005 | Vialle et al. |
| 2005/0134517 A1 | 6/2005 | Gottl |
| 2005/0171411 A1 | 8/2005 | KenKnight |
| 2005/0198673 A1 | 9/2005 | Kit et al. |
| 2005/0227619 A1 | 10/2005 | Lee et al. |
| 2005/0232469 A1 | 10/2005 | Schofield |
| 2005/0237249 A1 | 10/2005 | Nage l |
| 2005/0237258 A1 | 10/2005 | Abramov et al. |
| 2005/0282591 A1 | 12/2005 | Shaff |
| 2006/0013335 A1 | 1/2006 | Leabman |
| 2006/0019712 A1 | 1/2006 | Choi |
| 2006/0030279 A1 | 2/2006 | Leabman et al. |
| 2006/0033674 A1 | 2/2006 | Essig, Jr. et al. |
| 2006/0056855 A1 | 3/2006 | Nakagawa et al. |
| 2006/0071308 A1 | 4/2006 | Tang et al. |
| 2006/0092079 A1 | 5/2006 | de Rochemont |
| 2006/0094425 A1 | 5/2006 | Mickle et al. |
| 2006/0113955 A1 | 6/2006 | Nunally |
| 2006/0119532 A1 | 6/2006 | Yun et al. |
| 2006/0136004 A1 | 6/2006 | Cowan et al. |
| 2006/0160517 A1 | 7/2006 | Yoon |
| 2006/0183473 A1 | 8/2006 | Ukon |
| 2006/0190063 A1 | 8/2006 | Kanzius |
| 2006/0192913 A1 | 8/2006 | Shutou et al. |
| 2006/0199620 A1 | 9/2006 | Greene et al. |
| 2006/0238365 A1 | 10/2006 | Vecchione et al. |
| 2006/0266564 A1 | 11/2006 | Perlman et al. |
| 2006/0266917 A1 | 11/2006 | Baldis et al. |
| 2006/0278706 A1 | 12/2006 | Hatakayama et al. |
| 2006/0284593 A1 | 12/2006 | Nagy et al. |
| 2006/0287094 A1 | 12/2006 | Mahaffey et al. |
| 2007/0007821 A1 | 1/2007 | Rossetti |

(56) References Cited

U.S. PATENT DOCUMENTS

| | | |
|---|---|---|
| 2007/0019693 A1 | 1/2007 | Graham |
| 2007/0021140 A1 | 1/2007 | Keyes |
| 2007/0060185 A1 | 3/2007 | Simon et al. |
| 2007/0070490 A1 | 3/2007 | Tsunoda et al. |
| 2007/0090997 A1 | 4/2007 | Brown et al. |
| 2007/0093269 A1 | 4/2007 | Leabman et al. |
| 2007/0097653 A1 | 5/2007 | Gilliland et al. |
| 2007/0103110 A1 | 5/2007 | Sagoo |
| 2007/0106894 A1 | 5/2007 | Zhang |
| 2007/0109121 A1 | 5/2007 | Cohen |
| 2007/0139000 A1 | 6/2007 | Kozuma |
| 2007/0149162 A1 | 6/2007 | Greene et al. |
| 2007/0164868 A1 | 7/2007 | Deavours et al. |
| 2007/0173196 A1 | 7/2007 | Gallic |
| 2007/0173214 A1 | 7/2007 | Mickle et al. |
| 2007/0178857 A1 | 8/2007 | Greene et al. |
| 2007/0178945 A1 | 8/2007 | Cook et al. |
| 2007/0182367 A1 | 8/2007 | Partovi |
| 2007/0191074 A1 | 8/2007 | Harrist et al. |
| 2007/0191075 A1 | 8/2007 | Greene et al. |
| 2007/0197281 A1 | 8/2007 | Stronach |
| 2007/0210960 A1 | 9/2007 | Rofougaran et al. |
| 2007/0222681 A1 | 9/2007 | Greene et al. |
| 2007/0228833 A1 | 10/2007 | Stevens et al. |
| 2007/0229261 A1 | 10/2007 | Zimmerman et al. |
| 2007/0240297 A1 | 10/2007 | Yang et al. |
| 2007/0257634 A1 | 11/2007 | Leschin et al. |
| 2007/0273486 A1 | 11/2007 | Shiotsu |
| 2007/0291165 A1 | 12/2007 | Wang |
| 2007/0296639 A1 | 12/2007 | Hook et al. |
| 2007/0298846 A1 | 12/2007 | Greene et al. |
| 2008/0014897 A1 | 1/2008 | Cook et al. |
| 2008/0024376 A1 | 1/2008 | Norris et al. |
| 2008/0048917 A1 | 2/2008 | Achour et al. |
| 2008/0062062 A1 | 3/2008 | Borau et al. |
| 2008/0062255 A1 | 3/2008 | Gal |
| 2008/0067874 A1 | 3/2008 | Tseng |
| 2008/0074324 A1 | 3/2008 | Puzella et al. |
| 2008/0089277 A1 | 4/2008 | Aledander et al. |
| 2008/0110263 A1 | 5/2008 | Klessel et al. |
| 2008/0113816 A1 | 5/2008 | Mahaffey et al. |
| 2008/0122297 A1 | 5/2008 | Arai |
| 2008/0123383 A1 | 5/2008 | Shionoiri |
| 2008/0129536 A1 | 6/2008 | Randall et al. |
| 2008/0140278 A1 | 6/2008 | Breed |
| 2008/0169910 A1 | 7/2008 | Greene et al. |
| 2008/0197802 A1 | 8/2008 | Onishi |
| 2008/0204342 A1 | 8/2008 | Kharadly |
| 2008/0204350 A1 | 8/2008 | Tam et al. |
| 2008/0210762 A1 | 9/2008 | Osada et al. |
| 2008/0211458 A1 | 9/2008 | Lawther et al. |
| 2008/0233890 A1 | 9/2008 | Baker |
| 2008/0248758 A1 | 10/2008 | Schedelbeck et al. |
| 2008/0248846 A1 | 10/2008 | Stronach et al. |
| 2008/0258993 A1 | 10/2008 | Gummalla et al. |
| 2008/0266191 A1 | 10/2008 | Hilgers |
| 2008/0278378 A1 | 11/2008 | Chang et al. |
| 2008/0309452 A1 | 12/2008 | Zeine |
| 2009/0002493 A1 | 1/2009 | Kates |
| 2009/0010316 A1 | 1/2009 | Rofougaran et al. |
| 2009/0019183 A1 | 1/2009 | Wu et al. |
| 2009/0036065 A1 | 2/2009 | Siu |
| 2009/0039828 A1 | 2/2009 | Jakubowski |
| 2009/0047998 A1 | 2/2009 | Alberth, Jr. |
| 2009/0058354 A1 | 3/2009 | Harrison |
| 2009/0058361 A1 | 3/2009 | John |
| 2009/0058731 A1 | 3/2009 | Geary et al. |
| 2009/0060012 A1 | 3/2009 | Gresset et al. |
| 2009/0067198 A1 | 3/2009 | Graham et al. |
| 2009/0067208 A1 | 3/2009 | Martin et al. |
| 2009/0073066 A1 | 3/2009 | Jordon et al. |
| 2009/0096412 A1 | 4/2009 | Huang |
| 2009/0096413 A1 | 4/2009 | Partovi |
| 2009/0102292 A1 | 4/2009 | Cook et al. |
| 2009/0102296 A1 | 4/2009 | Greene et al. |
| 2009/0108679 A1 | 4/2009 | Porwal |
| 2009/0122847 A1 | 5/2009 | Nysen et al. |
| 2009/0128262 A1 | 5/2009 | Lee et al. |
| 2009/0157911 A1 | 6/2009 | Aihara |
| 2009/0174604 A1 | 7/2009 | Keskitalo |
| 2009/0180653 A1 | 7/2009 | Sjursen et al. |
| 2009/0200985 A1 | 8/2009 | Zane et al. |
| 2009/0206791 A1 | 8/2009 | Jung |
| 2009/0207090 A1 | 8/2009 | Pettus et al. |
| 2009/0207092 A1 | 8/2009 | Nysen et al. |
| 2009/0218884 A1 | 9/2009 | Soar |
| 2009/0218891 A1 | 9/2009 | McCollough |
| 2009/0219903 A1 | 9/2009 | Alamouti et al. |
| 2009/0243397 A1 | 10/2009 | Cook et al. |
| 2009/0256752 A1 | 10/2009 | Akkermans et al. |
| 2009/0264069 A1 | 10/2009 | Yamasuge |
| 2009/0271048 A1 | 10/2009 | Wakamatsu |
| 2009/0280866 A1 | 11/2009 | Lo et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284220 A1 | 11/2009 | Toncich et al. |
| 2009/0284227 A1 | 11/2009 | Mohammadian et al. |
| 2009/0284325 A1 | 11/2009 | Rossiter et al. |
| 2009/0286475 A1 | 11/2009 | Toncich et al. |
| 2009/0286476 A1 | 11/2009 | Toncich et al. |
| 2009/0291634 A1 | 11/2009 | Saarisalo |
| 2009/0299175 A1 | 12/2009 | Bernstein et al. |
| 2009/0308936 A1 | 12/2009 | Nitzan et al. |
| 2009/0312046 A1 | 12/2009 | Clevenger et al. |
| 2009/0315412 A1 | 12/2009 | Yamamoto et al. |
| 2009/0322281 A1 | 12/2009 | Kamijo et al. |
| 2010/0001683 A1 | 1/2010 | Huang et al. |
| 2010/0007307 A1 | 1/2010 | Baarman et al. |
| 2010/0007569 A1 | 1/2010 | Sim et al. |
| 2010/0019686 A1 | 1/2010 | Gutierrez, Jr. |
| 2010/0019908 A1 | 1/2010 | Cho et al. |
| 2010/0026605 A1 | 2/2010 | Yang et al. |
| 2010/0027379 A1 | 2/2010 | Saulnier et al. |
| 2010/0029383 A1 | 2/2010 | Dai |
| 2010/0033021 A1 | 2/2010 | Bennett |
| 2010/0033390 A1 | 2/2010 | Alamouti et al. |
| 2010/0034238 A1 | 2/2010 | Bennett |
| 2010/0041453 A1 | 2/2010 | Grimm, Jr. |
| 2010/0044123 A1 | 2/2010 | Perlman et al. |
| 2010/0054200 A1 | 3/2010 | Tsai |
| 2010/0060534 A1 | 3/2010 | Oodachi |
| 2010/0066631 A1 | 3/2010 | Puzella et al. |
| 2010/0075607 A1 | 3/2010 | Hosoya |
| 2010/0079005 A1 | 4/2010 | Hyde et al. |
| 2010/0079011 A1 | 4/2010 | Hyde et al. |
| 2010/0082193 A1 | 4/2010 | Chiappetta |
| 2010/0087227 A1 | 4/2010 | Francos et al. |
| 2010/0090524 A1 | 4/2010 | Obayashi |
| 2010/0090656 A1 | 4/2010 | Shearer et al. |
| 2010/0109443 A1 | 5/2010 | Cook et al. |
| 2010/0117596 A1 | 5/2010 | Cook et al. |
| 2010/0117926 A1 | 5/2010 | Dejean, II |
| 2010/0119234 A1 | 5/2010 | Suematsu et al. |
| 2010/0123618 A1 | 5/2010 | Martin et al. |
| 2010/0123624 A1 | 5/2010 | Minear et al. |
| 2010/0124040 A1 | 5/2010 | Diebel et al. |
| 2010/0127660 A1 | 5/2010 | Cook et al. |
| 2010/0134105 A1 | 6/2010 | Zelinski et al. |
| 2010/0142418 A1 | 6/2010 | Nishioka et al. |
| 2010/0142509 A1 | 6/2010 | Zhu et al. |
| 2010/0148723 A1 | 6/2010 | Cook et al. |
| 2010/0151808 A1 | 6/2010 | Toncich et al. |
| 2010/0156721 A1 | 6/2010 | Alamouti et al. |
| 2010/0156741 A1 | 6/2010 | Vazquez et al. |
| 2010/0164296 A1 | 7/2010 | Kurs et al. |
| 2010/0164433 A1 | 7/2010 | Janefalker et al. |
| 2010/0167664 A1 | 7/2010 | Szinl |
| 2010/0171461 A1 | 7/2010 | Baarman et al. |
| 2010/0171676 A1 | 7/2010 | Tani et al. |
| 2010/0174629 A1 | 7/2010 | Taylor et al. |
| 2010/0176934 A1 | 7/2010 | Chou et al. |
| 2010/0181961 A1 | 7/2010 | Novak et al. |
| 2010/0181964 A1 | 7/2010 | Huggins et al. |

(56) References Cited

U.S. PATENT DOCUMENTS

| | | |
|---|---|---|
| 2010/0194206 A1 | 8/2010 | Burdo et al. |
| 2010/0201189 A1 | 8/2010 | Kirby et al. |
| 2010/0201201 A1 | 8/2010 | Mobarhan et al. |
| 2010/0201314 A1 | 8/2010 | Toncich et al. |
| 2010/0207572 A1 | 8/2010 | Kirby et al. |
| 2010/0210233 A1 | 8/2010 | Cook et al. |
| 2010/0213895 A1 | 8/2010 | Keating et al. |
| 2010/0214177 A1 | 8/2010 | Parsche |
| 2010/0222010 A1 | 9/2010 | Ozaki et al. |
| 2010/0225270 A1 | 9/2010 | Jacobs et al. |
| 2010/0227570 A1 | 9/2010 | Hendin |
| 2010/0231470 A1 | 9/2010 | Lee et al. |
| 2010/0237709 A1 | 9/2010 | Hall et al. |
| 2010/0244576 A1 | 9/2010 | Hillan et al. |
| 2010/0253281 A1 | 10/2010 | Li |
| 2010/0256831 A1 | 10/2010 | Abramo et al. |
| 2010/0259110 A1 | 10/2010 | Kurs et al. |
| 2010/0259447 A1 | 10/2010 | Crouch |
| 2010/0264747 A1 | 10/2010 | Hall et al. |
| 2010/0277003 A1 | 11/2010 | Von Novak et al. |
| 2010/0277121 A1 | 11/2010 | Hall et al. |
| 2010/0279606 A1 | 11/2010 | Hillan et al. |
| 2010/0289341 A1 | 11/2010 | Ozaki et al. |
| 2010/0295372 A1 | 11/2010 | Hyde et al. |
| 2010/0308767 A1 | 12/2010 | Rofougaran et al. |
| 2010/0309079 A1 | 12/2010 | Rofougaran et al. |
| 2010/0309088 A1 | 12/2010 | Hyvonen et al. |
| 2010/0315045 A1 | 12/2010 | Zeine |
| 2010/0316163 A1 | 12/2010 | Forenza et al. |
| 2010/0327766 A1 | 12/2010 | Recker et al. |
| 2010/0328044 A1 | 12/2010 | Waffenschmidt et al. |
| 2010/0332401 A1 | 12/2010 | Prahlad et al. |
| 2011/0009057 A1 | 1/2011 | Saunamäki |
| 2011/0013198 A1 | 1/2011 | Shirley |
| 2011/0018360 A1 | 1/2011 | Baarman et al. |
| 2011/0028114 A1 | 2/2011 | Kerselaers |
| 2011/0031928 A1 | 2/2011 | Soar |
| 2011/0032149 A1 | 2/2011 | Leabman |
| 2011/0032866 A1 | 2/2011 | Leabman |
| 2011/0034190 A1 | 2/2011 | Leabman |
| 2011/0034191 A1 | 2/2011 | Leabman |
| 2011/0043047 A1 | 2/2011 | Karalis et al. |
| 2011/0043163 A1 | 2/2011 | Baarman et al. |
| 2011/0043327 A1 | 2/2011 | Baarman et al. |
| 2011/0050166 A1 | 3/2011 | Cook et al. |
| 2011/0055037 A1 | 3/2011 | Hayashigawa et al. |
| 2011/0056215 A1 | 3/2011 | Ham |
| 2011/0057607 A1 | 3/2011 | Carobolante |
| 2011/0057853 A1 | 3/2011 | Kim et al. |
| 2011/0062788 A1 | 3/2011 | Chen et al. |
| 2011/0074342 A1 | 3/2011 | MacLaughlin |
| 2011/0074349 A1 | 3/2011 | Ghovanloo |
| 2011/0074620 A1 | 3/2011 | Wintermantel |
| 2011/0078092 A1 | 3/2011 | Kim et al. |
| 2011/0090126 A1 | 4/2011 | Szini et al. |
| 2011/0109167 A1 | 5/2011 | Park et al. |
| 2011/0114401 A1 | 5/2011 | Kanno et al. |
| 2011/0115303 A1 | 5/2011 | Baarman et al. |
| 2011/0115432 A1 | 5/2011 | El-Maleh |
| 2011/0115605 A1 | 5/2011 | Dimig et al. |
| 2011/0121660 A1 | 5/2011 | Azancot et al. |
| 2011/0122018 A1 | 5/2011 | Tarng et al. |
| 2011/0122026 A1 | 5/2011 | DeLaquil et al. |
| 2011/0127845 A1 | 6/2011 | Walley et al. |
| 2011/0127952 A1 | 6/2011 | Walley et al. |
| 2011/0133655 A1 | 6/2011 | Recker et al. |
| 2011/0133691 A1 | 6/2011 | Hautanen |
| 2011/0148578 A1 | 6/2011 | Aloi et al. |
| 2011/0148595 A1 | 6/2011 | Miller et al. |
| 2011/0151789 A1 | 6/2011 | Viglione et al. |
| 2011/0154429 A1 | 6/2011 | Stantchev |
| 2011/0156493 A1 | 6/2011 | Bennett |
| 2011/0156494 A1 | 6/2011 | Mashinsky |
| 2011/0156640 A1 | 6/2011 | Moshfeghi |
| 2011/0163128 A1 | 7/2011 | Taguchi et al. |
| 2011/0175455 A1 | 7/2011 | Hashiguchi |
| 2011/0175461 A1 | 7/2011 | Tinaphong |
| 2011/0181120 A1 | 7/2011 | Liu et al. |
| 2011/0182245 A1 | 7/2011 | Malkamaki et al. |
| 2011/0184842 A1 | 7/2011 | Melen |
| 2011/0188207 A1 | 8/2011 | Won et al. |
| 2011/0193688 A1 | 8/2011 | Forsell |
| 2011/0194543 A1 | 8/2011 | Zhao et al. |
| 2011/0195722 A1 | 8/2011 | Walter et al. |
| 2011/0199046 A1 | 8/2011 | Tsai et al. |
| 2011/0215086 A1 | 9/2011 | Yeh |
| 2011/0217923 A1 | 9/2011 | Ma |
| 2011/0220634 A1 | 9/2011 | Yeh |
| 2011/0221389 A1 | 9/2011 | Won et al. |
| 2011/0222272 A1 | 9/2011 | Yeh |
| 2011/0227725 A1 | 9/2011 | Muirhead |
| 2011/0243040 A1 | 10/2011 | Khan et al. |
| 2011/0243050 A1 | 10/2011 | Yanover |
| 2011/0244913 A1 | 10/2011 | Kim et al. |
| 2011/0248573 A1 | 10/2011 | Kanno et al. |
| 2011/0248575 A1 | 10/2011 | Kim et al. |
| 2011/0249678 A1 | 10/2011 | Bonicatto |
| 2011/0254377 A1 | 10/2011 | Widmer et al. |
| 2011/0254503 A1 | 10/2011 | Widmer et al. |
| 2011/0259953 A1 | 10/2011 | Baarman et al. |
| 2011/0273977 A1 | 11/2011 | Shapira et al. |
| 2011/0278941 A1 | 11/2011 | Krishna et al. |
| 2011/0279226 A1 | 11/2011 | Chen et al. |
| 2011/0281535 A1 | 11/2011 | Low et al. |
| 2011/0282415 A1 | 11/2011 | Eckhoff et al. |
| 2011/0285213 A1 | 11/2011 | Kowalewski |
| 2011/0286374 A1 | 11/2011 | Shin et al. |
| 2011/0291489 A1 | 12/2011 | Tsai et al. |
| 2011/0302078 A1 | 12/2011 | Failing |
| 2011/0304216 A1 | 12/2011 | Baarman |
| 2011/0304437 A1 | 12/2011 | Beeler |
| 2011/0304521 A1 | 12/2011 | Ando et al. |
| 2012/0007441 A1 | 1/2012 | John |
| 2012/0013196 A1 | 1/2012 | Kim et al. |
| 2012/0013198 A1 | 1/2012 | Uramoto et al. |
| 2012/0013296 A1 | 1/2012 | Heydari et al. |
| 2012/0019419 A1 | 1/2012 | Prat et al. |
| 2012/0043887 A1 | 2/2012 | Mesibov |
| 2012/0051109 A1 | 3/2012 | Kim et al. |
| 2012/0051294 A1 | 3/2012 | Guillouard |
| 2012/0056486 A1 | 3/2012 | Endo et al. |
| 2012/0056741 A1 | 3/2012 | Zhu et al. |
| 2012/0068906 A1 | 3/2012 | Asher et al. |
| 2012/0074891 A1 | 3/2012 | Anderson et al. |
| 2012/0075072 A1 | 3/2012 | Pappu |
| 2012/0080944 A1 | 4/2012 | Recker et al. |
| 2012/0080957 A1 | 4/2012 | Cooper et al. |
| 2012/0086284 A1 | 4/2012 | Capanella et al. |
| 2012/0086615 A1 | 4/2012 | Norair |
| 2012/0095617 A1 | 4/2012 | Martin et al. |
| 2012/0098350 A1 | 4/2012 | Campanella et al. |
| 2012/0098485 A1 | 4/2012 | Kang et al. |
| 2012/0099675 A1 | 4/2012 | Kitamura et al. |
| 2012/0103562 A1 | 5/2012 | Clayton |
| 2012/0104849 A1 | 5/2012 | Jackson |
| 2012/0105252 A1 | 5/2012 | Wang |
| 2012/0112532 A1 | 5/2012 | Kesler et al. |
| 2012/0119914 A1 | 5/2012 | Uchida |
| 2012/0126743 A1 | 5/2012 | Rivers, Jr. |
| 2012/0132647 A1 | 5/2012 | Beverly et al. |
| 2012/0133214 A1 | 5/2012 | Yun et al. |
| 2012/0142291 A1 | 6/2012 | Rath et al. |
| 2012/0146426 A1 | 6/2012 | Sabo |
| 2012/0146576 A1 | 6/2012 | Partovi |
| 2012/0146577 A1 | 6/2012 | Tanabe |
| 2012/0147802 A1 | 6/2012 | Ukita et al. |
| 2012/0149307 A1 | 6/2012 | Terada et al. |
| 2012/0150670 A1 | 6/2012 | Taylor et al. |
| 2012/0153894 A1 | 6/2012 | Widmer et al. |
| 2012/0157019 A1 | 6/2012 | Li |
| 2012/0161531 A1 | 6/2012 | Kim et al. |
| 2012/0161544 A1 | 6/2012 | Kashiwagi et al. |
| 2012/0169276 A1 | 7/2012 | Wang |
| 2012/0169278 A1 | 7/2012 | Choi |

(56) References Cited

U.S. PATENT DOCUMENTS

| | | |
|---|---|---|
| 2012/0173418 A1 | 7/2012 | Beardsmore et al. |
| 2012/0179004 A1 | 7/2012 | Roesicke et al. |
| 2012/0181973 A1 | 7/2012 | Lyden |
| 2012/0182427 A1 | 7/2012 | Marshall |
| 2012/0188142 A1 | 7/2012 | Shashi et al. |
| 2012/0187851 A1 | 8/2012 | Huggins et al. |
| 2012/0193999 A1 | 8/2012 | Zeine |
| 2012/0200399 A1 | 8/2012 | Chae |
| 2012/0201153 A1 | 8/2012 | Bharadia et al. |
| 2012/0201173 A1 | 8/2012 | Jian et al. |
| 2012/0206299 A1 | 8/2012 | Valdes-Garcia |
| 2012/0211214 A1 | 8/2012 | Phan |
| 2012/0212071 A1 | 8/2012 | Myabayashi et al. |
| 2012/0212072 A1 | 8/2012 | Miyabayashi et al. |
| 2012/0214462 A1 | 8/2012 | Chu et al. |
| 2012/0214536 A1 | 8/2012 | Kim et al. |
| 2012/0228392 A1 | 9/2012 | Cameron et al. |
| 2012/0228956 A1 | 9/2012 | Kamata |
| 2012/0231856 A1 | 9/2012 | Lee et al. |
| 2012/0235636 A1 | 9/2012 | Partovi |
| 2012/0242283 A1 | 9/2012 | Kim et al. |
| 2012/0248886 A1 | 10/2012 | Kesler et al. |
| 2012/0248888 A1 | 10/2012 | Kesler et al. |
| 2012/0248891 A1 | 10/2012 | Drennen |
| 2012/0249051 A1 | 10/2012 | Son et al. |
| 2012/0262002 A1 | 10/2012 | Widmer et al. |
| 2012/0265272 A1 | 10/2012 | Judkins |
| 2012/0267900 A1 | 10/2012 | Huffman et al. |
| 2012/0268238 A1 | 10/2012 | Park et al. |
| 2012/0270592 A1 | 10/2012 | Ngai |
| 2012/0274154 A1 | 11/2012 | DeLuca |
| 2012/0280650 A1 | 11/2012 | Kim et al. |
| 2012/0286582 A1 | 11/2012 | Kim et al. |
| 2012/0292993 A1 | 11/2012 | Mettler et al. |
| 2012/0293021 A1 | 11/2012 | Teggatz et al. |
| 2012/0293119 A1 | 11/2012 | Park et al. |
| 2012/0299389 A1 | 11/2012 | Lee et al. |
| 2012/0299540 A1 | 11/2012 | Perry |
| 2012/0299541 A1 | 11/2012 | Perry |
| 2012/0299542 A1 | 11/2012 | Perry |
| 2012/0300588 A1 | 11/2012 | Perry |
| 2012/0300592 A1 | 11/2012 | Perry |
| 2012/0300593 A1 | 11/2012 | Perry |
| 2012/0306284 A1 | 12/2012 | Lee et al. |
| 2012/0306433 A1 | 12/2012 | Kim et al. |
| 2012/0306705 A1 | 12/2012 | Sakurai et al. |
| 2012/0306707 A1 | 12/2012 | Yang et al. |
| 2012/0306720 A1 | 12/2012 | Tanmi et al. |
| 2012/0307873 A1 | 12/2012 | Kim et al. |
| 2012/0309295 A1 | 12/2012 | Maguire |
| 2012/0309308 A1 | 12/2012 | Kim et al. |
| 2012/0309332 A1 | 12/2012 | Liao |
| 2012/0313446 A1 | 12/2012 | Park et al. |
| 2012/0313449 A1 | 12/2012 | Kurs |
| 2012/0313835 A1 | 12/2012 | Gebretnsae |
| 2012/0326660 A1 | 12/2012 | Lu et al. |
| 2013/0002550 A1 | 1/2013 | Zalewski |
| 2013/0005252 A1 | 1/2013 | Lee et al. |
| 2013/0018439 A1 | 1/2013 | Chow et al. |
| 2013/0024059 A1 | 1/2013 | Miller et al. |
| 2013/0026981 A1 | 1/2013 | Van Der Lee |
| 2013/0026982 A1 | 1/2013 | Rothenbaum |
| 2013/0032589 A1 | 2/2013 | Chung |
| 2013/0033571 A1 | 2/2013 | Steen |
| 2013/0038124 A1 | 2/2013 | Newdoll et al. |
| 2013/0038402 A1 | 2/2013 | Karalis et al. |
| 2013/0043738 A1 | 2/2013 | Park et al. |
| 2013/0044035 A1 | 2/2013 | Zhuang |
| 2013/0049471 A1 | 2/2013 | Oleynik |
| 2013/0049475 A1 | 2/2013 | Kim et al. |
| 2013/0049484 A1 | 2/2013 | Weissentern et al. |
| 2013/0057078 A1 | 3/2013 | Lee |
| 2013/0057205 A1 | 3/2013 | Lee et al. |
| 2013/0057210 A1 | 3/2013 | Negaard et al. |
| 2013/0057364 A1 | 3/2013 | Kesler et al. |
| 2013/0058379 A1 | 3/2013 | Kim et al. |
| 2013/0062959 A1 | 3/2013 | Lee et al. |
| 2013/0063082 A1 | 3/2013 | Lee et al. |
| 2013/0063143 A1 | 3/2013 | Adalsteinsson et al. |
| 2013/0063266 A1 | 3/2013 | Yunker et al. |
| 2013/0069444 A1 | 3/2013 | Waffenschmidt et al. |
| 2013/0076308 A1 | 3/2013 | Niskala et al. |
| 2013/0077650 A1 | 3/2013 | Traxler et al. |
| 2013/0078918 A1 | 3/2013 | Crowley et al. |
| 2013/0082651 A1 | 4/2013 | Park et al. |
| 2013/0082653 A1 | 4/2013 | Lee et al. |
| 2013/0083774 A1 | 4/2013 | Son et al. |
| 2013/0088082 A1 | 4/2013 | Kang et al. |
| 2013/0088090 A1 | 4/2013 | Wu |
| 2013/0088192 A1 | 4/2013 | Eaton |
| 2013/0088331 A1 | 4/2013 | Cho |
| 2013/0093388 A1 | 4/2013 | Partovi |
| 2013/0099389 A1 | 4/2013 | Hong et al. |
| 2013/0099586 A1 | 4/2013 | Kato |
| 2013/0106197 A1 | 5/2013 | Bae et al. |
| 2013/0107023 A1 | 5/2013 | Tanaka et al. |
| 2013/0119777 A1 | 5/2013 | Rees |
| 2013/0119778 A1 | 5/2013 | Jung |
| 2013/0119929 A1 | 5/2013 | Partovi |
| 2013/0120052 A1 | 5/2013 | Siska |
| 2013/0120205 A1 | 5/2013 | Thomson et al. |
| 2013/0120206 A1 | 5/2013 | Biancotto et al. |
| 2013/0120217 A1 | 5/2013 | Ueda et al. |
| 2013/0130621 A1 | 5/2013 | Kim et al. |
| 2013/0132010 A1 | 5/2013 | Winger et al. |
| 2013/0134923 A1 | 5/2013 | Smith |
| 2013/0137455 A1 | 5/2013 | Xia |
| 2013/0141037 A1 | 6/2013 | Jenwatanavet et al. |
| 2013/0148341 A1 | 6/2013 | Williams |
| 2013/0149975 A1 | 6/2013 | Yu et al. |
| 2013/0154387 A1 | 6/2013 | Lee et al. |
| 2013/0155748 A1 | 6/2013 | Sundstrom |
| 2013/0157729 A1 | 6/2013 | Tabe |
| 2013/0162335 A1 | 6/2013 | Kim et al. |
| 2013/0169061 A1 | 7/2013 | Microshnichenko et al. |
| 2013/0169219 A1 | 7/2013 | Gray |
| 2013/0169348 A1 | 7/2013 | Shi |
| 2013/0171939 A1 | 7/2013 | Tian et al. |
| 2013/0175877 A1 | 7/2013 | Abe et al. |
| 2013/0178253 A1 | 7/2013 | Karaoguz |
| 2013/0181881 A1 | 7/2013 | Christie et al. |
| 2013/0187475 A1 | 7/2013 | Vendik |
| 2013/0190031 A1 | 7/2013 | Persson et al. |
| 2013/0193769 A1 | 8/2013 | Mehta et al. |
| 2013/0197320 A1 | 8/2013 | Albert et al. |
| 2013/0200064 A1 | 8/2013 | Alexander |
| 2013/0207477 A1 | 8/2013 | Nam et al. |
| 2013/0207604 A1 | 8/2013 | Zeine |
| 2013/0207879 A1 | 8/2013 | Rada et al. |
| 2013/0210357 A1 | 8/2013 | Qin et al. |
| 2013/0221757 A1 | 8/2013 | Cho et al. |
| 2013/0222201 A1 | 8/2013 | Ma et al. |
| 2013/0234530 A1 | 9/2013 | Miyauchi |
| 2013/0234536 A1 | 9/2013 | Chemishkian et al. |
| 2013/0234658 A1 | 9/2013 | Endo et al. |
| 2013/0241306 A1 | 9/2013 | Aber et al. |
| 2013/0241468 A1 | 9/2013 | Moshfeghi |
| 2013/0241474 A1 | 9/2013 | Moshfeghi |
| 2013/0249478 A1 | 9/2013 | Hirano |
| 2013/0249479 A1 | 9/2013 | Partovi |
| 2013/0249682 A1 | 9/2013 | Van Wiemeersch et al. |
| 2013/0250102 A1 | 9/2013 | Scanlon et al. |
| 2013/0254578 A1 | 9/2013 | Huang et al. |
| 2013/0264997 A1 | 10/2013 | Lee et al. |
| 2013/0268782 A1 | 10/2013 | Tam et al. |
| 2013/0270923 A1 | 10/2013 | Cook et al. |
| 2013/0278076 A1 | 10/2013 | Proud |
| 2013/0278209 A1 | 10/2013 | Von Novak |
| 2013/0285464 A1 | 10/2013 | Miwa |
| 2013/0285477 A1 | 10/2013 | Lo et al. |
| 2013/0285606 A1 | 10/2013 | Ben-Shalom et al. |
| 2013/0288600 A1 | 10/2013 | Kuusilinna et al. |
| 2013/0288617 A1 | 10/2013 | Kim et al. |
| 2013/0293423 A1 | 11/2013 | Moshfeghi |

(56) References Cited

U.S. PATENT DOCUMENTS

| | | |
|---|---|---|
| 2013/0300356 A1 | 11/2013 | Yang |
| 2013/0307751 A1 | 11/2013 | Yu-Juin et al. |
| 2013/0310020 A1 | 11/2013 | Kazuhiro |
| 2013/0311798 A1 | 11/2013 | Sultenfuss |
| 2013/0328417 A1 | 12/2013 | Takeuchi |
| 2013/0334883 A1 | 12/2013 | Kim et al. |
| 2013/0339108 A1 | 12/2013 | Ryder et al. |
| 2013/0343208 A1 | 12/2013 | Sexton et al. |
| 2013/0343251 A1 | 12/2013 | Zhang |
| 2013/0343585 A1 | 12/2013 | Bennett et al. |
| 2014/0001846 A1 | 1/2014 | Mosebrook |
| 2014/0001875 A1 | 1/2014 | Nahidipour |
| 2014/0001876 A1 | 1/2014 | Fujiwara et al. |
| 2014/0006017 A1 | 1/2014 | Sen |
| 2014/0008992 A1 | 1/2014 | Leabman |
| 2014/0008993 A1 | 1/2014 | Leabman |
| 2014/0009108 A1 | 1/2014 | Leabman |
| 2014/0009110 A1 | 1/2014 | Lee |
| 2014/0011531 A1 | 1/2014 | Burstrom et al. |
| 2014/0015336 A1 | 1/2014 | Weber et al. |
| 2014/0015344 A1 | 1/2014 | Mohamadi |
| 2014/0021907 A1 | 1/2014 | Yu et al. |
| 2014/0021908 A1 | 1/2014 | McCool |
| 2014/0035524 A1 | 2/2014 | Zeine |
| 2014/0035526 A1 | 2/2014 | Tripathi et al. |
| 2014/0035786 A1 | 2/2014 | Ley |
| 2014/0043248 A1 | 2/2014 | Yeh |
| 2014/0049422 A1 | 2/2014 | Von Novak et al. |
| 2014/0054971 A1 | 2/2014 | Kissin |
| 2014/0055098 A1 | 2/2014 | Lee et al. |
| 2014/0057618 A1 | 2/2014 | Zirwas et al. |
| 2014/0062395 A1 | 3/2014 | Kwon et al. |
| 2014/0082435 A1 | 3/2014 | Kitgawa |
| 2014/0086125 A1 | 3/2014 | Polo et al. |
| 2014/0086592 A1 | 3/2014 | Nakahara et al. |
| 2014/0091756 A1 | 4/2014 | Ofstein et al. |
| 2014/0091968 A1 | 4/2014 | Harel et al. |
| 2014/0091974 A1 | 4/2014 | Desclos et al. |
| 2014/0103869 A1 | 4/2014 | Radovic |
| 2014/0104157 A1 | 4/2014 | Burns |
| 2014/0111147 A1 | 4/2014 | Soar |
| 2014/0111153 A1 | 4/2014 | Kwon et al. |
| 2014/0113689 A1 | 4/2014 | Lee |
| 2014/0117946 A1 | 5/2014 | Muller et al. |
| 2014/0118140 A1 | 5/2014 | Amis |
| 2014/0128107 A1 | 5/2014 | An |
| 2014/0131455 A1* | 5/2014 | Takigahira ............ H01Q 1/2208 235/492 |
| 2014/0132210 A1 | 5/2014 | Partovi |
| 2014/0133279 A1 | 5/2014 | Khuri-Yakub |
| 2014/0139034 A1 | 5/2014 | Sankar et al. |
| 2014/0139039 A1 | 5/2014 | Cook et al. |
| 2014/0139180 A1 | 5/2014 | Kim et al. |
| 2014/0141838 A1 | 5/2014 | Cai et al. |
| 2014/0142876 A1 | 5/2014 | John et al. |
| 2014/0143933 A1 | 5/2014 | Low et al. |
| 2014/0145879 A1 | 5/2014 | Pan |
| 2014/0145884 A1 | 5/2014 | Dang et al. |
| 2014/0152117 A1 | 6/2014 | Sanker |
| 2014/0159651 A1 | 6/2014 | Von Novak et al. |
| 2014/0159652 A1 | 6/2014 | Hall et al. |
| 2014/0159662 A1 | 6/2014 | Furui |
| 2014/0159667 A1 | 6/2014 | Kim et al. |
| 2014/0169385 A1 | 6/2014 | Hadani et al. |
| 2014/0175876 A1 | 6/2014 | Cheatham, III et al. |
| 2014/0175893 A1 | 6/2014 | Sengupta et al. |
| 2014/0176054 A1 | 6/2014 | Porat et al. |
| 2014/0176061 A1 | 6/2014 | Cheatham, III et al. |
| 2014/0176082 A1 | 6/2014 | Visser |
| 2014/0177399 A1 | 6/2014 | Teng et al. |
| 2014/0183964 A1 | 7/2014 | Walley |
| 2014/0184148 A1 | 7/2014 | Van Der Lee et al. |
| 2014/0184155 A1 | 7/2014 | Cha |
| 2014/0184163 A1 | 7/2014 | Das et al. |
| 2014/0184170 A1 | 7/2014 | Jeong |
| 2014/0191568 A1 | 7/2014 | Partovi |
| 2014/0191818 A1 | 7/2014 | Waffenschmidt et al. |
| 2014/0194092 A1 | 7/2014 | Wanstedt et al. |
| 2014/0194095 A1 | 7/2014 | Wanstedt et al. |
| 2014/0197691 A1 | 7/2014 | Wang |
| 2014/0203629 A1 | 7/2014 | Hoffman et al. |
| 2014/0206384 A1 | 7/2014 | Kim et al. |
| 2014/0210281 A1 | 7/2014 | Ito et al. |
| 2014/0217955 A1 | 8/2014 | Lin |
| 2014/0217967 A1 | 8/2014 | Zeine et al. |
| 2014/0225805 A1 | 8/2014 | Pan et al. |
| 2014/0232320 A1 | 8/2014 | Ento July et al. |
| 2014/0232610 A1 | 8/2014 | Shigemoto et al. |
| 2014/0239733 A1 | 8/2014 | Mach et al. |
| 2014/0241231 A1 | 8/2014 | Zeine |
| 2014/0245036 A1 | 8/2014 | Oishi |
| 2014/0246416 A1 | 9/2014 | White |
| 2014/0247152 A1 | 9/2014 | Proud |
| 2014/0252813 A1 | 9/2014 | Lee et al. |
| 2014/0252866 A1 | 9/2014 | Walsh et al. |
| 2014/0265725 A1 | 9/2014 | Angle et al. |
| 2014/0265727 A1 | 9/2014 | Berte |
| 2014/0265943 A1 | 9/2014 | Angle et al. |
| 2014/0266025 A1 | 9/2014 | Jakubowski |
| 2014/0266939 A1* | 9/2014 | Baringer ............ A61B 5/02416 343/729 |
| 2014/0266946 A1 | 9/2014 | Bily et al. |
| 2014/0273819 A1 | 9/2014 | Nadakuduti et al. |
| 2014/0273892 A1 | 9/2014 | Nourbakhsh |
| 2014/0281655 A1 | 9/2014 | Angle et al. |
| 2014/0292090 A1 | 10/2014 | Cordeiro et al. |
| 2014/0292451 A1 | 10/2014 | Zimmerman |
| 2014/0300452 A1 | 10/2014 | Rofe et al. |
| 2014/0312706 A1 | 10/2014 | Fiorello et al. |
| 2014/0325218 A1 | 10/2014 | Shimizu et al. |
| 2014/0327320 A1 | 11/2014 | Muhs et al. |
| 2014/0327390 A1 | 11/2014 | Park et al. |
| 2014/0333142 A1 | 11/2014 | Desrosiers |
| 2014/0346860 A1 | 11/2014 | Aubry et al. |
| 2014/0354063 A1 | 12/2014 | Leabman et al. |
| 2014/0354221 A1 | 12/2014 | Leabman et al. |
| 2014/0355718 A1 | 12/2014 | Guan et al. |
| 2014/0357309 A1 | 12/2014 | Leabman et al. |
| 2014/0368048 A1 | 12/2014 | Leabman |
| 2014/0368161 A1 | 12/2014 | Leabman et al. |
| 2014/0368405 A1 | 12/2014 | Ek et al. |
| 2014/0375139 A1 | 12/2014 | Tsukamoto |
| 2014/0375253 A1 | 12/2014 | Leabman et al. |
| 2014/0375255 A1 | 12/2014 | Leabman et al. |
| 2014/0375258 A1 | 12/2014 | Arkhipenkov |
| 2014/0375261 A1 | 12/2014 | Manova-Elssibony et al. |
| 2014/0376646 A1 | 12/2014 | Leabman et al. |
| 2015/0001949 A1 | 1/2015 | Leabman et al. |
| 2015/0002086 A1 | 1/2015 | Matos et al. |
| 2015/0003207 A1 | 1/2015 | Lee et al. |
| 2015/0008980 A1 | 1/2015 | Kim et al. |
| 2015/0011160 A1 | 1/2015 | Uurgovan et al. |
| 2015/0015180 A1 | 1/2015 | Miller et al. |
| 2015/0015182 A1 | 1/2015 | Brandtman et al. |
| 2015/0015192 A1 | 1/2015 | Leabamn |
| 2015/0015194 A1 | 1/2015 | Leabman et al. |
| 2015/0015195 A1 | 1/2015 | Leabman et al. |
| 2015/0021990 A1 | 1/2015 | Myer et al. |
| 2015/0022008 A1 | 1/2015 | Leabman et al. |
| 2015/0022009 A1 | 1/2015 | Leabman et al. |
| 2015/0022010 A1 | 1/2015 | Leabman et al. |
| 2015/0022194 A1 | 1/2015 | Almalki et al. |
| 2015/0023204 A1 | 1/2015 | Wil et al. |
| 2015/0028688 A1 | 1/2015 | Masaoka |
| 2015/0028694 A1 | 1/2015 | Leabman et al. |
| 2015/0028697 A1 | 1/2015 | Leabman et al. |
| 2015/0028875 A1 | 1/2015 | Irie et al. |
| 2015/0029397 A1 | 1/2015 | Leabman et al. |
| 2015/0035378 A1 | 2/2015 | Calhoun et al. |
| 2015/0035709 A1 | 2/2015 | Lim |
| 2015/0035715 A1 | 2/2015 | Kim et al. |
| 2015/0039482 A1 | 2/2015 | Fuinaga |
| 2015/0041459 A1 | 2/2015 | Leabman et al. |
| 2015/0042264 A1 | 2/2015 | Leabman et al. |

(56) References Cited

U.S. PATENT DOCUMENTS

| | | |
|---|---|---|
| 2015/0042265 A1 | 2/2015 | Leabman et al. |
| 2015/0044977 A1 | 2/2015 | Ramasamy et al. |
| 2015/0046526 A1 | 2/2015 | Bush et al. |
| 2015/0061404 A1 | 3/2015 | Lamenza et al. |
| 2015/0076917 A1 | 3/2015 | Leabman et al. |
| 2015/0076927 A1 | 3/2015 | Leabman et al. |
| 2015/0077036 A1 | 3/2015 | Leabman et al. |
| 2015/0077037 A1 | 3/2015 | Leabman et al. |
| 2015/0091520 A1 | 4/2015 | Blum et al. |
| 2015/0091706 A1 | 4/2015 | Chemishkian et al. |
| 2015/0097442 A1 | 4/2015 | Muurinen |
| 2015/0097663 A1 | 4/2015 | Sloo et al. |
| 2015/0102681 A1 | 4/2015 | Leabman et al. |
| 2015/0102764 A1 | 4/2015 | Leabman et al. |
| 2015/0102769 A1 | 4/2015 | Leabman et al. |
| 2015/0102942 A1 | 4/2015 | Houser et al. |
| 2015/0102973 A1 | 4/2015 | Hand et al. |
| 2015/0108848 A1 | 4/2015 | Joehren |
| 2015/0109181 A1 | 4/2015 | Hyde et al. |
| 2015/0115877 A1 | 4/2015 | Aria et al. |
| 2015/0115878 A1 | 4/2015 | Park |
| 2015/0116153 A1 | 4/2015 | Chen et al. |
| 2015/0123483 A1 | 5/2015 | Leabman et al. |
| 2015/0123496 A1 | 5/2015 | Leabman et al. |
| 2015/0128733 A1 | 5/2015 | Taylor et al. |
| 2015/0130285 A1 | 5/2015 | Leabman et al. |
| 2015/0130293 A1 | 5/2015 | Hajimiri et al. |
| 2015/0137612 A1 | 5/2015 | Yamakawa et al. |
| 2015/0148664 A1 | 5/2015 | Stolka et al. |
| 2015/0155737 A1 | 6/2015 | Mayo |
| 2015/0155738 A1 | 6/2015 | Leabman et al. |
| 2015/0162662 A1 | 6/2015 | Chen et al. |
| 2015/0162751 A1 | 6/2015 | Leabman et al. |
| 2015/0162779 A1 | 6/2015 | Lee et al. |
| 2015/0171512 A1 | 6/2015 | Chen et al. |
| 2015/0171513 A1 | 6/2015 | Chen et al. |
| 2015/0171656 A1 | 6/2015 | Leabman et al. |
| 2015/0171658 A1 | 6/2015 | Manova-Elssibony et al. |
| 2015/0171931 A1 | 6/2015 | Won et al. |
| 2015/0177326 A1 | 6/2015 | Chakraborty et al. |
| 2015/0180133 A1 | 6/2015 | Hunt |
| 2015/0180249 A1 | 6/2015 | Jeon et al. |
| 2015/0180284 A1 | 6/2015 | Kang et al. |
| 2015/0181117 A1 | 6/2015 | Park et al. |
| 2015/0187491 A1 | 7/2015 | Yanagawa |
| 2015/0188352 A1 | 7/2015 | Peek et al. |
| 2015/0199665 A1 | 7/2015 | Chu |
| 2015/0201385 A1 | 7/2015 | Mercer et al. |
| 2015/0207333 A1 | 7/2015 | Baarman et al. |
| 2015/0207542 A1 | 7/2015 | Zeine |
| 2015/0222126 A1 | 8/2015 | Leabman et al. |
| 2015/0233987 A1 | 8/2015 | Von Novak, III et al. |
| 2015/0234144 A1 | 8/2015 | Cameron et al. |
| 2015/0236520 A1 | 8/2015 | Baarman |
| 2015/0244070 A1 | 8/2015 | Cheng et al. |
| 2015/0244080 A1 | 8/2015 | Gregoire |
| 2015/0244187 A1 | 8/2015 | Horie |
| 2015/0244201 A1 | 8/2015 | Chu |
| 2015/0244341 A1 | 8/2015 | Ritter et al. |
| 2015/0249484 A1 | 9/2015 | Mach et al. |
| 2015/0255989 A1 | 9/2015 | Walley et al. |
| 2015/0256097 A1 | 9/2015 | Gudan et al. |
| 2015/0260835 A1 | 9/2015 | Widmer et al. |
| 2015/0262465 A1 | 9/2015 | Pritchett |
| 2015/0263534 A1 | 9/2015 | Lee et al. |
| 2015/0263548 A1 | 9/2015 | Cooper |
| 2015/0270618 A1 | 9/2015 | Zhu et al. |
| 2015/0270622 A1 | 9/2015 | Takasaki et al. |
| 2015/0270741 A1 | 9/2015 | Leabman et al. |
| 2015/0278558 A1 | 10/2015 | Priev et al. |
| 2015/0280429 A1 | 10/2015 | Makita et al. |
| 2015/0280484 A1 | 10/2015 | Radziemski et al. |
| 2015/0288074 A1 | 10/2015 | Harper et al. |
| 2015/0288438 A1 | 10/2015 | Maltsev et al. |
| 2015/0311585 A1 | 10/2015 | Church et al. |
| 2015/0312721 A1 | 10/2015 | Singh |
| 2015/0318729 A1 | 11/2015 | Leabman |
| 2015/0326024 A1 | 11/2015 | Bell et al. |
| 2015/0326025 A1 | 11/2015 | Bell et al. |
| 2015/0326051 A1 | 11/2015 | Bell et al. |
| 2015/0326063 A1 | 11/2015 | Leabman et al. |
| 2015/0326068 A1 | 11/2015 | Bell et al. |
| 2015/0326069 A1 | 11/2015 | Petras et al. |
| 2015/0326070 A1 | 11/2015 | Petras et al. |
| 2015/0326071 A1 | 11/2015 | Contopanagos |
| 2015/0326072 A1 | 11/2015 | Petras et al. |
| 2015/0326142 A1 | 11/2015 | Petras et al. |
| 2015/0326143 A1 | 11/2015 | Petras et al. |
| 2015/0327085 A1 | 11/2015 | Hadani |
| 2015/0333528 A1 | 11/2015 | Leabman |
| 2015/0333529 A1 | 11/2015 | Leabman |
| 2015/0333573 A1 | 11/2015 | Leabman |
| 2015/0333800 A1 | 11/2015 | Perry et al. |
| 2015/0339497 A1 | 11/2015 | Kurian |
| 2015/0340759 A1 | 11/2015 | Bridgelall et al. |
| 2015/0340903 A1 | 11/2015 | Bell et al. |
| 2015/0340909 A1 | 11/2015 | Bell et al. |
| 2015/0340910 A1 | 11/2015 | Petras et al. |
| 2015/0340911 A1 | 11/2015 | Bell et al. |
| 2015/0341087 A1 | 11/2015 | Moore et al. |
| 2015/0349574 A1 | 12/2015 | Leabman |
| 2015/0358222 A1 | 12/2015 | Berger et al. |
| 2015/0365137 A1 | 12/2015 | Miller et al. |
| 2015/0365138 A1 | 12/2015 | Miller et al. |
| 2016/0005068 A1 | 1/2016 | Im et al. |
| 2016/0012695 A1 | 1/2016 | Bell et al. |
| 2016/0013560 A1 | 1/2016 | Daniels |
| 2016/0013656 A1 | 1/2016 | Bell et al. |
| 2016/0013677 A1 | 1/2016 | Bell et al. |
| 2016/0013678 A1 | 1/2016 | Bell et al. |
| 2016/0013855 A1 | 1/2016 | Campos |
| 2016/0020636 A1 | 1/2016 | Khlat |
| 2016/0020647 A1 | 1/2016 | Leabman et al. |
| 2016/0020649 A1 | 1/2016 | Bell et al. |
| 2016/0020830 A1 | 1/2016 | Bell et al. |
| 2016/0028403 A1 | 1/2016 | McCaughan et al. |
| 2016/0033254 A1 | 2/2016 | Zeine et al. |
| 2016/0042206 A1 | 2/2016 | Pesavento et al. |
| 2016/0043571 A1 | 2/2016 | Kesler et al. |
| 2016/0043572 A1 | 2/2016 | Cooper et al. |
| 2016/0054395 A1 | 2/2016 | Bell et al. |
| 2016/0054396 A1 | 2/2016 | Bell et al. |
| 2016/0054440 A1 | 2/2016 | Younis |
| 2016/0056635 A1 | 2/2016 | Bell |
| 2016/0056640 A1 | 2/2016 | Mao |
| 2016/0056669 A1 | 2/2016 | Bell |
| 2016/0056966 A1 | 2/2016 | Bell |
| 2016/0065005 A1 | 3/2016 | Won et al. |
| 2016/0079799 A1 | 3/2016 | Khlat |
| 2016/0087483 A1 | 3/2016 | Hietala et al. |
| 2016/0087486 A1 | 3/2016 | Pogorelik et al. |
| 2016/0094091 A1 | 3/2016 | Shin et al. |
| 2016/0094092 A1 | 3/2016 | Davlantes et al. |
| 2016/0099601 A1 | 4/2016 | Leabman et al. |
| 2016/0099602 A1 | 4/2016 | Leabman et al. |
| 2016/0099609 A1 | 4/2016 | Leabman et al. |
| 2016/0099610 A1 | 4/2016 | Leabman et al. |
| 2016/0099611 A1 | 4/2016 | Leabman et al. |
| 2016/0099612 A1 | 4/2016 | Leabman et al. |
| 2016/0099613 A1 | 4/2016 | Leabman et al. |
| 2016/0099614 A1 | 4/2016 | Leabman et al. |
| 2016/0099755 A1 | 4/2016 | Leabman et al. |
| 2016/0099756 A1 | 4/2016 | Leabman et al. |
| 2016/0099757 A1 | 4/2016 | Leabman et al. |
| 2016/0099758 A1 | 4/2016 | Leabman et al. |
| 2016/0100124 A1 | 4/2016 | Leabman et al. |
| 2016/0100312 A1 | 4/2016 | Bell et al. |
| 2016/0112787 A1 | 4/2016 | Rich |
| 2016/0126749 A1 | 5/2016 | Shichino et al. |
| 2016/0126752 A1 | 5/2016 | Vuori et al. |
| 2016/0126776 A1 | 5/2016 | Kim et al. |
| 2016/0141908 A1 | 5/2016 | Jakl et al. |
| 2016/0164563 A1 | 6/2016 | Khawand et al. |
| 2016/0174162 A1 | 6/2016 | Nadakuduti et al. |

(56) References Cited

U.S. PATENT DOCUMENTS

| | | |
|---|---|---|
| 2016/0181849 A1 | 6/2016 | Govindaraj |
| 2016/0181854 A1 | 6/2016 | Leabman |
| 2016/0181867 A1 | 6/2016 | Daniel et al. |
| 2016/0181873 A1 | 6/2016 | Mitcheson et al. |
| 2016/0191121 A1 | 6/2016 | Bell |
| 2016/0197522 A1 | 7/2016 | Zeine et al. |
| 2016/0202343 A1 | 7/2016 | Okutsu |
| 2016/0204622 A1 | 7/2016 | Leabman |
| 2016/0204642 A1 | 7/2016 | Oh |
| 2016/0218545 A1 | 7/2016 | Schroeder et al. |
| 2016/0233582 A1 | 8/2016 | Piskun |
| 2016/0238365 A1 | 8/2016 | Wixey et al. |
| 2016/0240908 A1 | 8/2016 | Strong |
| 2016/0248276 A1 | 8/2016 | Hong et al. |
| 2016/0294225 A1 | 10/2016 | Blum et al. |
| 2016/0299210 A1 | 10/2016 | Zeine |
| 2016/0301240 A1 | 10/2016 | Zeine |
| 2016/0322868 A1 | 11/2016 | Akuzawa et al. |
| 2016/0323000 A1 | 11/2016 | Liu et al. |
| 2016/0336804 A1 | 11/2016 | Son et al. |
| 2016/0339258 A1 | 11/2016 | Perryman et al. |
| 2016/0344098 A1 | 11/2016 | Ming |
| 2016/0359367 A1 | 12/2016 | Rothschild |
| 2016/0380464 A1 | 12/2016 | Chin et al. |
| 2016/0380466 A1 | 12/2016 | Yang et al. |
| 2017/0005481 A1 | 1/2017 | Von Novak, III |
| 2017/0005516 A9 | 1/2017 | Leabman et al. |
| 2017/0005524 A1 | 1/2017 | Akuzawa et al. |
| 2017/0005530 A1 | 1/2017 | Zeine et al. |
| 2017/0012448 A1 | 1/2017 | Miller et al. |
| 2017/0025887 A1 | 1/2017 | Hyun et al. |
| 2017/0025903 A1 | 1/2017 | Song et al. |
| 2017/0026087 A1 | 1/2017 | Tanabe |
| 2017/0040700 A1 | 2/2017 | Leung |
| 2017/0043675 A1 | 2/2017 | Jones et al. |
| 2017/0047784 A1 | 2/2017 | Jung et al. |
| 2017/0054219 A1* | 2/2017 | Matsushita ............ H01Q 13/10 |
| 2017/0187225 A1 | 2/2017 | Hosseini |
| 2017/0063168 A1 | 3/2017 | Uchida |
| 2017/0077733 A1 | 3/2017 | Jeong et al. |
| 2017/0077735 A1 | 3/2017 | Leabman |
| 2017/0077736 A1 | 3/2017 | Leabman |
| 2017/0077764 A1 | 3/2017 | Bell et al. |
| 2017/0077765 A1 | 3/2017 | Bell et al. |
| 2017/0077979 A1 | 3/2017 | Papa et al. |
| 2017/0077995 A1 | 3/2017 | Leabman |
| 2017/0085112 A1 | 3/2017 | Leabman et al. |
| 2017/0085120 A1 | 3/2017 | Leabman et al. |
| 2017/0085127 A1 | 3/2017 | Leabman |
| 2017/0085437 A1 | 3/2017 | Condeixa et al. |
| 2017/0092115 A1 | 3/2017 | Sloo et al. |
| 2017/0104263 A1 | 4/2017 | Hosseini |
| 2017/0110886 A1 | 4/2017 | Reynolds et al. |
| 2017/0110887 A1 | 4/2017 | Bell et al. |
| 2017/0110888 A1 | 4/2017 | Leabman |
| 2017/0110889 A1 | 4/2017 | Bell |
| 2017/0110914 A1 | 4/2017 | Bell |
| 2017/0127196 A1 | 5/2017 | Blum et al. |
| 2017/0134686 A9 | 5/2017 | Leabman |
| 2017/0141582 A1 | 5/2017 | Adolf et al. |
| 2017/0141583 A1 | 5/2017 | Adolf et al. |
| 2017/0163076 A1 | 6/2017 | Park et al. |
| 2017/0168595 A1 | 6/2017 | Sakaguchi et al. |
| 2017/0179763 A9 | 6/2017 | Leabman |
| 2017/0179771 A1 | 6/2017 | Leabman |
| 2017/0187198 A1 | 6/2017 | Leabman |
| 2017/0187222 A1 | 6/2017 | Hosseini |
| 2017/0187223 A1 | 6/2017 | Hosseini |
| 2017/0187224 A1 | 6/2017 | Hosseini |
| 2017/0187228 A1 | 6/2017 | Hosseini |
| 2017/0187247 A1 | 6/2017 | Leabman |
| 2017/0187248 A1* | 6/2017 | Leabman ............... H02J 50/20 |
| 2017/0187422 A1* | 6/2017 | Hosseini ............. H02J 50/005 |
| 2017/0214422 A1 | 7/2017 | Na et al. |
| 2017/0274787 A1 | 9/2017 | Salter et al. |
| 2017/0338695 A1 | 11/2017 | Port |
| 2018/0040929 A1 | 2/2018 | Chappelle |
| 2018/0048178 A1 | 2/2018 | Leabman |
| 2018/0090992 A1 | 3/2018 | Shrivastava et al. |
| 2018/0096237 A1* | 4/2018 | Michiwaki ............ G01S 13/755 |
| 2018/0123400 A1 | 5/2018 | Leabman |
| 2018/0131238 A1 | 5/2018 | Leabman |
| 2018/0159338 A1 | 6/2018 | Leabman et al. |
| 2018/0159355 A1 | 6/2018 | Leabman |
| 2018/0166924 A1 | 6/2018 | Hosseini |
| 2018/0166925 A1 | 6/2018 | Hosseini |
| 2018/0198199 A1 | 7/2018 | Hosseini |
| 2018/0212474 A1 | 7/2018 | Hosseini |
| 2018/0226840 A1 | 8/2018 | Leabman |
| 2018/0241255 A1 | 8/2018 | Leabman |
| 2018/0248409 A1 | 8/2018 | Johnston |
| 2018/0262014 A1 | 9/2018 | Bell |
| 2018/0262040 A1 | 9/2018 | Contopanagos |
| 2018/0262050 A1 | 9/2018 | Yankowitz |
| 2018/0262060 A1 | 9/2018 | Johnston |
| 2018/0269570 A1 | 9/2018 | Hosseini |
| 2018/0287431 A1 | 10/2018 | Liu et al. |
| 2018/0309314 A1 | 10/2018 | White et al. |
| 2018/0331429 A1 | 11/2018 | Kornaros |
| 2018/0331581 A1 | 11/2018 | Hosseini |
| 2018/0337534 A1 | 11/2018 | Bell et al. |
| 2018/0343040 A1 | 11/2018 | Luzinski et al. |
| 2018/0375340 A1 | 12/2018 | Bell et al. |
| 2018/0375368 A1 | 12/2018 | Leabman |
| 2018/0376235 A1 | 12/2018 | Leabman |
| 2019/0052979 A1 | 2/2019 | Chen et al. |
| 2019/0074133 A1 | 3/2019 | Contopanagos |
| 2019/0074728 A1 | 3/2019 | Leabman |
| 2019/0131827 A1 | 5/2019 | Johnston |
| 2019/0245389 A1 | 8/2019 | Johnston et al. |
| 2019/0288567 A1 | 9/2019 | Leabman et al. |
| 2019/0296586 A1 | 9/2019 | Moshfeghi |
| 2019/0372384 A1 | 12/2019 | Hosseini et al. |
| 2019/0393729 A1 | 12/2019 | Contopanagos et al. |
| 2019/0393928 A1 | 12/2019 | Leabman |
| 2020/0006988 A1 | 1/2020 | Leabman |
| 2020/0021128 A1 | 1/2020 | Bell et al. |
| 2020/0044488 A1 | 2/2020 | Johnston et al. |
| 2020/0112204 A1 | 4/2020 | Hosseini et al. |
| 2020/0119592 A1 | 4/2020 | Hosseini |
| 2020/0153117 A1 | 5/2020 | Papio-Toda et al. |
| 2020/0203837 A1 | 6/2020 | Kornaros et al. |
| 2020/0244102 A1 | 7/2020 | Leabman et al. |
| 2020/0244104 A1 | 7/2020 | Katajamaki et al. |
| 2020/0244111 A1 | 7/2020 | Johnston et al. |
| 2020/0252141 A1 | 8/2020 | Sarajedini |

FOREIGN PATENT DOCUMENTS

| | | |
|---|---|---|
| CN | 201278367 Y | 7/2009 |
| CN | 101507044 A | 8/2009 |
| CN | 102027690 A | 4/2011 |
| CN | 102089952 A | 6/2011 |
| CN | 102292896 A | 12/2011 |
| CN | 102860037 A | 1/2013 |
| CN | 103151848 A | 6/2013 |
| CN | 103348563 A | 10/2013 |
| CN | 103594776 A | 2/2014 |
| CN | 104040789 A | 9/2014 |
| CN | 203826555 U | 9/2014 |
| CN | 104090265 A | 10/2014 |
| CN | 104167773 A | 11/2014 |
| CN | 104347915 A | 2/2015 |
| CN | 105762946 A | 7/2016 |
| CN | 105765821 A | 7/2016 |
| CN | 106329116 A | 1/2017 |
| CN | 103380561 B | 9/2017 |
| DE | 200216655 U1 | 2/2002 |
| DE | 102003216953 A1 | 2/2015 |
| DE | 102014219679 A1 | 3/2016 |
| EP | 1028482 A2 | 8/2000 |
| EP | 1081506 A1 | 3/2001 |
| EP | 2397973 A1 | 6/2010 |
| EP | 2346136 A1 | 7/2011 |

(56) References Cited

FOREIGN PATENT DOCUMENTS

| | | |
|---|---|---|
| EP | 2545635 A2 | 1/2013 |
| EP | 2747195 A1 | 6/2014 |
| EP | 3067983 A1 | 9/2016 |
| EP | 3118970 A1 | 1/2017 |
| EP | 3145052 A1 | 3/2017 |
| GB | 2404497 A | 2/2005 |
| GB | 2556620 A | 6/2018 |
| JP | 2000323916 A | 11/2000 |
| JP | 2002319816 A | 10/2002 |
| JP | 2006157586 A | 6/2006 |
| JP | 2007043432 A | 2/2007 |
| JP | 2008092704 A | 4/2008 |
| JP | 2008167017 A | 7/2008 |
| JP | 2009525715 A | 7/2009 |
| JP | 2009201328 A | 9/2009 |
| JP | 2011514781 A | 5/2011 |
| JP | 2012016171 A | 1/2012 |
| JP | 2012023950 A | 2/2012 |
| JP | 2012095226 A | 5/2012 |
| JP | 2012157167 A | 8/2012 |
| JP | 2013099249 A | 5/2013 |
| JP | 2013162624 A | 8/2013 |
| JP | 2014075927 A | 4/2014 |
| JP | 2014112063 A | 6/2014 |
| JP | 2014176125 A | 9/2014 |
| JP | 2014176131 A | 9/2014 |
| JP | 2015027345 A | 2/2015 |
| JP | 2015128349 A | 7/2015 |
| JP | 2015128370 A | 7/2015 |
| JP | 2015139276 A | 7/2015 |
| JP | WO2015177859 A1 | 4/2017 |
| KR | 20060061776 A | 6/2006 |
| KR | 20070044302 A | 4/2007 |
| KR | 100755144 B1 | 9/2007 |
| KR | 20110132059 A | 12/2011 |
| KR | 20110135540 A1 | 12/2011 |
| KR | 20120009843 A | 2/2012 |
| KR | 20120108759 A | 10/2012 |
| KR | 20130026977 A | 3/2013 |
| KR | 20140023409 A | 2/2014 |
| KR | 20140023410 A | 3/2014 |
| KR | 20140085200 A | 7/2014 |
| KR | 20150077678 A | 7/2015 |
| RU | 2658332 C1 | 6/2018 |
| WO | WO 199508125 A1 | 3/1995 |
| WO | WO 199831070 A1 | 7/1998 |
| WO | WO 9952173 | 10/1999 |
| WO | WO 200111716 A1 | 2/2001 |
| WO | WO 2003091943 A1 | 11/2003 |
| WO | WO 2004077550 A1 | 9/2004 |
| WO | WO 2006122783 | 11/2006 |
| WO | WO 2007070571 A2 | 6/2007 |
| WO | WO 2008024993 A2 | 2/2008 |
| WO | WO 2008156571 A2 | 12/2008 |
| WO | WO 2010022181 A1 | 2/2010 |
| WO | WO 2010039246 A1 | 4/2010 |
| WO | WO 2010116441 A1 | 10/2010 |
| WO | WO 2010138994 A1 | 12/2010 |
| WO | WO 2011112022 A2 | 9/2011 |
| WO | WO 2012177283 A1 | 12/2012 |
| WO | WO 2013031988 A1 | 3/2013 |
| WO | WO 2013035190 A1 | 3/2013 |
| WO | WO 2013038074 A2 | 3/2013 |
| WO | WO 2013042399 A1 | 3/2013 |
| WO | WO 2013052950 A1 | 4/2013 |
| WO | WO 2013105920 A2 | 7/2013 |
| WO | WO 2013175596 A1 | 11/2013 |
| WO | WO 2014068992 A1 | 5/2014 |
| WO | WO 2014075103 A1 | 5/2014 |
| WO | WO 2014113093 A1 | 7/2014 |
| WO | WO 2014132258 A1 | 9/2014 |
| WO | WO 2014134996 A1 | 9/2014 |
| WO | WO 2014156465 A1 | 10/2014 |
| WO | WO 2014182788 A2 | 11/2014 |
| WO | WO 2014182788 A3 | 11/2014 |
| WO | WO 2014197472 A1 | 12/2014 |
| WO | WO 2014209587 A1 | 12/2014 |
| WO | WO 2015038773 A1 | 3/2015 |
| WO | WO 2015097809 A1 | 7/2015 |
| WO | WO 2015130902 A1 | 9/2015 |
| WO | WO 2015161323 A1 | 10/2015 |
| WO | WO 2016024869 A1 | 2/2016 |
| WO | WO 2016048512 A1 | 3/2016 |
| WO | WO 2016088261 A1 | 6/2016 |
| WO | WO 2016187357 A1 | 11/2016 |

OTHER PUBLICATIONS

Energous Corp., IPRP, PCT/US2018/012806, dated Jul. 9, 2019, 6 pgs.

Energous Corp., IPRP, PCT/US2018/025465, dated Oct. 1, 2019, 8 pgs.

Energous Corp., IPRP, PCT/US2018/031768, dated Nov. 12, 2019, 8 pgs.

Energous Corp., IPRP, PCT/US2018/031786, dated Apr. 14, 2020, 7 pgs.

Energous Corp., IPRP, PCT/US2018/039334, dated Dec. 24, 2019, 8 pgs.

Energous Corp., IPRP, PCT/US2018/051082, dated Mar. 17, 2020, 9 pgs.

Energous Corp., IPRP, PCT/US2018/058178, dated May 5, 2020, 7 pgs.

Energous Corp., ISRWO, PCT/US2018/025465, dated Jun. 22, 2018, 9 pgs.

Energous Corp., ISRWO, PCT/US2018/031786, dated Aug. 8, 2018, 9 pgs.

Energous Corp., ISRWO, PCT/US2018/039334, dated Sep. 11, 2018, 9 pgs.

Energous Corp., ISRWO, PCT/US2018/058178, dated Mar. 13, 2019, 10 pgs.

Energous Corp., ISRWO, PCT/US2018/064289, dated Apr. 25, 2019, 12 pgs.

Energous Corp., ISRWO, PCT/US2019/015820, dated May 14, 2019, 9 pgs.

Energous Corp., ISRWO, PCT/US2019/021817, dated Apr. 6, 2019, 11 pgs.

Energous Corp., ISRWO, PCT/US2019/039014, dated Oct. 4, 2019, 15 pgs.

Energous Corp., ISRWO, PCT/US2019/061445, dated Jan. 7, 2020, 19 pgs.

Energous Corp., ISRWO, PCT/US2020/016975, dated May 15, 2020, 15 pgs.

Extended European Search Report, EP16880139.7, dated Jul. 12, 2019, 5 pgs.

Extended European Search Report, EP16880153.8, dated Jul. 2, 2019, 9 pgs.

Extended European Search Report, EP16880158.7, dated Jul. 15, 2019, 8 pgs.

Extended European Search Report, EP16882597.4, dated Aug. 7, 2019, 9 pgs.

Extended European Search Report, EP16882696.4, dated Jul. 3, 2019, 10 pgs.

Extended European Search Report, EP17840412.5, dated Jul. 15, 2019, 8 pgs.

Extended European Search Report, EP17882087.4, dated Sep. 17, 2019, 10 pgs.

Extended European Search Report, EP19214719.7, dated Jan. 17, 2020, 9 pgs.

Qing et al. "UHF Near-Field Segmented Loop Antennas with Enlarged Interrogation Zone," 2012 IEEE International Workshop on Antenna Technology (iWAT), Mar. 1, 2012, pp. 132-135, XP055572059, ISBN: 978-1-4673-0035-3.

Wei et al. "Design of a Wideband Horizontally Polarized Omnidirectional Printed Loop Antenna," IEEE Antennas and Wireless Propagation Letters, vol. 11, Jan. 3, 2012, 4 pgs.

Zeng et al. "A Compact Fractal Loop Rectenna for RF Energy Harvesting," IEEE Antennas and Wireless Propagation Letters, vol. 16, 4 pgs.

(56) References Cited

OTHER PUBLICATIONS

Energous Corp., ISRWO, PCT/US2014/037170, dated Sep. 15, 2014, 11 pgs.
Energous Corp., IPRP, PCT/US2014/037170, dated Nov. 10, 2015, 8 pgs.
Energous Corp., ISRWO, PCT/US2014/041534, dated Oct. 13, 2014, 10 pgs.
Energous Corp., IPRP, PCT/US2014/041534, dated Dec. 29, 2015, 7 pgs.
Energous Corp., ISRWO, PCT/US2014/046956, dated Nov. 12, 2014, 10 pgs.
Energous Corp., IPRP, PCT/US2014/046956, dated Jan. 19, 2016, 7 pgs.
Energous Corp., ISRWO, PCT/US2014/037072, dated Sep. 12, 2014, 8 pgs.
Energous Corp., IPRP, PCT/US2014/037072, dated Nov. 10, 2015, 6 pgs.
Energous Corp., ISRWO, PCT/US2014/068568, dated Mar. 20, 2015, 10 pgs.
Energous Corp., IPRP, PCT/US2014/068568, dated Jun. 14, 2016, 8 pgs.
Energous Corp., ISRWO, PCT/US2014/055195, dated Dec. 22, 2014, 11 pgs.
Energous Corp., IPRP, PCT/US2014/055195, dated Mar. 22, 2016, 9 pgs.
Energous Corp., ISRWO, PCT/US2015/067291, dated Mar. 4, 2016, 10 pgs.
Energous Corp., IPRP, PCT/US2015/067291, dated Jul. 4, 2017, 4 pgs.
Energous Corp., ISRWO, PCT/US2015/067242, dated Mar. 16, 2016, 9 pgs.
Energous Corp., IPRP, PCT/US2015/067242, dated Jun. 27, 2017, 7 pgs.
Energous Corp., ISRWO, PCT/US2015/067243, dated Mar. 10, 2016, 11 pgs.
Energous Corp., IPRP, PCT/US2015/067243, dated Jun. 27, 2017, 7 pgs.
Energous Corp., ISRWO, PCT/US2014/037109, dated Apr. 8, 2016, 12 pgs.
Energous Corp., IPRP, PCT/US2014/037109, dated Apr. 12, 2016, 9 pgs.
Energous Corp., ISRWO, PCT/US2015/067275, dated Mar. 3, 2016, 8 pgs.
Energous Corp., IPRP, PCT/US2015/067275, dated Jul. 4, 2017, 7 pgs.
Energous Corp., ISRWO, PCT/US2015/067245, dated Mar. 17, 2016, 8 pgs.
Energous Corp., IPRP, PCT/US2015/067245, dated Jun. 27, 2017, 7 pgs.
Energous Corp., ISRWO, PCT/US2014/041546, dated Oct. 16, 2014, 12 pgs.
Energous Corp., IPRP, PCT/US2014/041546, dated Dec. 29, 2015, 9 pgs.
Energous Corp., ISRWO, PCT/US2015/67250, dated Mar. 30, 2016, 11 pgs.
Energous Corp., IPRP, PCT/US2015/67250, dated Mar. 30, 2016, 10 pgs.
Energous Corp., ISRWO, PCT/US2015/067325, dated Mar. 10, 2016, 9 pgs.
Energous Corp., IPRP, PCT/US2015/067325, dated Jul. 4, 2017, 8 pgs.
Energous Corp., ISRWO, PCT/US2014/040697, dated Oct. 1, 2014, 12 pgs.
Energous Corp., IPRP, PCT/US2014/040697, dated Dec. 8, 2015, 9 pgs.
Energous Corp., ISRWO, PCT/US2014/040705, dated Sep. 23, 2014, 8 pgs.
Energous Corp., IPRP, PCT/US2014/040705, dated Dec. 8, 2015, 6 pgs.
Energous Corp., ISRWO, PCT/US2015/067249, dated Mar. 29, 2016, 8 pgs.
Energous Corp., IPRP, PCT/US2015/067249, dated Jun. 27, 2017, 7 pgs.
Energous Corp., ISRWO, PCT/US2015/067246, dated May 11, 2016, 18 pgs.
Energous Corp., IPRP, PCT/US2015/067246, dated Jun. 27, 2017, 9 pgs.
Energous Corp., ISRWO, PCT/US2014/059317, dated Feb. 24, 2015, 13 pgs.
Energous Corp., IPRP, PCT/US2014/059317, dated Apr. 12, 2016, 10 pgs.
Energous Corp., ISRWO, PCT/US2014/049669, dated Nov. 13, 2014, 10 pgs.
Energous Corp., IPRP, PCT/US2014/049669, dated Feb. 9, 2016, 8 pgs.
Energous Corp., ISRWO, PCT/US2014/041323, dated Oct. 1, 2014, 10 pgs.
Energous Corp., IPRP, PCT/US2014/041323, dated Dec. 22, 2015, 8 pgs.
Energous Corp., ISRWO, PCT/US2014/048002, dated Nov. 13, 2014, 11 pgs.
Energous Corp., IPRP, PCT/US2014/048002, dated Feb. 12, 2015 8 pgs.
Energous Corp., ISRWO, PCT/US2014/062682, dated Feb. 12, 2015, 10 pgs.
Energous Corp., IPRP, PCT/US2014/062682, dated May 3, 2016, 8 pgs.
Energous Corp., ISRWO, PCT/US2014/049666, dated Nov. 10, 2014, 7 pgs.
Energous Corp., IPRP, PCT/US2014/049666, dated Feb. 9, 2016, 5 pgs.
Energous Corp., ISRWO, PCT/US2014/046961, dated Nov. 24, 2014, 16 pgs.
Energous Corp., IPRP, PCT/US2014/046961, dated Jan. 19, 2016, 8 pgs.
Energous Corp., ISRWO, PCT/US2015/067279, dated Mar. 11, 2015, 13 pgs.
Energous Corp., IPRP, PCT/US2015/067279, dated Jul. 4, 2017, 7 pgs.
Energous Corp., ISRWO, PCT/US2014/041342, dated Jan. 27, 2015, 10 pgs.
Energous Corp., IPRP, PCT/US2014/041342, dated Dec. 15, 2015, 8 pgs.
Energous Corp., ISRWO, PCT/US2014/046941, dated Nov. 6, 2014, 11 pgs.
Energous Corp., IPRP, PCT/US2014/046941, dated Jan. 19, 2016, 9 pgs.
Energous Corp., ISRWO, PCT/US2014/062661, dated Jan. 27, 2015, 12 pgs.
Energous Corp., IPRP, PCT/US2014/062661, dated May 3, 2016, 10 pgs.
Energous Corp., ISRWO, PCT/US2014/059871, dated Jan. 23, 2015, 12 pgs.
Energous Corp., IPRP, PCT/US2014/059871, dated Apr. 12, 2016, 9 pgs.
Energous Corp., ISRWO, PCT/US2014/045102, dated Oct. 28, 2014, 14 pgs.
Energous Corp., IPRP, PCT/US2014/045102, dated Jan. 12, 2016, 11 pgs.
Energous Corp., ISRWO, PCT/US2014/059340, dated Jan. 15, 2015, 13 pgs.
Energous Corp., IPRP, PCT/US2014/059340, dated Apr. 12, 2016, 11 pgs.
Energous Corp., ISRWO, PCT/US2015/067282, dated Jul. 5, 2016, 7 pgs.
Energous Corp., IPRP, PCT/US2015/067282, dated Jul. 4, 2017, 6 pgs.
Energous Corp., ISRWO, PCT/US2014/041558, dated Oct. 10, 2014, 8 pgs.
Energous Corp., IPRP, PCT/US2014/041558, dated Dec. 29, 2015, 6 pgs.

(56) References Cited

OTHER PUBLICATIONS

Energous Corp., ISRWO, PCT/US2014/045119, dated Oct. 13, 2014, 11 pgs.
Energous Corp., IPRP, PCT/US2014/045119, dated Jan. 12, 2016, 9 pgs.
Energous Corp., ISRWO, PCT/US2014/045237, dated Oct. 13, 2014, 16 pgs.
Energous Corp., IPRP, PCT/US2014/045237, dated Jan. 12, 2016, 12 pgs.
Energous Corp., ISRWO, PCT/US2014/054897, dated Feb. 17, 2015, 10 pgs.
Energous Corp., IPRP, PCT/US2014/054897, dated Mar. 15, 2016, 8 pgs.
Energous Corp., ISRWO, PCT/US2015/067334, dated Mar. 3, 2016, 6 pgs.
Energous Corp., IPRP, PCT/US2015/067334, dated Jul. 4, 2017, 5 pgs.
Energous Corp., ISRWO, PCT/US2014/047963, dated Nov. 7, 2014, 13 pgs.
Energous Corp., IPRP, PCT/US2014/047963, dated Jan. 26, 2016, 10 pgs.
Energous Corp., ISRWO, PCT/US2014/054891, dated Dec. 18, 2014, 12 pgs.
Energous Corp., IPRP, PCT/US2014/054891, dated Mar. 15, 2016, 10 pgs.
Energous Corp., ISRWO, PCT/US2014/054953, dated Dec. 4, 2014, 7 pgs.
Energous Corp., IPRP, PCT/US2014/054953, dated Mar. 22, 2016, 5 pgs.
Energous Corp., ISRWO, PCT/US2015/067294, dated Mar. 29, 2016, 7 pgs.
Energous Corp., IPRP, PCT/US2015/067294, dated Jul. 4, 2017, 6 pgs.
Energous Corp., ISRWO, PCT/US2014/062672 dated Jan. 26, 2015, 11 pgs.
Energous Corp., IPRP, PCT/US2014/062672 dated May 10, 2016, 8 pgs.
Energous Corp., ISRWO, PCT/US2016/069313 dated Nov. 13, 2017, 10 pgs.
Energous Corp., IPRP, PCT/US2016/069313 dated Jul. 3, 2018, 7 pgs.
Energous Corp., ISRWO, PCT/US2014/044810 dated Oct. 21, 2014, 12 pgs.
Energous Corp., IPRP, PCT/US2014/044810, dated Jan. 5, 2016, 10 pgs.
Energous Corp., ISRWO, PCT/US2015/067271, dated Mar. 11, 2016, 6 pgs.
Energous Corp., IPRP, PCT/US2015/067271, dated Jul. 4, 2017, 5 pgs.
Energous Corp., ISRWO, PCT/US2014/040648, dated Oct. 10, 2014, 11 pgs.
Energous Corp., IPRP, PCT/US2014/040648, dated Dec. 8, 2015, 8 pgs.
Energous Corp., ISRWO, PCT/US2014/049673, dated Nov. 18, 2014, 10 pgs.
Energous Corp., IPRP, PCT/US2014/049673, dated Feb. 9, 2016, 6 pgs.
Energous Corp., ISRWO, PCT/US2014/068282, dated Mar. 19, 2015, 13 pgs.
Energous Corp., IPRP, PCT/US2014/068282, dated Jun. 7, 2016, 10 pgs.
Energous Corp., ISRWO, PCT/US2014/068586, dated Mar. 20, 2015, 11 pgs.
Energous Corp., IPRP, PCT/US2014/068586, dated Jun. 14, 2016, 8 pgs.
Energous Corp., ISRWO, PCT/US2016/068504, dated Mar. 30, 2017, 8 pgs.
Energous Corp., IPRP, PCT/US2016/068504, dated Jun. 26, 2018, 5 pgs.
Energous Corp., ISRWO, PCT/US2016/068495, dated Mar. 30, 2017, 9 pgs.
Energous Corp., IPRP, PCT/US2016/068495, dated Jun. 26, 2018, 7 pgs.
Energous Corp., ISRWO, PCT/US2015/067287, dated Feb. 2, 2016, 8 pgs.
Energous Corp., IPRP, PCT/US2015/067287, dated Jul. 4, 2017, 6 pgs.
Energous Corp., ISRWO, PCT/US2016/068551, dated Mar. 17, 2017, 8 pgs.
Energous Corp., IPRP, PCT/US2016/068551, dated Jun. 26, 2018, 6 pgs.
Energous Corp., ISRWO, PCT/US2016/068498, dated May 17, 2017, 8 pgs.
Energous Corp., IPRP, PCT/US2016/068498, dated Jun. 26, 2018, 6 pgs.
Energous Corp., ISRWO, PCT/US2016/068993, dated Mar. 13, 2017, 12 pgs.
Energous Corp., IPRP, PCT/US2016/068993, dated Jul. 3, 2018, 10 pgs.
Energous Corp., ISRWO, PCT/US2016/068565, dated Mar. 8, 2017, 11 pgs.
Energous Corp., IPRP, PCT/US2016/068565, dated Jun. 26, 2018, 9 pgs.
Energous Corp., ISRWO, PCT/US2016/068987, dated May 8, 2017, 10 pgs.
Energous Corp., IPRP, PCT/US2016/068987, dated Jul. 3, 2018, 7 pgs.
Energous Corp., ISRWO, PCT/US2016/069316 , dated Mar. 16, 2017, 15 pgs.
Energous Corp., IPRP, PCT/US2016/069316 , dated Jul. 3, 2018, 12 pgs.
Energous Corp., ISRWO, PCT/US2018/012806 , dated Mar. 23, 2018, 9 pgs.
Energous Corp., ISRWO, PCT/US2017/046800, dated Sep. 11, 2017, 13 pgs.
Energous Corp., IPRP, PCT/US2017/046800, dated Feb. 12, 2019, 10 pgs.
Energous Corp., ISRWO, PCT/US2017/065886, dated Apr. 6, 2018, 13 pgs.
Energous Corp., ISRWO, PCT/US2018/031768, dated Jul. 3, 2018, 9 pgs.
Energous Corp., ISRWO, PCT/US2018/0351082, dated Dec. 12, 2018, 9 pgs.
Order Granting Reexamination Request Control No. 90013793 Aug. 31, 2016, 23 pgs.
*Ossia Inc.* vs *Energous Corp.*, PGR2016-00023—Institution Decision, Nov. 29, 2016, 29 pgs.
*Ossia Inc.* vs *Energous Corp.*, PGR2016-00024—Institution Decision, Nov. 29, 2016, 50 pgs.
*Ossia Inc.* vs *Energous Corp.*, PGR2016-00024—Judgement-Adverse, Jan. 20, 2017, 3 pgs.
ReExam Ordered Control No. 90013793 Feb. 2, 2017, 8 pgs.
*Ossia Inc.* vs *Energous Corp.*, Declaration of Stephen B. Heppe in Support of Petition for Post-Grant Review of U.S. Pat. No. 9,124,125, PGR2016-00024, May 31, 2016, 122 pgs.
*Ossia Inc.* vs *Energous Corp.*, Petition for Post-Grant Review of U.S. Pat. No. 9,124,125, May 31, 2016, 92 pgs.
*Ossia Inc.* vs *Energous Corp.*, Patent Owner Preliminary Response, Sep. 8, 2016, 95 pgs.
*Ossia Inc.* vs *Energous Corp.*, Petition for Post Grant Review of U.S. Pat. No. 9,124,125, May 31, 2016, 86 pgs.
*Ossia Inc.* vs *Energous Corp.*, Declaration of Stephen B. Heppe in Support of Petition for Post-Grant Review of U.S. Pat. No. 9,124,125, PGR2016-00023, May 31, 2016, 144 pgs.
Supplementary European Search Report, EP Patent Application No. EP14818136-5, dated Jul. 21, 2016, 9 pgs.
European Search Report, EP Patent Application No. EP16189052.0, dated Jan. 31, 2017, 11 pgs.
European Search Report, EP Patent Application No. EP16189319-3, dated Feb. 1, 2017, 9 pgs.
European Search Report, EP Patent Application No. EP14822971, dated Feb. 1, 2017, 9 pgs.

(56) References Cited

OTHER PUBLICATIONS

European Search Report, EP Patent Application No. EP16189987, dated Feb. 1, 2017, 8 pgs.
European Search Report, EP Patent Application No. 16196205.5, dated Mar. 28, 2017, 7 pgs.
European Search Report, EP Patent Application No. 16189300, dated Feb. 28, 2017, 4 pgs.
European Search Report, EP Patent Application No. 16189988.5, dated Mar. 1, 2017, 4 pgs.
European Search Report, EP Patent Application No. 16189982.8, dated Jan. 27, 2017, 9 pgs.
European Search Report, EP Patent Application No. 16189974, dated Mar. 2, 2017, 5 pgs.
European Search Report, EP Patent Application No. 16193743, dated Feb. 2, 2017, 5 pgs.
European Search Report, EP Patent Application No. 14868901.1, dated Jul. 7, 2017, 5 pgs.
European Search Report. EP15876036, dated May 3, 2018, 8 pgs.
Supplemental European Search Report. EP15874273.4, dated May 11, 2018, 7 pgs.
Supplemental European Search Report. EP15876033.0, dated Jun. 13, 2018, 10 pgs.
Supplemental European Search Report. EP15876043.9, dated Aug. 8, 2018, 9 pgs.
Extended European Search Report. EP18204043.6, dated Feb. 14, 2019, 5 pgs.
L.H. Hsieh et al. Development of a Retrodirective Wireless Microwave Power Transmission System, IEEE, 2003 pp. 393-396.
B.D. Van Veen et al., Beamforming: A Versatile Approach to Spatial Filtering, IEEE, ASSP Magazine, Apr. 1988, pp. 4-24.
Leabman, Adaptive Band-partitioning for Interference Cancellation in Communication System, Thesis Massachusetts Institute of Technology, Feb. 1997, pp. 1-70.
Panda, SIW based Slot Array Antenna and Power Management Circuit for Wireless Energy Harvesting Applications, IEEE APSURSI, Jul. 2012, 2 pgs.
Singh, Wireless Power Transfer Using Metamaterial Bonded Microstrip Antenna for Smart Grid WSN: In Fourth International Conference on Advances in Computing and Communications (ICACC), Aug. 27-29, 2014, Abstract 299.
T. Gill et al. "A System for Change Detection and Human Recognition in Voxel Space using the Microsoft Kinect Sensor," 2011 IEEE Applied Imagery Pattern Recognition Workshop. 8 pgs.
J. Han et al. Enhanced Computer Vision with Microsoft Kinect Sensor: A Review, IEEE Transactions on Cybernetics vol. 43, No. 5. pp. 1318-1334, Oct. 3, 2013.
Zhai, "A Practical wireless charging system based on ultra-wideband retro-reflective beamforming" 2010 IEEE Antennas and Propagation Society International Symposium, Toronto, ON 2010, pp. 1-4.
Mao: BeamStar: An Edge-Based Approach to Routing in Wireless Sensors Networks, IEEE Transactions on Mobile Computing, IEEE Service Center, Los Alamitos, CA US, vol. 6, No. 11, Nov. 1, 2007, 13 pgs.
Smolders—Institute of Electrical 1-15 and Electronics Engineers: "Broadband microstrip array antennas" Digest of the Antennas and Propagation Society International Symposium. Seattle, WA Jun. 19-24, 1994. Abstract 3 pgs.
Paolo Nenzi et al; "U-Helix: On-chip short conical antenna", 2013 7th European Conference on Antennas and Propagation (EUCAP), ISBN:978-1-4673-2187-7, IEEE, Apr. 8, 2013, 5 pgs.
Adamiuk G et al; "Compact, Dual-Polarized UWB-Antanna, Embedded in a Dielectric" IEEE Transactions on Antenna and Propagation, IEEE Service Center, Piscataway, NJ, US vol. 56, No. 2, ISSN: 0018-926X, abstract; Figure 1, Feb. 1, 2010, 8 pgs.
Mascarenas et al.; "Experimental Studies of Using Wireless Energy Transmission for Powering Embedded Sensor Nodes." Nov. 28, 2009, Journal of Sound and Vibration, pp. 2421-2433.
Li et al. High-Efficiency Switching-Mode Charger System Design Considerations with Dynamic Power Path Management, Mar./Apr. 2012 Issue, 8 pgs.
Energous Corp., IPRP, PCT/US2018/064289, dated Dec. 29, 2020, 8 pgs.
Energous Corp., IPRP, PCT/US2019/021817, dated Sep. 15, 2020, 7 pgs.
Energous Corp., IPRP, PCT/US2019/039014, dated Dec. 29, 2020, 10 pgs.
Energous Corp., ISRWO, PCT/US2020/015450, dated May 18, 2020, 8 pgs.
Energous Corp., ISRWO, PCT/US2020/027409, dated Jul. 24, 2020, 11 pgs.
Extended European Search Report, EP18797695.6, dated Nov. 19, 2020, 9 pgs.

* cited by examiner

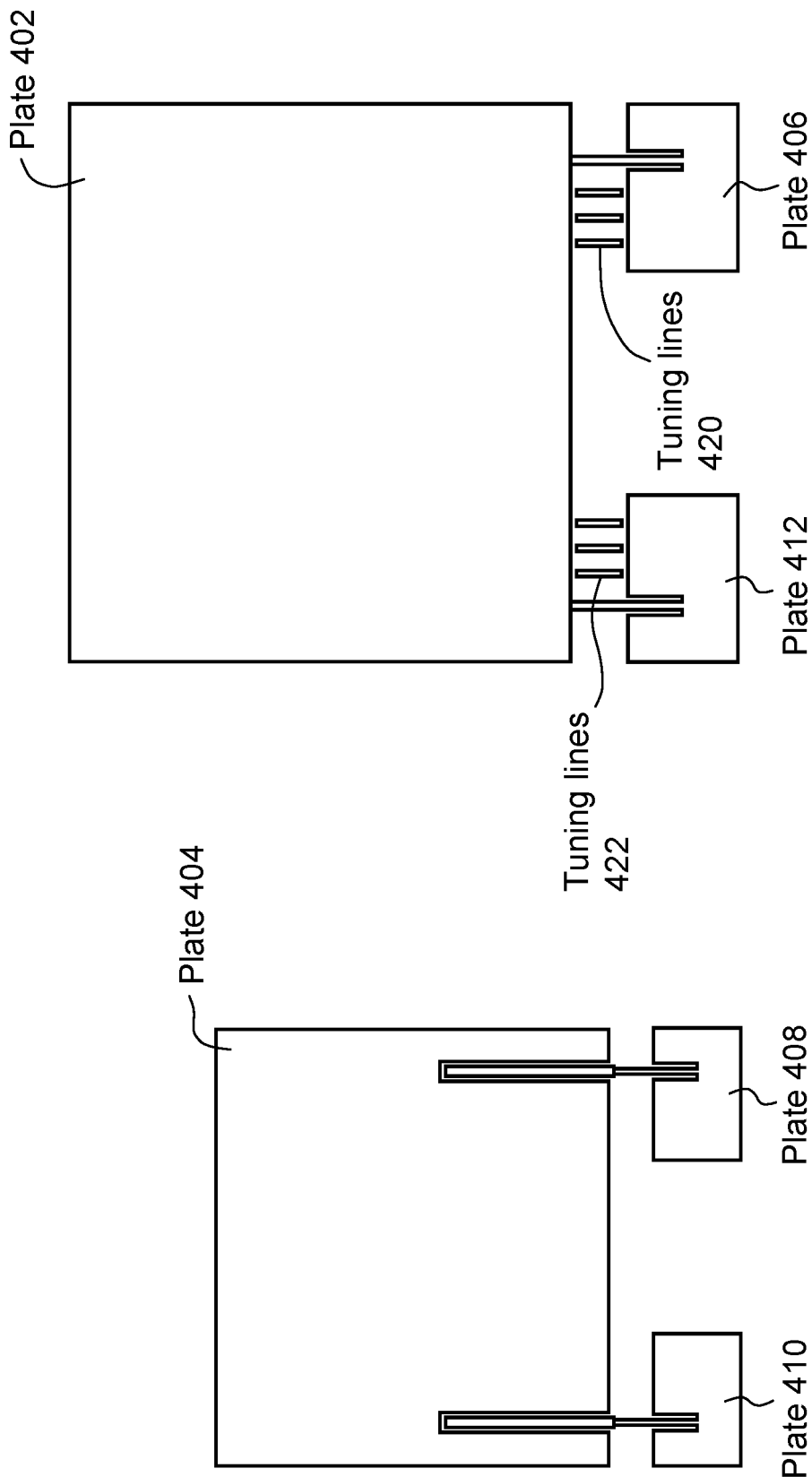

FLAT ANTENNAS HAVING TWO OR MORE RESONANT FREQUENCIES FOR USE IN WIRELESS POWER TRANSMISSION SYSTEMS

RELATED APPLICATION

This application is a non-provisional of U.S. Provisional Patent Application Ser. No. 62/479,219, filed Mar. 30, 2017, which is hereby incorporated by reference in its entirety.

TECHNICAL FIELD

This relates generally to antennas for use in wireless power transmission systems, including but not limited to flat antennas having two or more resonant frequencies for use in wireless power transmission systems.

BACKGROUND

Portable electronic devices, such as laptop computers, mobile phones, tablets, and other electronic devices, require frequent charging of a power-storing component (e.g., a battery) to operate. Many electronic devices require charging one or more times per day. Often, charging an electronic device requires manually connecting an electronic device to an outlet or other power source using a wired charging cable. In some cases, the power-storing component is removed from an electronic device and inserted into charging equipment. Accordingly, charging is time consuming, burdensome, and inefficient because users must carry around multiple charging cables and/or other charging devices, and frequently must locate appropriate power sources to charge their electronic devices. Additionally, conventional charging techniques potentially deprive a user of the ability to use the device while it is charging, and/or require the user to remain next to a wall outlet or other power source to which their electronic device or other charging equipment is connected.

Some other conventional charging systems utilize inductive coils to generate a magnetic field that is used to charge a device. However, such inductive coupling has a limited short range, such as a few inches or less. Users typically must place the device at a specific position on a charging pad and are unable to move the device to different positions on the pad, without interrupting or terminating the charging of the device. This results in a frustrating experience for many users as they may be unable to locate the device at the exact right position on the pad to start charging their device.

Additionally, existing antennas used for transmission of power waves have relatively large cross-sectional areas, such as 6 inches by 6 inches for transmission of power waves at a frequency of 900 MHz. Due to these large cross-sectional areas, integrating these antennas with devices results in noticeable and undesired changes to the aesthetic appearance of the devices, thereby reducing the likelihood that users will be willing to install such devices in their homes or offices.

SUMMARY

Accordingly, there is a need for improved antenna designs that help to address the shortcomings of conventional charging systems described above. In particular, there is a need for antennas that have a form factor that is suitable for integration within devices. The antennas described herein address these shortcomings and have a form factor that is suitable for integration within devices. For example, in some embodiments the antennas have a largest cross-sectional dimension of two inches or less, making integration within devices more feasible, such devices include sound bars (e.g., a sound bar with the novel multi-band antennas described herein integrated within the sound bar), televisions, media entertainment systems, light fixtures, portable air conditioning/heater systems, dashboard and glove compartments in automobiles, devices embedded in seat-backs (e.g., in trains, busses and airplanes), advertisement panels, and other devices without impacting aesthetic appeal of these devices, thereby ensuring that users will be more receptive to installing such transmitter devices in their homes, offices, or other spaces.

In some embodiments, an antenna for use in a wireless charging system is formed with a monopole configured to radiate and/or receive wireless signals. By implementing with a monopole antenna, the dimensions, including length or depth, of the antenna are, in some instances and embodiments, reduced. A reduction in antenna dimensions improves the antenna's versatility, enabling it to be used in space-constrained environments, such as homes or conference rooms. In some embodiments, an antenna unit includes two or more conductive plates where one of the conductive plates includes a monopole antenna. In some embodiments, the conductive plates are positioned on the same plane with respect to each other with a gap between the two conductive plates that forms a capacitor. By adding a capacitance load to the monopole antenna, one or more loop antennas are created (e.g., with the feed line 306 acting as an inductor and a capacitor formed between plates 302, 304 and gap 303, FIG. 3), thereby allowing a single antenna (e.g., antenna 300, FIG. 3) to operate as a dual- or multi-band antenna.

In some embodiments, an apparatus for wirelessly charging and/or powering a device includes a transmitter unit that includes an antenna unit communicatively coupled to a transmitter. In some embodiments, the transmitter unit is configured to transmit a wireless power signal for use in charging and/or powering an electronic device. In some embodiments, the antenna unit includes at least two coplanar conductive plates, such that a capacitor is formed between the plates.

In some embodiments, an apparatus for wirelessly charging and/or powering a device includes a receiver unit that includes an antenna unit communicatively coupled to a receiver. In some embodiments, the receiver unit is configured to receive a wireless signal for use in charging and/or powering an electronic device. In some embodiments, the antenna unit includes at least two coplanar conductive plates, such that a capacitor is formed between the plates.

In some embodiments, a transmitter device for a wireless charging system includes: (1) an antenna component configured to transmit electromagnetic waves toward a wireless power receiver, the antenna component having at least two conductive plates positioned on a same plane and a feed line between the at least two conductive plates, where: (a) one of the at least two conductive plates and the feed line form a monopole antenna configured to transmit electromagnetic waves in a first frequency range, (b) the at least two conductive plates are positioned such that a gap exists between the at least two conductive plates, thereby forming a capacitor, and (c) the at least two conductive plates, the feed line, and the gap capacitor form a capacitance loop antenna configured to transmit electromagnetic waves in a second frequency range; (2) an integrated circuit configured to control operation of the antenna; and (3) a transmission line coupling the antenna to the integrated circuit In some embodiments, an antenna unit includes two or more planar antennas in parallel. For example, the antenna unit includes a first pair of coplanar conductive plates positioned within a first plane such that there is a gap between the two conductive plates that forms first capacitor. In this example, the antenna unit further includes a second pair of coplanar conductive plates positioned within a second plane such that there is a gap between the second pair of two conductive plates that forms a second capacitor. The first pair of conductive plates and the second pair of conductive plates are positioned in parallel (i.e., the first and second planes are parallel) such that there is a gap between at least one conductive plate of the first pair and the second pair that forms a third capacitor.

In some embodiments, an apparatus for wirelessly charging/powering a device includes a transmitter unit having a transmitter and an antenna unit in communication with the transmitter to transmit a wireless signal for use in charging a battery. The apparatus further includes a receiver and an antenna unit in communication with the receiver to receive the wireless signal for use in charging the battery. In some embodiments, the antenna unit includes at least two conductive plates positioned on the same plane as one another such that there is a gap between the two conductive plates that forms a capacitor.

In some embodiments, an apparatus for wirelessly charging a battery includes a receiver unit having a receiver and an antenna unit in communication with the receiver. In some embodiments, the antenna unit includes multiple antenna elements (e.g., 3 dimensional (3D) antenna elements) comprising a monopole configured to receive a wireless signal for use in charging a battery. In some embodiments, the battery comprises a battery of a wearable device, such as wristband or watch.

Example transmitters and receivers that include the antenna 300 are described below.

(A1) In some embodiments, a transmitter device (e.g., transmitter 102) for a wireless charging system includes: (1) an antenna component (e.g., antenna 300) configured to transmit electromagnetic waves toward a wireless power receiver (e.g., receiver 120), the antenna component having at least two conductive plates positioned on a same plane and a feed line between the at least two conductive plates (e.g., plates 302 and 304), where: (a) one of the at least two conductive plates and the feed line form a monopole antenna configured to transmit and/or receive electromagnetic waves in a first frequency range, (b) the at least two conductive plates are positioned such that a gap exists between the at least two conductive plates (e.g., gap 303), thereby forming a capacitor, and (c) the at least two conductive plates, the feed line, and the capacitor form a loop antenna configured to transmit and/or receive electromagnetic waves in a second frequency range; (2) an integrated circuit configured to control operation of the antenna; and (3) a transmission line coupling the antenna to the integrated circuit.

(A2) In some embodiments of the transmitter of A1, the at least two conductive plates each have a distinct geometric or irregular shape. In some embodiments, the at least two conductive plates each have a same geometric or irregular shape. In some embodiments, the antenna component further includes a feed line coupling the at least two conductive plates (e.g., feed line 306). In some embodiments, at least one of the at least two conductive plates (e.g., plate 304) is coupled to an electrical ground. In some embodiments, at least one of the monopole antenna and the loop antenna is tunable to adjust a corresponding transmit frequency (e.g., tunable using tuning lines 310, tuning lines 314, tuning patch 308, and/or tuning patch 312). In some embodiments, the antenna component is mounted on a printed circuit board.

(A3) In some embodiments of the transmitter of any of A1-A2, the first frequency range and the second frequency range are distinct frequency ranges. In some embodiments the first frequency range consists of a first operating frequency (e.g., 900 MHz) and/or the second frequency range consists of a second operating frequency (e.g., 2.4 MHz). In some embodiments, the first frequency range includes a frequency of 900 MHz or a frequency of 5.8 GHz. In some embodiments, the second frequency range includes a frequency of 2.4 GHz.

(A4) In some embodiments of the transmitter of any of A1-A3, the antenna component is configured to concurrently transmit electromagnetic waves in the first frequency range and in the second frequency range. In some embodiments, the antenna component is configured to concurrently transmit electromagnetic waves in the first frequency range and receive electromagnetic waves in the second frequency range. In some embodiments, the monopole antenna and the loop antenna are configured to transmit electromagnetic waves toward the wireless power receiver.

(A5) In some embodiments of the transmitter of any of A1-A4, the antenna component is configured to receive communication signals from the wireless power receiver using at least one of the first frequency range and the second frequency range. In some embodiments, the antenna component is configured to receive the communication signals while the antenna component is transmitting electromagnetic waves. In some embodiments, the communication signals received from the wireless power receiver include information identifying an amount of power received by the wireless power receiver, and the transmitter device adjusts one or more transmission characteristics used to transmit electromagnetic waves to increase an amount of power received by the wireless power receiver. In some embodiments, the transmitter device is configured to receive multiple communications from a receiver device during charging. In some embodiments, the transmitter device is configured to update the transmission characteristics responsive to each of the multiple communications received during charging.

(A6) In some embodiments of the transmitter of any of A1-A5, the antenna component has a two-dimensional structure and does not include vias. In some embodiments, the antenna component is located entirely on a single plane, including means (e.g., a feed line that is coupled with a power amplifier) for providing an RF signal that is then transmitted by the antenna component. In some embodiments, the at least two conductive plates (e.g., plates 302 and 304) are positioned on a same plane and are coupled together on the same plane (e.g., without the use of vias that would extend outside of that same plane).

(A7) In some embodiments of the transmitter of any of A1-A6, the antenna component further includes an additional loop antenna configured to transmit and/or receive in a third frequency range, distinct from the first frequency range and the second frequency range.

(A8) In some embodiments of the transmitter of any of A1-A7, the monopole antenna is configured to transmit communication signals at a frequency of approximately 2.4 GHz and the loop antenna is configured to transmit power transmission signals at a frequency of approximately 900 MHz or 5.8 GHz. In some embodiments, the monopole antenna is configured to transmit power transmission signals and the loop antenna is configured to transmit communication signals.

(B1) In some embodiments, a receiver device for a wireless charging system comprises: (1) an antenna component configured to receive electromagnetic waves from a wireless power transmitter, the antenna component having at least two conductive plates positioned on a same plane and a feed line between the at least two conductive plates, where: (a) one of the at least two conductive plates and the feed line form a monopole antenna configured to transmit electromagnetic waves in a first frequency range, (b) the at least two conductive plates are positioned such that a gap exists between the at least two conductive plates, thereby forming a capacitor, and (c) the at least two conductive plates, the feed line, and the capacitor form a loop antenna configured to transmit electromagnetic waves in a second frequency range; (2) an integrated circuit configured to control operation of the antenna and convert at least a portion of the received electromagnetic waves to an electrical current; and (3) a transmission line coupling the antenna to the integrated circuit. In some embodiments, the receiver device includes components and/or is configured to operate as described above in (A2)-(A8).

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 5A-5B are block diagrams illustrating representative layers of an antenna unit in accordance with some embodiments.

Figure 1:
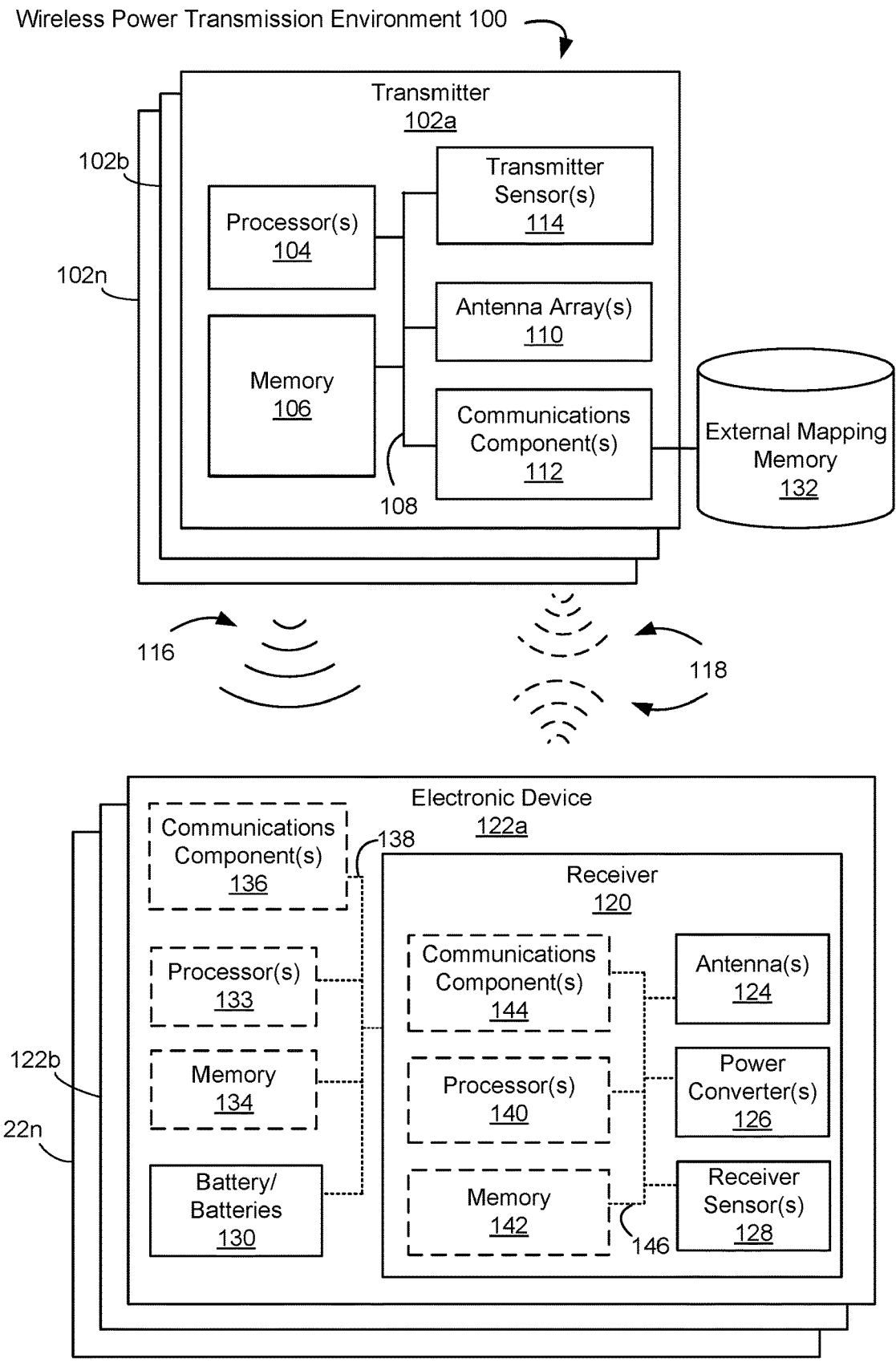
FIG. 1 is a block diagram illustrating a representative wireless power transmission system in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

Flat antennas that are capable of operating at two or more distinct frequencies (also referred to herein as multi-band antennas) are described herein. These antennas address the shortcomings described above in connection with conventional charging systems and antenna designs. In some embodiments, the antennas described herein are components of a transmitter and/or a receiver of a wireless power transmission environment 100 (e.g., as described with regard to FIG. 1). For example, the antennas transmit via RF or other transmission medium waves (hereinafter power waves) and/or receive transmitted power waves.

In some embodiments, one or more transmitters generate power waves to form pockets of energy at target locations and adjust power wave generation based on sensed data to provide safe, reliable, and efficient wirelessly-delivered power to receivers (and devices associated therewith). In some embodiments, a controlled "pocket of energy" (e.g., a region in which available power is high due to constructive interference of power waves) and/or null spaces (e.g., a region in which available power is low or nonexistent due to destructive interference of power waves) are formed by convergence of the power waves transmitted into a transmission field of the one or more transmitters. In some embodiments, the one or more transmitters include an array of the multi-frequency antennas described herein (e.g., in reference to FIGS. 3-5B), and the array of the multi-frequency antennas is used to transmit the power waves. For example, the antennas discussed herein may be integrated with consumer devices (such as the example devices described above) to produce a respective transmitter that remains aesthetically appealing, yet still capable of transmitting power waves sufficient to charge other electronic devices (e.g., cell phones, smart watches, etc.).

In some embodiments, pockets of energy (i.e., energy concentrations) form at one or more locations in a two- or three-dimensional field due to patterns of constructive interference caused by convergence of transmitted power waves. Energy from the transmitted power waves is optionally harvested by receivers (i.e., received and converted into usable power) at the one or more locations.

In some embodiments, adaptive pocket-forming is performed by adjusting power wave transmissions to achieve a target power level for at least some of the power waves transmitted by the one or more transmitters. For example, a system for adaptive pocket-forming includes a sensor. In some embodiments, when the sensor detects an object, or a particular type of object such as a sensitive object (e.g., a person, an animal, equipment sensitive to the power waves, and the like), within a predetermined distance (e.g., a distance within a range of 1-5 feet) of a pocket of energy, of one or more of the power waves, or of a transmitter, then a respective transmitter of the one or more transmitters adjusts one or more characteristics of transmitted power waves. Non-limiting examples of the one or more characteristics include: on/off status, power level, frequency, amplitude, trajectory, phase, and other characteristics used by one or more antennas of the one or more transmitters to transmit the power waves. As an example, in response to receiving information indicating that transmission of power waves by a respective transmitter of the one or more transmitters should be adjusted (e.g., a sensor senses a sensitive object within a predetermined distance of a respective target location), the adaptive pocket-forming process adjusts the one or more characteristics accordingly. As used herein, a sensitive object is an object that is affected, or could potentially be affected, (adversely or otherwise) by the transmitted power waves and/or the pockets of energy.

In some embodiments, adjusting the one or more characteristics includes reducing a currently-generated power level at a location by adjusting one or more transmitted power waves that converge at the target location. In some embodiments, reducing a generated power level includes transmitting a power wave that causes destructive interference with at least one other transmitted power wave at the target location. For example, a power wave is transmitted with a first phase that is shifted relative to a second phase of at least one other power wave to destructively interfere with the at least one other power wave in order to diminish or eliminate the power level at the target location. In some embodiments, reducing a power level at a location includes adjusting transmission of one or more power waves such that constructive interference does not occur at the target location (e.g., the transmitters operate in turns rather than concurrently).

In some embodiments, adjusting the one or more characteristics includes increasing a power level for some of the transmitted power waves to ensure that the receiver receives adequate energy sufficient to quickly charge a power-storing component of an electronic device that is associated with the receiver (e.g., to complete the charging prior to the sensitive object's arrival at the target location).

In some embodiments, an object is "tagged" (e.g., an identifier of the object is stored in memory in association with a flag) to indicate that the detected object is a sensitive object. In some embodiments, a tagged object is identified using a wireless identifier (e.g., an RFID tag). In some embodiments, in response to detection of a particular object within a predetermined distance of a target location, a determination is made as to whether the particular object is a sensitive object. In some embodiments, this determination includes performing a lookup in the memory to check whether the particular object has been previously tagged and is therefore known as a sensitive object. In response to determining that the particular object is a sensitive object, the one or more characteristics used to transmit the power waves are adjusted accordingly.

In some embodiments, sensing an object includes using sensor readings from one or more sensors to determine motion and/or positioning of an object within a transmission field of the one or more transmitters. In some embodiments, sensor output from one or more sensors is used to detect motion of the object approaching within a predetermined distance of a pocket of energy or of power waves used to form the pocket of energy. In some embodiments, in response to a determination that a sensitive object is approaching (e.g., moving toward and/or within a predefined distance of a pocket of energy), the power level at the location of the pocket of energy is reduced. In some embodiments, the one or more sensors include sensors that are internal to the one or more transmitters, the receiver, and/or sensors that are external to the one or more transmitters and the receiver (e.g., sensors within a mobile phone). In some embodiments, the one or more sensors optionally include thermal imaging, optical, radar, and/or other types of sensors capable to detecting objects within a transmission field. In some embodiments, the one or more sensors include positioning sensors such as GPS sensors. In some embodiments, the one or more sensors include one or more sensors remote from the one or more transmitters and the receiver.

Although some embodiments herein include the use of RF-based wave transmission technologies as a primary example, it should be appreciated that the wireless charging techniques that may be employed are not limited to RF-based technologies and transmission techniques. Rather, it should be appreciated that additional or alternative wireless charging techniques may be utilized, including any suitable technology and technique for wirelessly transmitting energy so that a receiver is capable of converting the transmitted energy to electrical power. Such technologies or techniques may transmit various forms of wirelessly transmitted energy including the following non-limiting examples: ultrasound, microwave, laser light, infrared, or other forms of electromagnetic energy.

FIG. 1 is a block diagram illustrating a representative wireless power transmission system 100 in accordance with some embodiments. In accordance with some embodiments, the wireless power transmission system 100 includes transmitters 102 (e.g., transmitters 102a, 102b . . . 102n) and a receiver 120. In some embodiments, the wireless power transmission environment 100 includes multiple receivers 120, each of which is associated with (e.g., coupled to) a respective electronic device 122.

In accordance with some embodiments, the transmitter 102 (e.g., transmitter 102a) includes processor(s) 104, memory 106, one or more antenna array(s) 110, communications component(s) 112, and one or more transmitter sensor(s) 114 interconnected via a communications bus 108. References to these components of transmitters 102 cover embodiments in which one or more than one of each of these components (and combinations thereof) are included.

In some embodiments, a single processor 104 (e.g., processor 104 of transmitter 102a) executes software modules for controlling multiple transmitters 102 (e.g., transmitters 102b . . . 102n). In some embodiments, a single transmitter 102 (e.g., transmitter 102a) includes multiple processors 104 such as one or more transmitter processors (e.g., configured to control transmission of signals 116 by antenna(s) 110), one or more communications component processors (e.g., configured to control communications transmitted by the communications component(s) 112 and/or receive communications via the communications component(s) 112), and/or one or more sensor processors (e.g., configured to control operation of the transmitter sensor(s) 114 and/or receive output from the transmitter sensor(s) 114).

The receiver 120 receives the power signals 116 and/or the communications 118 transmitted by the transmitters 102. In some embodiments, the receiver 120 includes one or more antennas 124 (e.g., an antenna array including multiple antenna elements), a power converter 126, a receiver sensor 128, and/or other components or circuitry (e.g., processor(s) 140, memory 142, and/or communication component(s) 144). References to these components of receiver 120 cover embodiments in which one or more than one of each of these components (and combinations thereof) are included. The receiver 120 converts energy from the received signals 116

(e.g., power waves) into electrical energy to power and/or charge the electronic device 122. For example, the receiver 120 uses the power converter 126 to convert captured energy from the power waves 116 to alternating current (AC) electricity or to direct current (DC) electricity usable to power and/or charge the electronic device 122. Non-limiting examples of the power converter 126 include rectifiers, rectifying circuits, and voltage conditioners, among other suitable circuitry and devices.

In some embodiments, receiver 120 is a standalone device that is detachably coupled to one or more electronic devices 122. For example, electronic device 122 has processor(s) 133 for controlling one or more functions of electronic device 122 and receiver 120 has processor(s) 140 for controlling one or more functions of receiver 120.

In some embodiments, as shown, receiver 120 is a component of electronic device 122. For example, processor(s) 133 controls functions of electronic device 122 and receiver 120.

In some embodiments, electronic device 122 includes processor(s) 133, memory 134, communication component(s) 136, and/or battery/batteries 130. In some embodiments, these components are interconnected by way of a communications bus 138. In some embodiments, communications between electronic device 122 and receiver 120 occur via communications component(s) 136 and/or 144. In some embodiments, communications between electronic device 122 and receiver 120 occur via a wired connection between communications bus 138 and communications bus 146. In some embodiments, electronic device 122 and receiver 120 share a single communications bus.

In some embodiments, the receiver 120 receives one or more power waves 116 directly from the transmitter 102. In some embodiments, the receiver 120 harvests energy from one or more pockets of energy created by one or more power waves 116 transmitted by the transmitter 102.

In some embodiments, after the power waves 116 are received and/or energy is harvested from a pocket of energy, circuitry (e.g., integrated circuits, amplifiers, rectifiers, and/or voltage conditioner) of the receiver 120 converts the energy of the power waves (e.g., radio frequency electromagnetic radiation) to a suitable form (e.g., electricity) for powering the electronic device 122 and/or storage in a battery 130 of the electronic device 122. In some embodiments, a rectifying circuit of the receiver 120 translates the electrical energy from AC to DC for use by the electronic device 122. In some embodiments, a voltage conditioning circuit increases or decreases the voltage of the electrical energy as required by the electronic device 122. In some embodiments, an electrical relay conveys electrical energy from the receiver 120 to the electronic device 122.

In some embodiments, the receiver 120 is a component of the electronic device 122. In some embodiments, a receiver 120 is coupled (e.g., detachably coupled) to the electronic device 122. In some embodiments, the electronic device 122 is a peripheral device of receiver 120. In some embodiments, the electronic device 122 obtains power from multiple transmitters 102. In some embodiments, the electronic device 122 using (e.g., is coupled to) multiple receivers 120. In some embodiments, the wireless power transmission system 100 includes a plurality of electronic devices 122, each having at least one respective receiver 120 that is used to harvest power waves from the transmitters 102 and provide usable power for charging/powering the electronic devices 122.

In some embodiments, the one or more transmitters 102 adjust one or more characteristics (e.g., phase, gain, direction, and/or frequency) of power waves 116. For example, a particular transmitter 102 (e.g., transmitter 102a) selects a subset of one or more antenna elements of antenna(s) 110 to initiate transmission of the power waves 116, cease transmission of the power waves 116, and/or adjust one or more characteristics used to transmit the power waves 116. In some embodiments, the one or more transmitters 102 adjust the power waves 116 such that trajectories of the power waves 116 converge at a predetermined location within a transmission field (e.g., a location or region in space), resulting in controlled constructive or destructive interference patterns.

In some embodiments, respective antenna array(s) 110 of the one or more transmitters 102 optionally include a set of one or more antennas configured to transmit the power waves 116 into respective transmission fields of the one or more transmitters 102. In some embodiments, integrated circuits (not shown) of the respective transmitter 102, such as a controller circuit and/or waveform generator, control the behavior of the antenna(s). For example, based on the information received from the receiver 120 via the communications signal 118, a controller circuit determines a set of one or more characteristics or waveform characteristics (e.g., amplitude, frequency, trajectory, phase, among other characteristics) used for transmitting power waves that effectively provide power to the receiver 120. In some embodiments, the controller circuit identifies a subset of antennas from the antenna(s) 110 that would be effective in transmitting the power waves 116. As another example, a waveform generator circuit of the respective transmitter 102 (e.g., coupled to the processor 104) converts energy and generates the power waves 116 having the waveform characteristics identified by the controller, and then provides the power waves to the antenna array(s) 110 for transmission.

In some instances, constructive interference of power waves occurs when two or more power waves 116 are in phase with each other and converge into a combined wave such that an amplitude of the combined wave is greater than amplitude of a single one of the power waves. For example the positive and negative peaks of sinusoidal waveforms arriving at a location from multiple antennas "add together" to create larger positive and negative peaks. In some instances and embodiments, a pocket of energy is formed at a location in a transmission field where constructive interference of power waves occurs.

In some instances, destructive interference of power waves occurs when two or more power waves are out of phase and converge into a combined wave such that the amplitude of the combined wave is less than the amplitude of a single one of the power waves. For example, the power waves "cancel each other out," thereby diminishing the amount of energy concentrated at a location in the transmission field. In some embodiments, destructive interference is used to generate a negligible amount of energy or "null" at a location within the transmission field where the power waves converge.

In some embodiments, the one or more transmitters 102 transmit power waves 116 that create two or more discrete transmission fields (e.g., overlapping and/or non-overlapping discrete transmission fields). In some embodiments, a first transmission field is managed by a first processor 104 of a first transmitter (e.g. transmitter 102a) and a second transmission field is managed by a second processor 104 of a second transmitter (e.g., transmitter 102b). In some embodiments, the two or more discrete transmission fields (e.g., overlapping and/or non-overlapping) are managed by the transmitter processors 104 as a single transmission field.

In some embodiments, the communications component(s) 112 transmit communication signals 118 via a wired and/or wireless communication connection to receiver 120. In some embodiments, the communications component 112 generates communications signals 118 to determine positioning of the receiver 120 (e.g., via triangulation). In some embodiments, the communication signals 118 are used to convey information between the transmitter 102 and the receiver 120. In some embodiments, the conveyed information is used for adjusting one or more characteristics used to transmit the power waves 116. In some embodiments, the communications signals 118 relay information related to device status, efficiency, user data, power consumption, billing, geo-location, and/or other types of information.

In some embodiments, the receiver 120 includes a transmitter (not shown), or is a part of a transceiver, that transmits communications signals 118 to communications component 112 of transmitter 102.

In some embodiments, the communications component 112 (e.g., communications component 112 of transmitter 102a) includes a communications component antenna for communicating with the receiver 120, other transmitters 102 (e.g., transmitters 102b through 102n), and/or other remote devices. In some embodiments, these communications signals 118 represent a distinct channel of signals transmitted by transmitter 102, independent from a channel of signals used for transmission of the power waves 116.

In some embodiments, the receiver 120 includes a receiver-side communications component (not shown) configured to communicate various types of data with one or more of the transmitters 102, through a respective communications signal 118 generated by the receiver-side communications component. The data optionally includes location indicators for the receiver 120 and/or the electronic device 122, a power status of the device 122, status information for the receiver 120, status information for the electronic device 122, status information regarding the power waves 116, and/or status information for pocket(s) of energy. In some embodiments, the receiver 120 provides data to the transmitter 101, via the communications signal 118, regarding the current operation of the system 100, including one or more of: information identifying a present location of the receiver 120 or the device 122, an amount of energy received by the receiver 120, and an amount of power received and/or used by the electronic device 122, among other possible types of information.

In some embodiments, the data contained within communications signals 118 is used by electronic device 122, receiver 120, and/or transmitters 102 for determining adjustments of the one or more characteristics used by the antenna(s) 110 to transmit the power waves 106. For example, using a communications signal 118, the transmitter 102 communicates data that is used to identify the receiver(s) 120 within a transmission field, identify the electronic device(s) 122, determine safe and effective waveform characteristics for power waves, and/or hone the placement of pockets of energy. In some embodiments, the receiver 120 uses a communications signal 118 to communicate data for alerting transmitters 102 that the receiver 120 has entered or is about to enter a transmission field, provide information about electronic device 122, provide user information that corresponds to electronic device 122, indicate the effectiveness of received power waves 116, and/or provide updated characteristics or transmission parameters that the one or more transmitters 102 use to adjust transmission of the power waves 116.

As an example, the communications component 112 of the transmitter 102 communicates (e.g., transmits and/or receives) one or more types of data (such as authentication data and/or transmission parameters) including various information such as a beacon message, a transmitter identifier, a device identifier for an electronic device 122, a user identifier, a charge level for the electronic device 122, a location of receiver 120 in a transmission field, and/or a location of the electronic device 122 in a transmission field.

In some embodiments, the transmitter sensor 114 and/or the receiver sensor 128 detect and/or identify conditions of the electronic device 122, the receiver 120, the transmitter 102, and/or a transmission field. In some embodiments, data generated by the transmitter sensor 114 and/or the receiver sensor 128 is used by the transmitter 102 to determine appropriate adjustments to the one or more characteristics used to transmit the power waves 106. In some embodiments, data from the transmitter sensor 114 and/or the receiver sensor 128 received by transmitter 102 includes raw sensor data and/or sensor data processed by a processor, such as a sensor processor. In some embodiments, the processed sensor data includes determinations based upon sensor data output. In some embodiments, sensor data is received from sensors that are external to the receiver 120 and the transmitters 102 (such as thermal imaging data, information from optical sensors, and others).

In some embodiments, the receiver sensor(s) 128 include a gyroscope that provides raw data such as orientation data (e.g., tri-axial orientation data). In some embodiments, processing this raw data includes determining a location of receiver 120 and/or a location of receiver antenna 124 using the orientation data.

In some embodiments, the receiver sensor(s) 128 include one or more infrared sensors (e.g., that output thermal imaging information), and processing this infrared sensor data includes identifying a person (e.g., indicating presence of the person and/or indicating an identification of the person) or other sensitive object based upon the thermal imaging information.

In some embodiments, the receiver sensor(s) 128 includes a gyroscope and/or an accelerometer that indicates an orientation of the receiver 120 and/or the electronic device 122. As an example, transmitter(s) 102 receive orientation information from the receiver sensor 128 and the transmitter(s) 102 (or a component thereof, such as the processor 104) uses the received orientation information to determine whether the electronic device 122 is flat on a table, in motion, and/or in use (e.g., near to a user's ear).

In some embodiments, the receiver sensor 128 is a sensor of the electronic device 122 (e.g., an electronic device 122 that is remote from receiver 120). In some embodiments, the receiver 120 and/or the electronic device 122 includes a communication system for transmitting signals (e.g., sensor signals output by the receiver sensor 128) to the transmitter 102.

Non-limiting examples of transmitter sensor 114 and/or receiver sensor 128 include infrared/pyro-electric sensors, ultrasonic sensors, laser sensors, optical sensors, Doppler sensors, gyro sensors, accelerometers, microwave sensors, millimeter sensors, RF standing-wave sensors, resonant LC sensors, capacitive sensors, and/or inductive sensors. In some embodiments, technologies for the transmitter sensor 114 and/or the receiver sensor 128 include binary sensors that acquire stereoscopic sensor data, such as the location of a human or other sensitive object.

In some embodiments, the transmitter sensor 114 and/or the receiver sensor 128 is configured for human recognition (e.g., is capable of distinguishing between a person and other objects, such as furniture) and/or human identification (e.g., is capable of distinguishing between two persons). Examples of sensor data output by human recognition-enabled sensors include: body temperature data, infrared range-finder data, motion data, activity recognition data, silhouette detection and recognition data, gesture data, heart rate data, portable devices data, and wearable device data (e.g., biometric readings and output, accelerometer data).

In some embodiments, the transmitters 102 adjust one or more characteristics used to transmit the power waves 116 to ensure compliance with electromagnetic field (EMF) exposure protection standards for human subjects. Maximum exposure limits are defined by US and European standards in terms of power density limits and electric field limits (as well as magnetic field limits). These include, for example, limits established by the Federal Communications Commission (FCC) for MPE, and limits established by European regulators for radiation exposure. Limits established by the FCC for MPE are codified at 47 CFR § 1.1310. For electromagnetic field (EMF) frequencies in the microwave range, power density can be used to express an intensity of exposure. Power density is defined as power per unit area. For example, power density can be commonly expressed in terms of watts per square meter ($W/m^2$), milliwatts per square centimeter ($mW/cm^2$), or microwatts per square centimeter ($\mu W/cm^2$). In some embodiments, output from transmitter sensor 114 and/or receiver sensor 128 is used by transmitter 102 to detect whether a person or other sensitive object enters a power transmission region (e.g., a location within a predetermined distance of a transmitter 102, power waves generated by transmitter 102, and/or a pocket of energy). In some embodiments, in response to detecting that a person or other sensitive object has entered the power transmission region, the transmitter 102 adjusts one or more power waves 116 (e.g., by ceasing power wave transmission, reducing power wave transmission, and/or adjusting the one or more characteristics of the power waves). In some embodiments, in response to detecting that a person or other sensitive object has entered the power transmission region, the transmitter 102 activates an alarm (e.g., by transmitting a signal to a loudspeaker that is a component of transmitter 102 or to an alarm device that is remote from transmitter 102). In some embodiments, in response to detecting that a person or other sensitive object has entered a power transmission region, the transmitter 102 transmits a digital message to a system log or administrative computing device.

In some embodiments, the antenna array(s) 110 includes multiple antenna elements (e.g., configurable "tiles") collectively forming an antenna array. In various embodiments, the antenna(s) 110 generate RF power waves, ultrasonic power waves, infrared power waves, and/or magnetic resonance power waves. In some embodiments, the antenna(s) 110 (e.g., of a single transmitter, such as transmitter 102a, and/or of multiple transmitters, such as transmitters 102a, 102b, . . . , 102n) transmit two or more power waves that intersect at a defined location (e.g., a location corresponding to a detected location of a receiver 120), thereby forming a pocket of energy at the defined location.

In some embodiments, transmitter 102 assigns a first task to a first subset of antenna elements of antenna(s) 110, a second task to a second subset of antenna elements of antenna(s) 110, and so on, such that the constituent antennas of antenna(s) 110 perform different tasks (e.g., determining locations of previously undetected receivers 120 and/or transmitting power waves 116 to one or more receivers 120). As one example, the antenna(s) 110 includes ten antennas, nine antennas transmit power waves 116 that form a pocket of energy and the tenth antenna operates in conjunction with communications component 112 to identify new receivers in the transmission field. In another example, the antenna(s) 110 includes ten antenna elements is split into two groups of five antenna elements, each of which transmits power waves 116 to two different receivers 120 in the transmission field.

In some embodiments, a device for wirelessly charging a battery includes a transmitter unit having a transmitter and an antenna unit comprising the antenna array in communication with the transmitter. In some embodiments, the antenna unit is configured to transmit a wireless signal for use in charging a battery. The battery may be in a wearable device such as a smart watch, or a mobile device such as a smart phone. In some embodiments, the wireless signal is used for operating an electronic device. In some embodiments, the antenna unit is configured as a linear array. In some embodiments, the linear array is longer than 2 feet. In some embodiments, the linear array is formed from multiple linear subarrays with spaces between the multiple linear subarrays. The antenna unit comprising the array of antennas may be configured as a matrix. In some embodiments, the antenna elements are regularly spaced. In some embodiments, the antenna elements are variably or irregularly spaced. In some embodiments, the antenna elements are grouped into sub-arrays, and the sub-arrays are selectable for transmitting wireless power signals by the selected sub-arrays. In some embodiments, the antenna elements are individually selectable. In some embodiments, a processing unit (e.g., processor(s) 104) is configured to cause a transmitter to generate and transmit a wireless transmission signal via the antenna element(s).

Figure 2A:
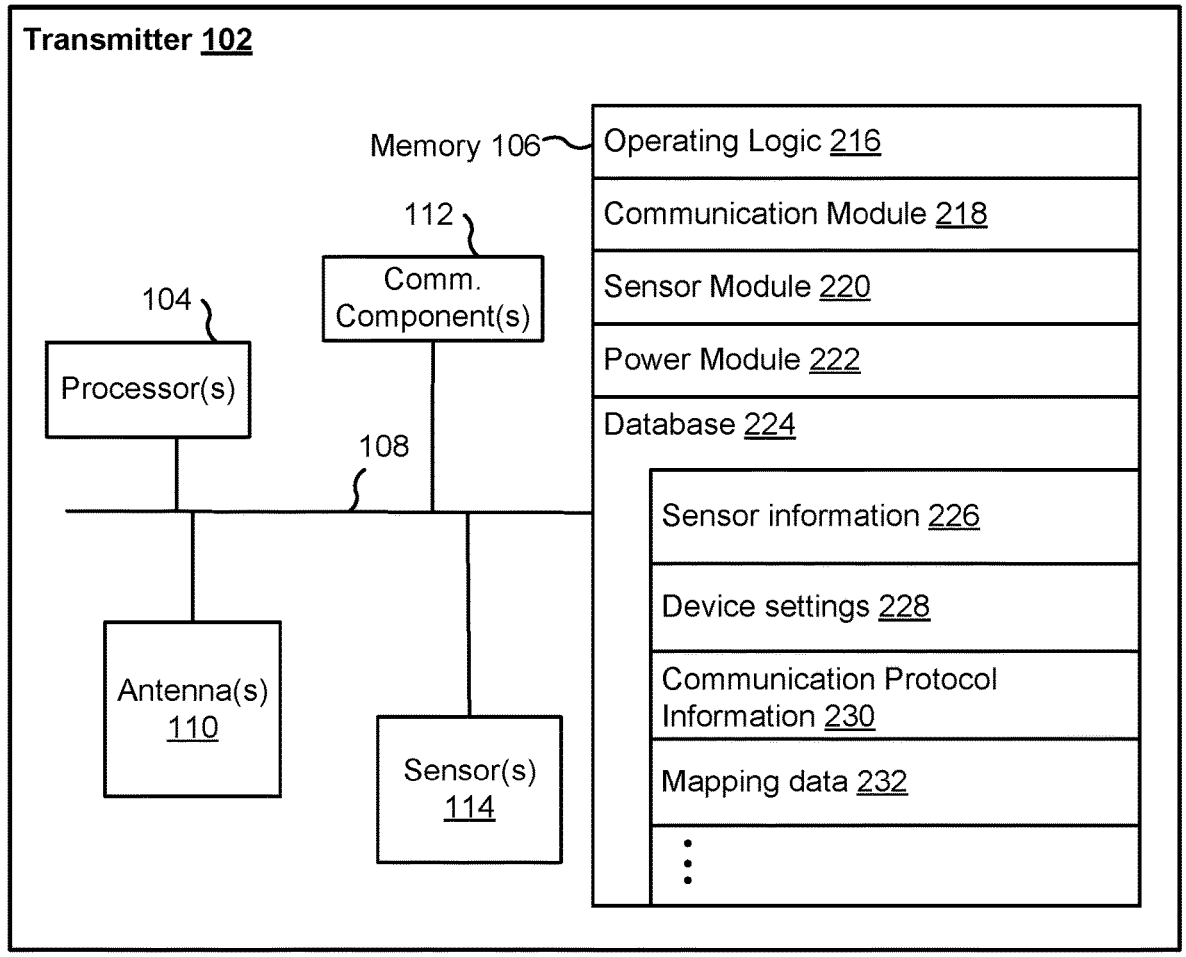
FIG. 2A is a block diagram illustrating a representative transmitter device in accordance with some embodiments.

FIG. 2A is a block diagram illustrating a representative transmitter device 102 (also sometimes referred to herein as a transmitter) in accordance with some embodiments. In some embodiments, the transmitter device 102 includes one or more processing units (e.g., CPUs, ASICs, FPGAs, microprocessors, and the like) 104, one or more communication components 112, memory 106, antenna(s) 110, and one or more communication buses 108 for interconnecting these components (sometimes called a chipset). In some embodiments, the transmitter device 102 includes one or more sensor(s) 114 as described above with reference to FIG. 1. In some embodiments, the transmitter device 102 includes one or more output devices such as one or more indicator lights, a sound card, a speaker, a small display for displaying textual information and error codes, etc. In some embodiments, the transmitter device 102 includes a location detection device, such as a GPS (global positioning satellite) or other geo-location receiver, for determining the location of the transmitter device 102. In some embodiments, the antenna(s) 110 include one or more multi-band antennas (such as those described below in reference to FIGS. 3-5B).

In various embodiments, the one or more sensor(s) 114 include one or more thermal radiation sensors, ambient temperature sensors, humidity sensors, IR sensors, occupancy sensors (e.g., RFID sensors), ambient light sensors, motion detectors, accelerometers, and/or gyroscopes.

The communication component(s) 112 enable communication between the transmitter 102 and one or more communication networks. In some embodiments, the communication component(s) 112 include, e.g., hardware capable of data communications using any of a variety of wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) wired protocols (e.g., Ethernet, HomePlug, etc.), and/or any other suitable communication protocol, including communication protocols not yet developed as of the filing date of this document.

The memory 106 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 106, or alternatively the non-volatile memory within memory 106, includes a non-transitory computer-readable storage medium. In some embodiments, the memory 106, or the non-transitory computer-readable storage medium of the memory 106, stores the following programs, modules, and data structures, or a subset or superset thereof:

- Operating logic 216 including procedures for handling various basic system services and for performing hardware dependent tasks;
- Communication module 218 for coupling to and/or communicating with remote devices (e.g., remote sensors, transmitters, receivers, servers, mapping memories, etc.) in conjunction with communication component(s) 112;
- Sensor module 220 for obtaining and processing sensor data (e.g., in conjunction with sensor(s) 114) to, for example, determine the presence, velocity, and/or positioning of object in the vicinity of the transmitter 102;
- Power-wave generating module 222 for generating and transmitting (e.g., in conjunction with antenna(s) 110) power waves, including but not limited to, forming pocket(s) of energy at given locations; and
- Database 224, including but not limited to:
  - Sensor information 226 for storing and managing data received, detected, and/or transmitted by one or more sensors (e.g., sensors 114 and/or one or more remote sensors);
  - Device settings 228 for storing operational settings for the transmitter 102 and/or one or more remote devices;
  - Communication protocol information 230 for storing and managing protocol information for one or more protocols (e.g., custom or standard wireless protocols, such as ZigBee, Z-Wave, etc., and/or custom or standard wired protocols, such as Ethernet); and
  - Mapping data 232 for storing and managing mapping data (e.g., mapping one or more transmission fields).

Each of the above-identified elements (e.g., modules stored in memory 106 of the transmitter 102) are optionally stored in one or more of the previously mentioned memory devices, and corresponds to a set of instructions for performing the function(s) described above. The above identified modules or programs (e.g., sets of instructions) need not be implemented as separate software programs, procedures, or modules, and thus various subsets of these modules are optionally combined or otherwise rearranged in various embodiments. In some embodiments, the memory 106, optionally, stores a subset of the modules and data structures identified above. Furthermore, the memory 106, optionally, stores additional modules and data structures not described above, such as a tracking module for tracking the movement and positioning of objects within a transmission field.

In some instances and embodiments, the transmitter(s) 102 are positioned in households and commercial settings, such as conference rooms, where it is necessary and/or preferable that the transmitter(s) 102 are sized in a manner that results in a small footprint and/or profile. Although the size of the footprint (e.g., width of overall antenna arrays) in some embodiments has to have a certain length for creating the energy pockets at various distances, the profiles (e.g., length of the antenna elements along the z-axis, which defines the distance that the transmitters 102 extend from a wall) is optionally reduced to be more viable for use by consumers and businesses.

Figure 2B:
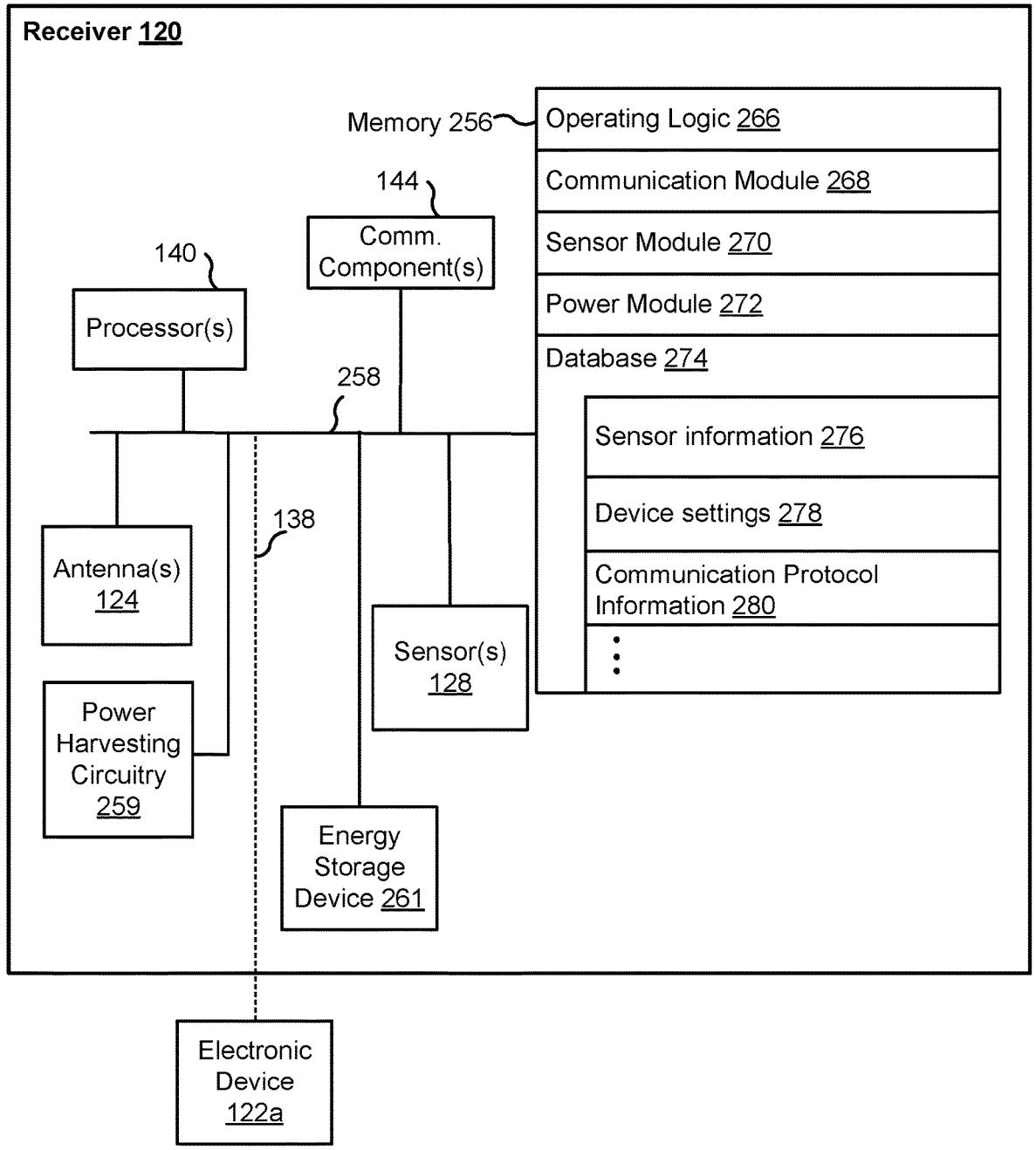
FIG. 2B is a block diagram illustrating a representative receiver device in accordance with some embodiments.

FIG. 2B is a block diagram illustrating a representative receiver device 120 (also sometimes called a receiver) in accordance with some embodiments. In some embodiments, the receiver device 120 includes one or more processing units (e.g., CPUs, ASICs, FPGAs, microprocessors, and the like) 140, one or more communication components 144, memory 256, antenna(s) 124, power harvesting circuitry 259, and one or more communication buses 258 for interconnecting these components (sometimes called a chipset). In some embodiments, the receiver device 120 includes one or more sensor(s) 128 such as one or sensors described above with reference to FIG. 1. In some embodiments, the receiver device 120 includes an energy storage device 261 for storing energy harvested via the power harvesting circuitry 259. In various embodiments, the energy storage device 261 includes one or more batteries (e.g., battery 130, FIG. 1), one or more capacitors, one or more inductors, and the like.

As described above in reference to FIG. 1, in some embodiments, the receiver 120 is internally or externally connected to an electronic device (e.g., electronic device 122a, FIG. 1) via a connection (e.g., a bus) 138.

In some embodiments, the power harvesting circuitry 259 includes one or more rectifying circuits and/or one or more power converters. In some embodiments, the power harvesting circuitry 259 includes one or more components (e.g., a power converter 126) configured to convert energy from power waves and/or energy pockets to electrical energy (e.g., electricity). In some embodiments, the power harvesting circuitry 259 is further configured to supply power to a coupled electronic device (e.g., an electronic device 122), such as a laptop or phone. In some embodiments, supplying power to a coupled electronic device include translating electrical energy from an AC form to a DC form (e.g., usable by the electronic device 122). In some embodiments, the antenna(s) 124 include one or more multi-band antennas (such as those described below in reference to FIGS. 3-5B).

In some embodiments, the receiver device 120 includes one or more output devices such as one or more indicator lights, a sound card, a speaker, a small display for displaying textual information and error codes, etc. (in some embodiments, the receiver device 120 sends information for display at an output device of an associated electronic device). In some embodiments, the receiver device 120 includes a location detection device, such as a GPS (global positioning satellite) or other geo-location receiver, for determining the location of the receiver device 120.

In various embodiments, the one or more sensor(s) 128 include one or more thermal radiation sensors, ambient temperature sensors, humidity sensors, IR sensors, occupancy sensors (e.g., RFID sensors), ambient light sensors, motion detectors, accelerometers, and/or gyroscopes.

The communication component(s) 144 enable communication between the receiver 120 and one or more communication networks. In some embodiments, the communication component(s) 144 include, e.g., hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) custom or standard wired protocols (e.g., Ethernet, HomePlug, etc.), and/or any other suitable communication protocol, including communication protocols not yet developed as of the filing date of this document.

The memory 256 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 256, or alternatively the non-volatile memory within memory 256, includes a non-transitory computer-readable storage medium. In some embodiments, the memory 256, or the non-transitory computer-readable storage medium of the memory 256, stores the following programs, modules, and data structures, or a subset or superset thereof:

Operating logic 266 including procedures for handling various basic system services and for performing hardware dependent tasks;

Communication module 268 for coupling to and/or communicating with remote devices (e.g., remote sensors, transmitters, receivers, servers, mapping memories, etc.) in conjunction with communication component(s) 144;

Sensor module 270 for obtaining and processing sensor data (e.g., in conjunction with sensor(s) 128) to, for example, determine the presence, velocity, and/or positioning of the receiver 120, a transmitter 102, or an object in the vicinity of the receiver 120;

Wireless power-receiving module 272 for receiving (e.g., in conjunction with antenna(s) 124 and/or power harvesting circuitry 259) energy from power waves and/or energy pockets; optionally converting (e.g., in conjunction with power harvesting circuitry 259) the energy (e.g., to direct current); transferring the energy to a coupled electronic device (e.g., an electronic device 122); and optionally storing the energy (e.g., in conjunction with energy storage device 261); and Database 274, including but not limited to:
Sensor information 276 for storing and managing data received, detected, and/or transmitted by one or more sensors (e.g., sensors 128 and/or one or more remote sensors);
Device settings 278 for storing operational settings for the receiver 120, a coupled electronic device (e.g., an electronic device 122), and/or one or more remote devices; and
Communication protocol information 280 for storing and managing protocol information for one or more protocols (e.g., custom or standard wireless protocols, such as ZigBee, Z-Wave, etc., and/or custom or standard wired protocols, such as Ethernet).

Each of the above identified elements (e.g., modules stored in memory 256 of the receiver 120) are optionally stored in one or more of the previously mentioned memory devices, and corresponds to a set of instructions for performing the function(s) described above. The above identified modules or programs (e.g., sets of instructions) need not be implemented as separate software programs, procedures, or modules, and thus various subsets of these modules are optionally combined or otherwise rearranged in various embodiments. In some embodiments, the memory 256, optionally, stores a subset of the modules and data structures identified above. Furthermore, the memory 256, optionally, stores additional modules and data structures not described above, such as an identifying module for identifying a device type of a connected device (e.g., a device type for an electronic device 122).

In some embodiments, the antennas (e.g., antenna(s) 110 and/or antenna(s) 124) have orientations that cause the wireless power signals 116 to be transmitted at different polarizations depending on an orientation of the electronic device with respect to the antennas. For example, in accordance with some embodiments, the receiver 120 includes a monopole or a dipole antenna so that orientation of the receiver 120 with respect to the antenna(s) 110 has minimal impact on the amount of power that is received from the wireless power signals 116.

Figure 3:
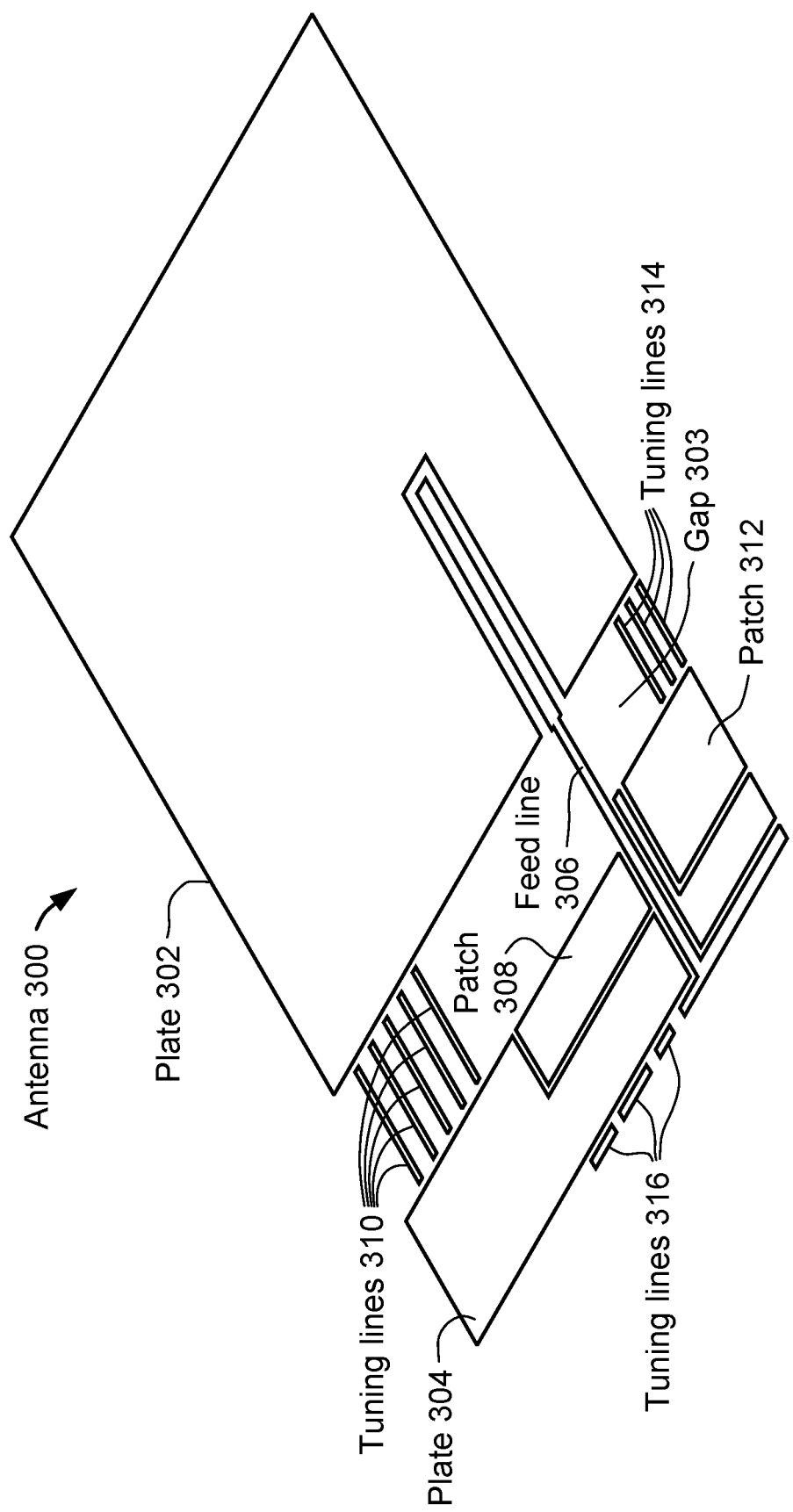
FIG. 3 is a block diagram illustrating a perspective view of a representative antenna in accordance with some embodiments.

Turning now to FIG. 3, a block diagram illustrating a perspective view of a representative antenna 300 is shown, in accordance with some embodiments. In some embodiments, the antenna 300 includes a first plate 302 and a second plate 304 (e.g., each of the plates 302, 304 is a conductive plate). In accordance with some embodiments, the plate 304 comprises a monopole antenna and the plate 302 comprises a patch antenna. FIG. 3 further shows a feed line 306 (also sometimes called a monopole arm) coupling the plates 302 and 304. A monopole antenna is a type of antenna that includes a conductive surface coupled to a feed line. Monopole antennas are resonant antennas where the feed line operates as an open resonator (e.g., oscillating with standing waves along its length). Thus, the frequency of operation of the monopole antenna is based on the length of the feed line. A patch antenna includes a conductive surface (e.g., a flat rectangular sheet of metal) and a ground plane. The conductive surface and ground plane form a resonant transmission line where the frequency of operation is based on the length of the conductive surface. In accordance with some embodiments, the plate 302 and the plate 304 are positioned on a same plane with a gap 303 between them that forms a capacitor.

In some embodiments, a first antenna component (e.g., a monopole antenna component, such as the plate 302 of FIG. 3) is configured to transmit and/or receive at a first frequency and a second antenna component (e.g., a loop antenna component, such as that shown in FIG. 3 as formed by the plates 302, 304 and the gap 303 there between) is configured to transmit and/or receive at a second frequency. For example, in accordance with some embodiments, the first antenna component is configured to transmit and/or receive power waves at a first frequency (e.g., 900 MHz) and the second antenna component is configured to wirelessly communicate with one or more remote electronic devices via a second frequency (e.g., 2.4 GHz).

In some embodiments, the size of the gap 303 is selected to achieve a frequency range and/or directivity at which the antenna 300 is adapted to operate. A capacitance value of the capacitor (that is formed by positioning the plates 302, 304 on a same plane with a gap 303 there between) is optionally tuned by varying the size of the gap 303 between the two conductive plates 302, 304. In some embodiments, the plates 302 and 304 and the gap 303 form a loop antenna, where the frequency of operation of the loop antenna is based on the capacitance value of the capacitor.

In some embodiments, the antenna 300 also includes tuning lines 310 and 314 (also sometimes called tuning tabs) and tuning patches 308 and 312 for tuning operation of the antenna 300 (e.g., for adjusting operating frequencies of the antenna 300). By adding a capacitance load via the gap to the monopole antenna, one or more loop antennas are created (e.g., with the feed line 306 acting as an inductor and a capacitor formed between plates 302, 304 and gap 303), thereby allowing the antenna 300 to operate as a dual-band or multi-band antenna with the monopole antenna operating at a first frequency and the loop antenna(s) operating at a second frequency. For example, the antenna 300 is configured to operate at more than one frequency in a range from 900 MHz to 100 GHz with bandwidths suitable for operation (e.g., 200 MHz to 5 GHz bandwidths). In some embodiments, the tuning lines (e.g., tuning lines 316, 310, and/or 314) and the tuning patches (e.g., tuning patch 308 and/or tuning patch 312) are adapted to enable tuning of plus/minus 20% of a desired frequency. For example, if the desired frequency is 900 MHz, the tuning lines and/or the tuning patches of the antenna 300 are adapted to enable tuning of an operating frequency of the antenna 300 by plus/minus 180 MHz.

In the illustrated example of FIG. 3, the plate 304 forms a monopole component along with feed line 306. The feed line 306 couples the monopole component 304 with the conductive plate 302. As is also shown in the illustrated example of FIG. 3, the conductive plate 302 is a patch component. In some embodiments, the monopole antenna 304 and the patch antenna 302 are made of copper or a copper alloy. In other embodiments, the antenna 300 (and its constituent components) may be constructed from other materials such as metals, alloys, composites, or any suitable material.

In some embodiments, the first antenna component is configured to transmit and/or receive using a first frequency range and a second antenna component is configured to transmit and/or receive using a second frequency range. For example, in accordance with some embodiments, the first antenna component is configured to wirelessly communicate with one or more remote electronic devices via electromagnetic waves with a first frequency that is within a first preset frequency range to enable use of frequency modulation (e.g., the first frequency is 2.4 GHz plus/minus 1%, 5%, 10%, or the like). In such embodiments, the second antenna component is optionally configured to transmit and/or receive power waves with a second frequency that is within a second preset frequency range to enable use of frequency modulation (e.g., the second frequency range of 900 MHz plus/minus 1%, 5%, 10%, or the like). Thus, the antenna may concurrently operate in two frequency ranges and may encode information in the transmissions through the use of frequency modulation.

In some embodiments, the first antenna component and the second antenna component are configured to transmit and/or receive concurrently. For example, in accordance with some embodiments, the antenna 300 is part of a wireless power transmitter (e.g., transmitter 102a, FIG. 1) and the first antenna component is configured to communicate with a remote receiver (e.g., receiver 120, FIG. 1) while the second antenna component is configured to direct power waves (e.g., power waves 116) to the remote receiver. In some embodiments, the first antenna component receives feedback information from the remote receiver. In some embodiments, the feedback information includes information regarding power received by the remote receiver. For example, the feedback information identifies an amount of power received by the remote receiver at any given time. As another example, the antenna 300 communicates with a first remote receiver using the first antenna component and concurrently directs power waves to a second remote receiver using the second antenna component.

In some embodiments, a controller (e.g., processor(s) 104) is configured to adjust transmission of the power transmission signals by the second antenna component based on the feedback information received by the first antenna component. In some embodiments, the controller is configured to adjust operation of the second antenna component to increase the amount of power received by the remote receiver. For example, the controller adjusts one or more characteristics (examples of these characteristics are provided above in reference to FIG. 1) of electromagnetic waves transmitted by the second antenna component by modifying one or more tuning components of the antenna 300 (e.g., tuning lines 310, tuning lines 316, tuning lines 314, tuning patch 308, and/or tuning patch 312).

In some embodiments, the controller is configured such that, during charging of a remote receiver, the controller continuously adjusts operation of the second antenna component based on feedback information received by the first antenna component (e.g., to account for positional changes of the remote receiver, objects or interference between the antenna and the remote receiver, changes in an amount of power received by the remote receiver, etc.). For example, while transmitting power transmission signals using the second antenna component to the remote receiver, the first antenna component periodically receives feedback information (e.g., every 100 ms, 1 s, 10 s, or the like) and the controller optionally adjusts operation of the second antenna component responsive to the received feedback information. In some embodiments, the remote receiver device is configured to send feedback information in accordance with a determination that the power received is below a threshold value (e.g., power received by the receiver is less than 50% of power sent by the transmitter).

In some embodiments, communications components/interfaces (e.g., communications component(s) 112) implement a wireless communication protocol, such as Bluetooth® or ZigBee®, to be used with, e.g., the first or the second antenna component. In some embodiments, the communications components are used to transfer other data, such as an identifier for the electronic device, a battery level, a location, charge data, or other such data. In various embodiments, other communications components are utilized, such as radar, infrared cameras, and/or frequency-sensing devices for sonic triangulation to determine the position of the electronic device.

In some embodiments, the antenna 300 described above in reference to FIG. 3 is disposed on a printed circuit board (PCB). In some embodiments, the antenna 300 is mounted directly on the PCB. The PCB optionally includes additional components such as, but not limited to, inductors, capacitors, resistors, or integrated circuits. For instance, in accordance with some embodiments, an inductor element is coupled between the two conductive plates 302 and 304 such that the inductor element is in series with the capacitor formed by the plates 302, 304 and the gap 303 there between.

In some embodiments, the two coplanar conductive plates 302 and 304 of the antenna 300 feed directly into the wiring of the PCB. In some embodiments, the two conductive plates 302 and 304 are soldered directly onto the PCB during a manufacturing process. In some embodiments, an array of antennas that includes the two coplanar conductive plates 302 and 304 is mounted onto a single PCB. For example, in accordance with some embodiments, an array of 4×4, 8×8 or 16×16 antennas 300 is mounted on the PCB. In some embodiments, the two conductive plates 302 and 304 are mounted among other circuitry, such as resistors, inductors, and/or integrated circuits on the PCB.

In some embodiments, the antenna 300 includes a base (not shown). In some embodiments, the base is used as an electrical ground for the antenna. In some embodiments, the base is used to improve impedance matching. For example, the PCB optionally includes, or is connected to, an antenna tuner and/or coupler. In various embodiments, the base has different shapes. In some embodiments, the base is altered to improve bandwidth of the antenna 300. In some embodiments, the base comprises multiple parts such as a main base component and a support component. In some embodiments, the support component includes legs that create a distance between the base and the PCB. In some embodiments, transmission lines are attached to the base and/or the monopole component 304 to connect to other parts of the PCB and/or other conductive elements. For example, the transmission lines optionally carry a signal (e.g., a radio frequency signal) from one part of the PCB to another part.

In some embodiments, the antenna 300 is part of or associated with a transmitter (e.g., transmitter 102). In some embodiments, the antenna 300 is used for transmitting power waves (e.g., power waves 116). In some embodiments, the antenna 300 is a part of or associated with a receiver (e.g., receiver 120). In some embodiments, the antenna 300 is used for receiving power waves (e.g., power waves 116). In some embodiments, the antenna 300 operates as a transceiver and both transmits and receives power waves.

Figure 4:
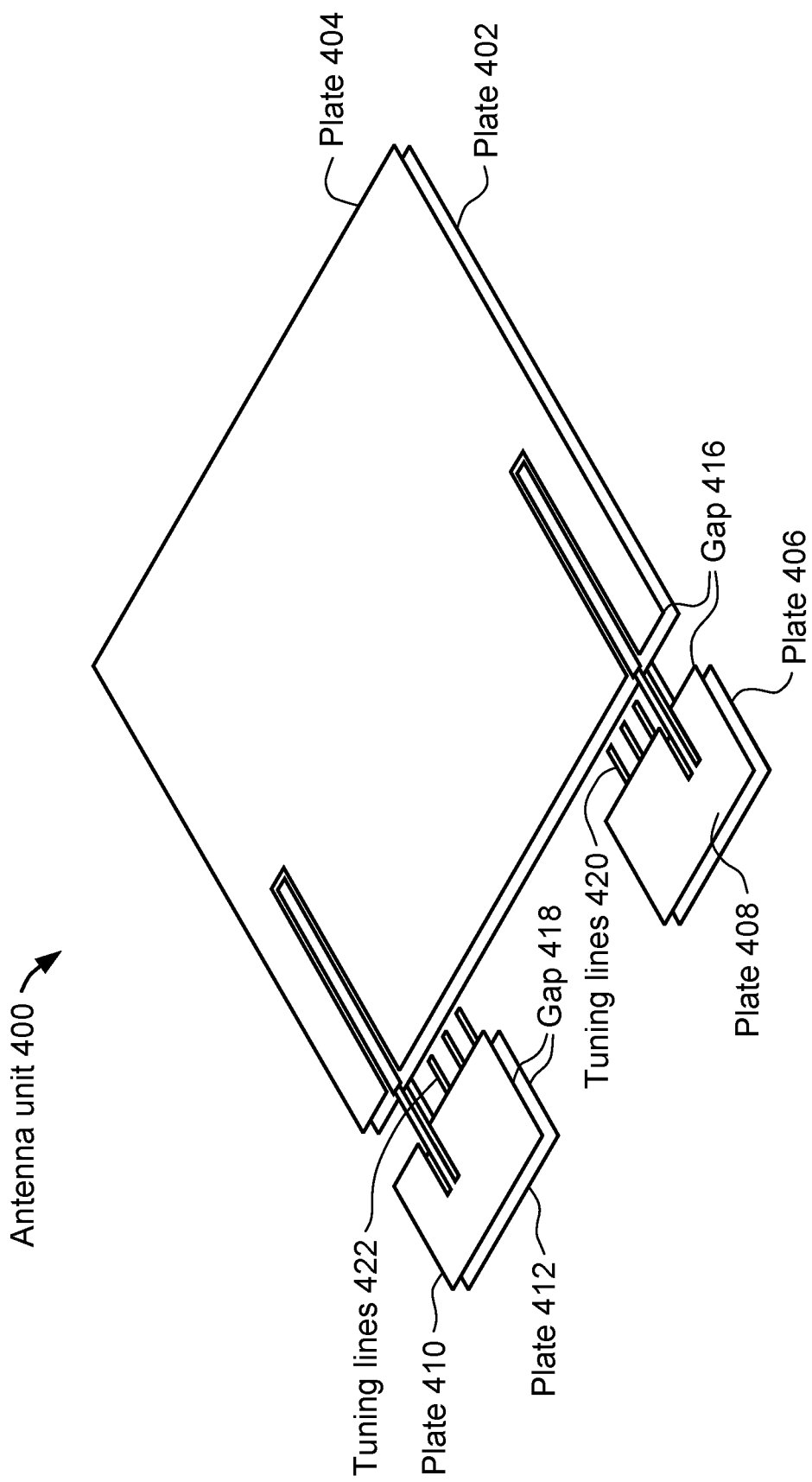
FIG. 4 is a block diagram illustrating a three-dimensional view of a representative antenna in accordance with some embodiments.

Turning now to FIG. 4, a block diagram is shown that illustrates a three-dimensional view of a representative antenna unit 400 in accordance with some embodiments. FIG. 4 shows the antenna unit 400 including a first set of plates (e.g., plates 402, 406, and 412) and a second set of plates (e.g., plates 404, 408, and 410). In some embodiments, the first set of plates includes an electrical ground plate (e.g., plate 412) and/or the second set of plates includes an electrical ground plate (e.g., plate 410).

In accordance with some embodiments, the plates 406 and 408 (and optionally 410 and 412) comprise monopole antennas and the plates 402 and 404 comprise patch antennas. In some embodiments, the antenna unit 400 includes respective feed lines coupling plates 402 and 406, plates 402 and 412, plates 404 and 408, and plates 404 and 410. In accordance with some embodiments, the plates 404 and 408 are positioned on a first plane with a gap 416 between them, thereby forming a first capacitor. In some embodiments, the plates 404 and 408 and the gap 416 form a loop antenna with an operating frequency based on the capacitance value of the first capacitor. Similarly, the plates 404 and 410 are positioned on the first plane with a gap (e.g., a gap equal to, less than, or greater than gap 416) between them, thereby forming a second capacitor. In some embodiments, the plates 404 and 410 and the gap between them form a loop antenna with an operating frequency based on the capacitance value of the second capacitor.

Additionally, the plates 402 and 406 are positioned on a second plane with a gap (e.g., a gap equal to, less than, or greater than gap 416) between them, thereby forming a third capacitor. In some embodiments, the plates 402 and 406 and the gap between them compose a loop antenna with an operating frequency based on the capacitance value of the third capacitor. Similarly, the plates 402 and 412 are positioned on the second plane with a gap (e.g., a gap equal to, less than, or greater than gap 416) between them, thereby forming a fourth capacitor. In some embodiments, the plates 402 and 412 and the gap between them form a loop antenna with an operating frequency based on the capacitance value of the fourth capacitor. In accordance with some embodiments, FIG. 4 further shows tuning lines 420 and 422 for tuning operation of the antenna unit 400 (e.g., for adjusting the operating frequency of the antenna unit 400). FIG. 4 also shows the first set of plates in parallel with the second set of plates with a gap 418 between them, thereby optionally forming a fifth capacitor. In some embodiments, the antenna unit 400 includes one or more additional layers with each layer having two or more plates configured to transmit electromagnetic waves within a particular frequency range.

In accordance with some embodiments, the first set of conductive plates and the second set of conductive plates are positioned in parallel to one another such that there is a gap 418 between the first pair and the second pair of conductive plates. In accordance with some embodiments, the first set of conductive plates includes a monopole (e.g., plate 406) and a patch (e.g., plate 402). In accordance with some embodiments, the second set of conductive plates includes a monopole (e.g., plate 408) and a patch (e.g., plate 404). In some embodiments, the monopole antennas and the gap form a capacitor. In some embodiments, the dimensions of the monopole antennas and/or the dimensions of the gap are dependent on a frequency range at which the antenna unit 400 is configured to operate and/or its desired directivity. In some embodiments, the capacitance value of the capacitor is tuned by varying the size of the respective gap between the monopole antennas and the patches.

In some embodiments, the antenna unit 400 comprises an array of antennas (e.g., the first set of plates composes a first antenna 300 and the second set of plates composes a second antenna 300). In some embodiments, the array of antennas includes antennas arranged on different layers. In some embodiments, the antennas are arranged in different orientations with respect to one another. In some embodiments, the antennas of the antenna array are positioned in parallel to one another as shown in FIG. 4. As shown in FIG. 4, the first set of conductive plates (e.g., composing a first antenna 300) and the second set of conductive plates (e.g., composing a second antenna 300) are positioned in parallel with one another. In some embodiments, each antenna includes at least one patch and at least monopole positioned on a same plane. In some embodiments, the monopole antennas of the first pair and/or the second pair are arranged such that there is gap between the monopole antennas, thereby forming a capacitor.

In some embodiments, (e.g., when operating as a power wave transmitter) the antennas of the antenna array are disposed within a charging surface (e.g., of receiver 120). In some embodiments, the charging surface includes a housing for the antennas, a digital signal processor (DSP) or microcontroller, and/or communications components. The antennas of the array of antennas optionally include suitable antenna types for operating in frequency bands such as 900 MHz, 2.5 GHz, or 5.8 GHz as these frequency bands conform to Federal Communications Commission (FCC) regulations part 18 (Industrial, Scientific and Medical (ISM) equipment). For example, in accordance with some embodiments, the patch antennas of the first set and the second set have heights ranging from $\frac{1}{24}$ inch to 1 inch and widths ranging from $\frac{1}{24}$ inch to 1 inch. In some embodiments, other types of antennas are used, for example, dipole antennas of the first set and the second set, among others.

In some embodiments, the antenna unit 400 is disposed on, or mounted to, a printed circuit board (PCB). In some embodiments, an inductor element is coupled between the monopole antennas such that the inductor element is in series with the capacitor(s) described above.

In some embodiments, one or more tuning lines (e.g., tuning lines 422 and/or tuning lines 420) are coupled between the monopole antennas and the patch antennas. In some embodiments, the one or more tuning lines are configured to tune frequency of operation of the antenna unit 400 or a component of the antenna unit 400 such as a monopole antenna component and/or a loop component. In some embodiments, the base is configured to improve bandwidth of the antenna unit 400.

In some embodiments, the base and the monopole antennas are constructed from a single mold, such as one piece of plastic and/or other materials. In some embodiments, the monopole antennas comprise a copper material. In some embodiments, the antenna unit 400 comprises steel or another metal or metal alloy. In some embodiments, the monopole antennas are configured as radiating dipoles with the base. In some embodiments, the base isolates the dipoles from the PCB. In some instances and embodiments, a distance between the monopole antennas and the PCB alters the matching and/or impedance matching of the monopole antennas, and the distance is configurable to optimize performance of the monopole antennas.

In some embodiments, one or more of the plates 410 and 412 are located on a different side of the plates 404 and 402 from the plates 408 and 406 (e.g., an opposite of the plates 404 and 402).

FIGS. 5A-5B are block diagrams illustrating representative layers of the antenna unit 400 shown in FIG. 4 in accordance with some embodiments. FIG. 5A shows a first layer (e.g., a top layer) of the antenna unit 400 comprising plates 404, 408, and 410. FIG. 5B shows a second layer (e.g., a bottom layer) of the antenna unit 400 comprising plates 402, 406, and 412 as well as tuning lines 420 and 422.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

Features of the present disclosure can be implemented in, using, or with the assistance of a computer program product, such as a storage medium (media) or computer-readable storage medium (media) having instructions stored thereon/in which can be used to program a processing system to perform any of the features presented herein. The storage medium (e.g., memory 106) can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 106 optionally includes one or more storage devices remotely located from the CPU(s) (e.g., processor(s) 104, 132, and/or 140). Memory 106, or alternatively the non-volatile memory device(s) within memory 106, comprises a non-transitory computer readable storage medium.

Stored on any one of the machine readable medium (media), features of the present invention can be incorporated in software and/or firmware for controlling the hardware of a processing system, and for enabling a processing system to interact with other mechanism utilizing the results of the present invention. Such software or firmware may include, but is not limited to, application code, device drivers, operating systems, and execution environments/containers.

Communication systems as referred to herein (e.g., communications component 112, receiver 120) optionally communicates via wired and/or wireless communication connections. Communication systems optionally communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. Wireless communication connections optionally use any of a plurality of communications standards, protocols and technologies, including but not limited to radio-frequency (RF), radio-frequency identification (RFID), infrared, radar, sound, Global System for Mobile Communications (GSM), Enhanced Data GSM Environment (EDGE), high-speed downlink packet access (HSDPA), high-speed uplink packet access (HSDPA), Evolution, Data-Only (EV-DO), HSPA, HSPA+, Dual-Cell HSPA (DC-HSPDA), long term evolution (LTE), near field communication (NFC), ZigBee, wideband code division multiple access (W-CDMA), code division multiple access (CDMA), time division multiple access (TDMA), Bluetooth, Wireless Fidelity (Wi-Fi) (e.g., IEEE 102.11a, IEEE 102.11ac, IEEE 102.11ax, IEEE 102.11b, IEEE 102.11g and/or IEEE 102.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

It will also be understood that, although the terms first, second, etc. are, in some instances, used herein to describe various elements, these elements should not be limited by these terms. These terms are only used to distinguish one element from another. For example, a first antenna could be termed a second antenna, and, similarly, a second antenna could be termed a first antenna, without departing from the scope of the various described embodiments.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A transmitter device for a wireless charging system, comprising:
    an antenna component configured to transmit electromagnetic waves toward a wireless power receiver, the antenna component having at least two conductive plates positioned on a same plane and a feed line between the at least two conductive plates, wherein:
        one of the at least two conductive plates and the feed line form a monopole antenna configured to transmit electromagnetic waves in a first frequency range, wherein the feed line and the two conductive plates extend in the same plane and the feed line is perpendicular to an edge of the one of the at least two conductive plates within the same plane,
        the at least two conductive plates are positioned such that a gap exists between the at least two conductive plates, thereby forming a capacitor, and
        the at least two conductive plates, the feed line, and the capacitor form a loop antenna configured to transmit electromagnetic waves in a second frequency range;
    an integrated circuit configured to control operation of the antenna; and
    a transmission line coupling the antenna to the integrated circuit.
2. The transmitter device of claim 1, wherein the first frequency range and the second frequency range are distinct frequency ranges.
3. The transmitter device of claim 2, wherein the first frequency range includes a frequency of 900 MHz or a frequency of 5.8 GHz.
4. The transmitter device of claim 3, wherein the second frequency range includes a frequency of 2.4 GHz.
5. The transmitter device of claim 1, wherein the antenna component is configured to concurrently transmit electromagnetic waves in the first frequency range and in the second frequency range.
6. The transmitter device of claim 1, wherein the antenna component is configured to receive communication signals from the wireless power receiver using at least one of the first frequency range and the second frequency range.
7. The transmitter device of claim 6, wherein the antenna component is configured to receive the communication signals while the antenna component is transmitting electromagnetic waves.
8. The transmitter device of claim 6, wherein:
    the communication signals received from the wireless power receiver include information identifying an amount of power received by the wireless power receiver, and
    the transmitter device adjusts one or more transmission characteristics used to transmit electromagnetic waves to increase an amount of power received by the wireless power receiver.
9. The transmitter device of claim 1, wherein the antenna component has a two-dimensional structure and does not include vias that extend outside of the same plane on which the at least two conductive plates are positioned.
10. The transmitter device of claim 1, wherein the antenna component further includes an additional loop antenna configured to transmit in a third frequency range, distinct from the first frequency range and the second frequency range.
11. The transmitter device of claim 1, wherein the monopole antenna is configured to transmit communication signals at a frequency of 2.4 GHz and the loop antenna is configured to transmit power transmission signals.
12. The transmitter device of claim 1, wherein the monopole antenna is configured to transmit power transmission signals and the loop antenna is configured to transmit communication signals at a frequency of 2.4 GHz.
13. The transmitter device of claim 1, wherein the monopole antenna and the loop antenna are configured to transmit electromagnetic waves toward the wireless power receiver.
14. The transmitter device of claim 1, wherein at least one of the monopole antenna and the loop antenna is tunable to adjust a corresponding transmit frequency.
15. The transmitter device of claim 1, wherein the at least two conductive plates each have a distinct geometric or irregular shape.
16. The transmitter device of claim 1, wherein the at least two conductive plates each have a same geometric or irregular shape.
17. The transmitter device of claim 1, wherein the antenna component further includes a feed line coupling the at least two conductive plates.
18. The transmitter device of claim 1, wherein at least one of the at least two conductive plates is coupled to an electrical ground.
19. The transmitter device of claim 1, wherein the antenna component is mounted on a printed circuit board.
20. A receiver device for a wireless charging system, comprising:
    an antenna component configured to receive electromagnetic waves from a wireless power transmitter, the antenna component having at least two conductive plates positioned on a same plane and a feed line between the at least two conductive plates, wherein:
        one of the at least two conductive plates and the feed line form a monopole antenna configured to transmit electromagnetic waves in a first frequency range, wherein the feed line and the two conductive plates extend in the same plane and the feed line is perpendicular to an edge of the one of the at least two conductive plates within the same plane,
        the at least two conductive plates are positioned such that a gap exists between the at least two conductive plates, thereby forming a capacitor, and
        the at least two conductive plates, the feed line, and the capacitor form a loop antenna configured to transmit electromagnetic waves in a second frequency range;
    an integrated circuit configured to control operation of the antenna and convert at least a portion of the received electromagnetic waves to an electrical current; and
    a transmission line coupling the antenna to the integrated circuit.

21. The transmitter device of claim 1, wherein a second of the at least two conductive plates is a ground plate that extends in the same plane.

\* \* \* \* \*